(12) United States Patent
Yokoyama

(10) Patent No.: US 11,476,254 B2
(45) Date of Patent: Oct. 18, 2022

(54) SUPPORT PILLARS FOR VERTICAL THREE-DIMENSIONAL (3D) MEMORY

(71) Applicant: Micron Technology, Inc., Boise, ID (US)

(72) Inventor: Yuichi Yokoyama, Boise, ID (US)

(73) Assignee: Micron Technology, Inc., Boise, ID (US)

(*) Notice: Subject to any disclaimer, the term of this patent is extended or adjusted under 35 U.S.C. 154(b) by 77 days.

(21) Appl. No.: 17/162,525

(22) Filed: Jan. 29, 2021

(65) Prior Publication Data
US 2022/0246618 A1  Aug. 4, 2022

(51) Int. Cl.
*H01L 27/108* (2006.01)
*H01L 27/24* (2006.01)

(52) U.S. Cl.
CPC .. *H01L 27/10805* (2013.01); *H01L 27/10847* (2013.01); *H01L 27/2481* (2013.01)

(58) Field of Classification Search
None
See application file for complete search history.

(56) References Cited

U.S. PATENT DOCUMENTS

| 10,607,995 | B2 | 3/2020 | Roberts et al. | |
| 10,811,418 | B2 * | 10/2020 | Kim | H01L 27/10873 |
| 2018/0323200 | A1 | 11/2018 | Tang et al. | |
| 2019/0103406 | A1 | 4/2019 | Tang et al. | |
| 2019/0164985 | A1 | 5/2019 | Lee et al. | |

OTHER PUBLICATIONS

U.S. Appl. No. 16/204,224, entitled, "Memory Arrays," filed Nov. 29, 2018, 43 pages.

* cited by examiner

*Primary Examiner* — Anthony Ho
*Assistant Examiner* — Kevin Quinto
(74) *Attorney, Agent, or Firm* — Brooks, Cameron & Huebsch, PLLC

(57) ABSTRACT

Systems, methods and apparatus are provided for support pillars in vertical three-dimensional (3D) memory. An example method includes a method for forming arrays of vertically stacked memory cells, having horizontally oriented access devices and horizontally oriented storage nodes. The method includes depositing alternating layers of a dielectric material and a sacrificial material in repeating iterations to form a vertical stack. A plurality of spaced, first vertical openings are formed through the vertical stack adjacent areas where storage nodes will be formed. Support-pillar material is deposited in the plurality of spaced, first vertical openings to form structural support pillars. Second vertical openings are formed through the vertical stack adjacent the structural support pillars to define elongated vertical columns with first sidewalls of the alternating layers. A third vertical opening is formed through the vertical stack extending to expose second sidewalls adjacent areas where horizontal access devices will be formed. The sacrificial material is selectively etched to form first horizontal openings, removing the sacrificial material a first horizontal distance (D1) back from the third vertical opening. A fourth vertical opening is formed through the vertical stack to expose third sidewalls adjacent areas where storage nodes will be formed. The support-pillar material of the formed structural support pillars may serve as an etch stop in selectively etching to form the second horizontal openings.

38 Claims, 32 Drawing Sheets

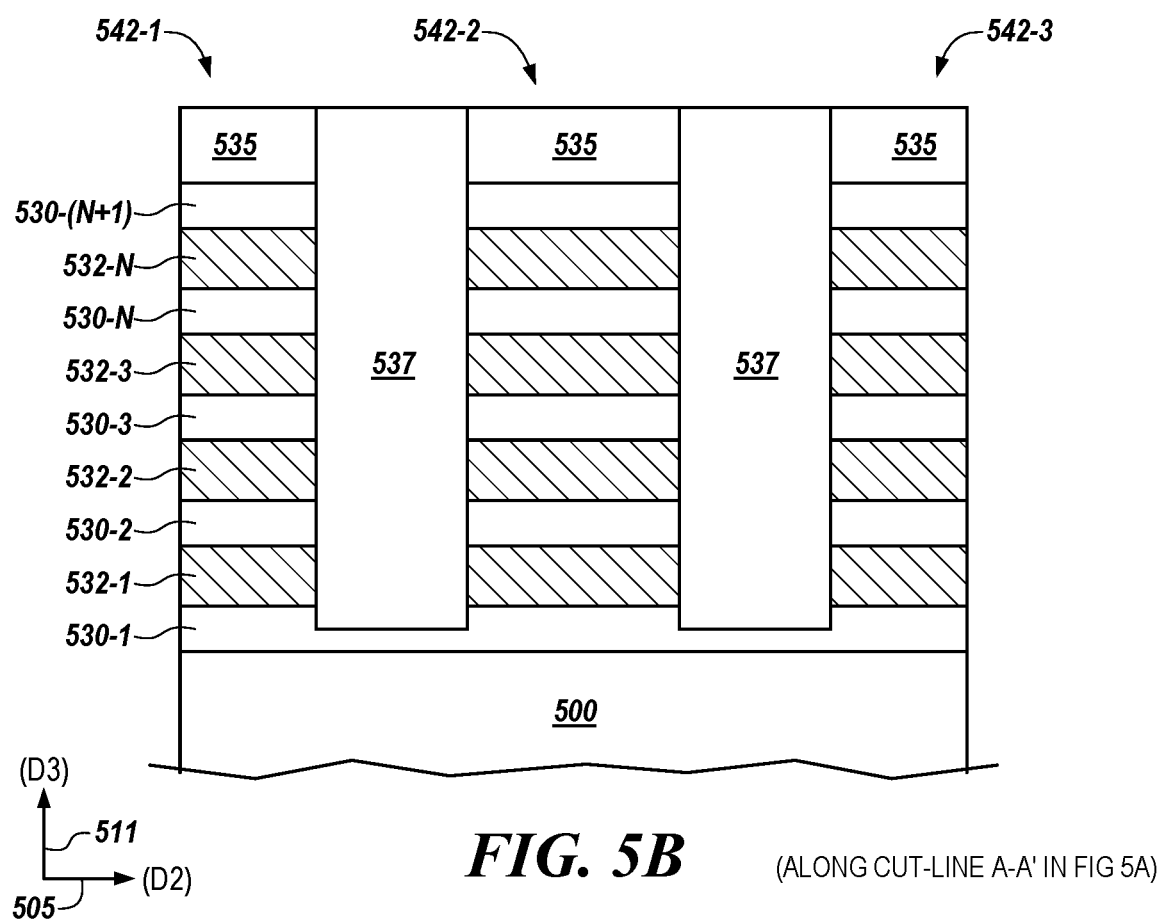
FIG. 5B (ALONG CUT-LINE A-A' IN FIG 5A)

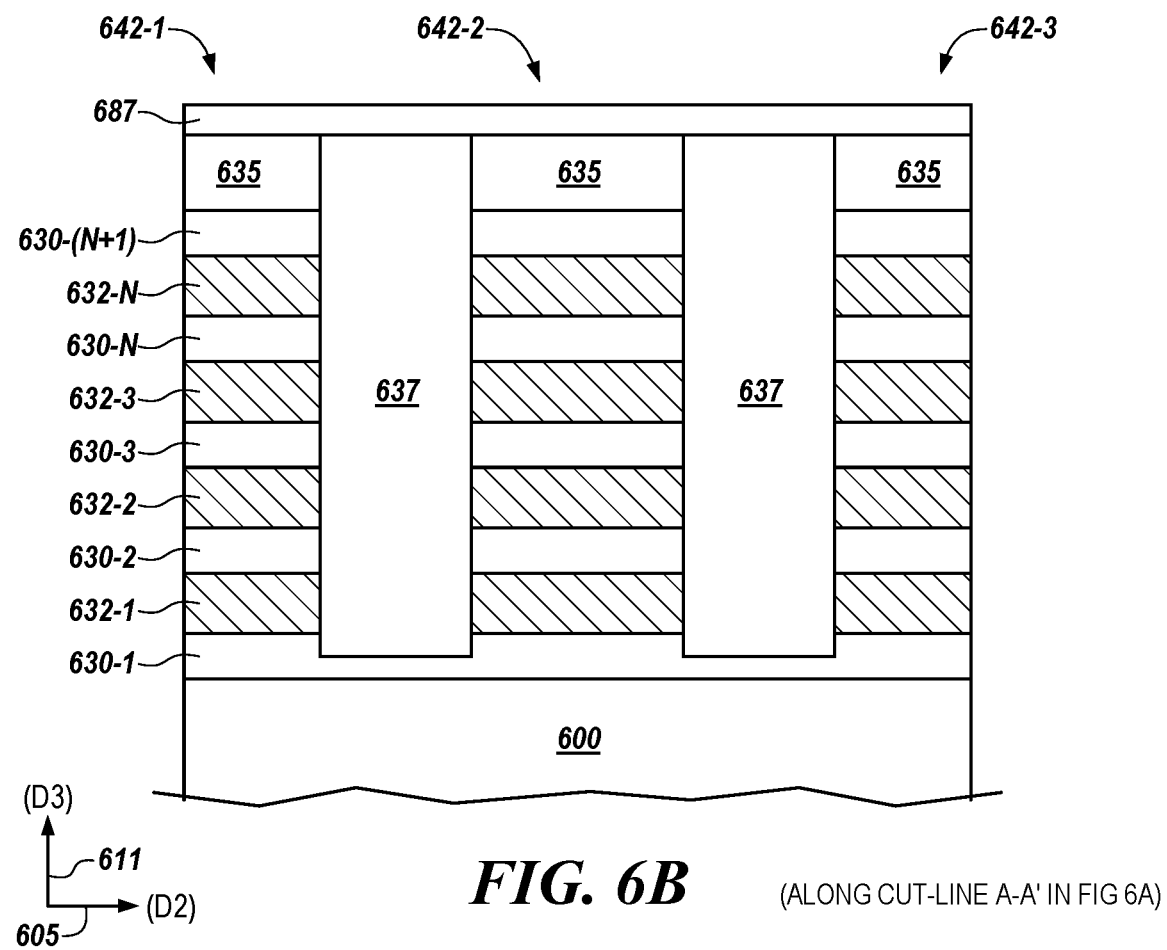
FIG. 6B (ALONG CUT-LINE A-A' IN FIG 6A)

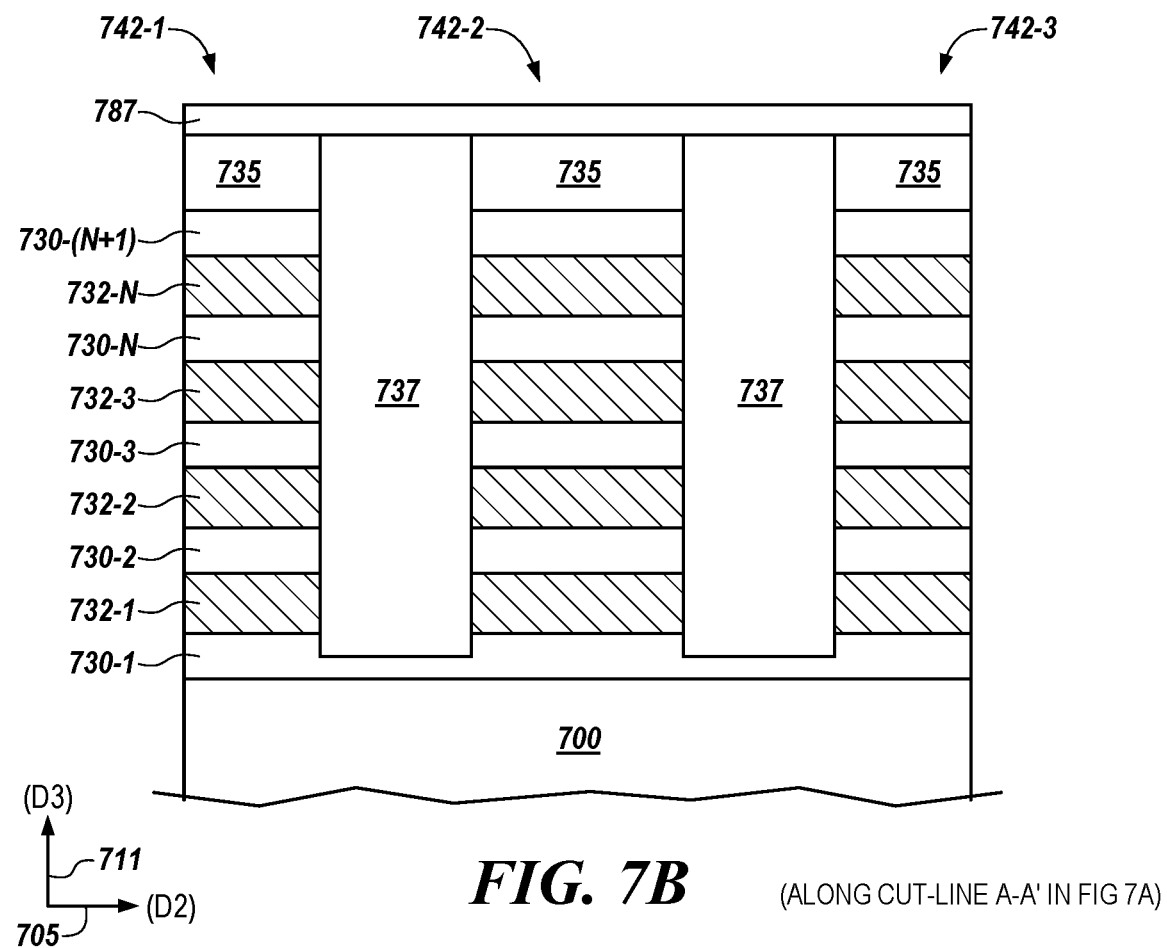
FIG. 7B (ALONG CUT-LINE A-A' IN FIG 7A)

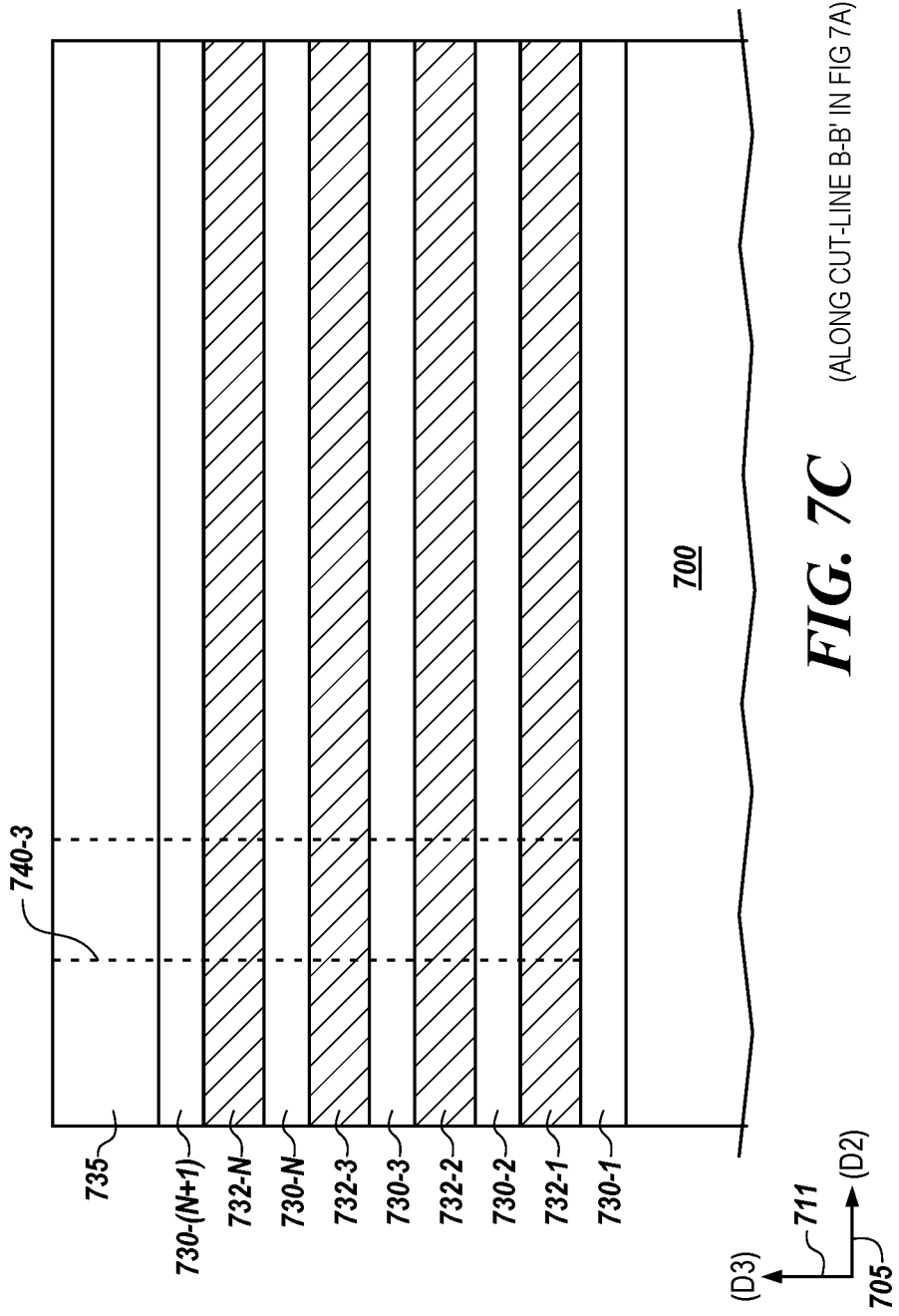
FIG. 7C (ALONG CUT-LINE B-B' IN FIG 7A)

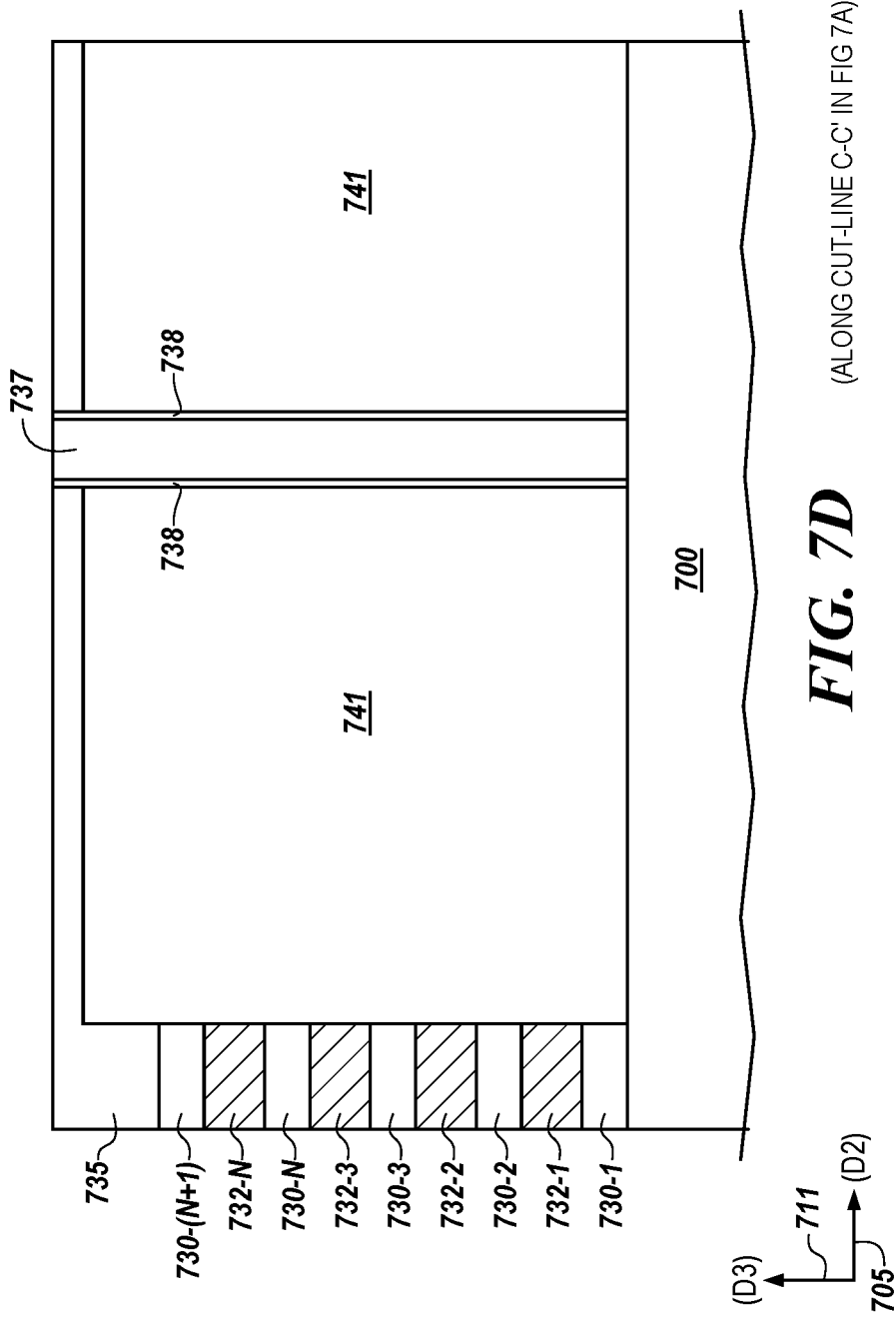
FIG. 7D (ALONG CUT-LINE C-C' IN FIG 7A)

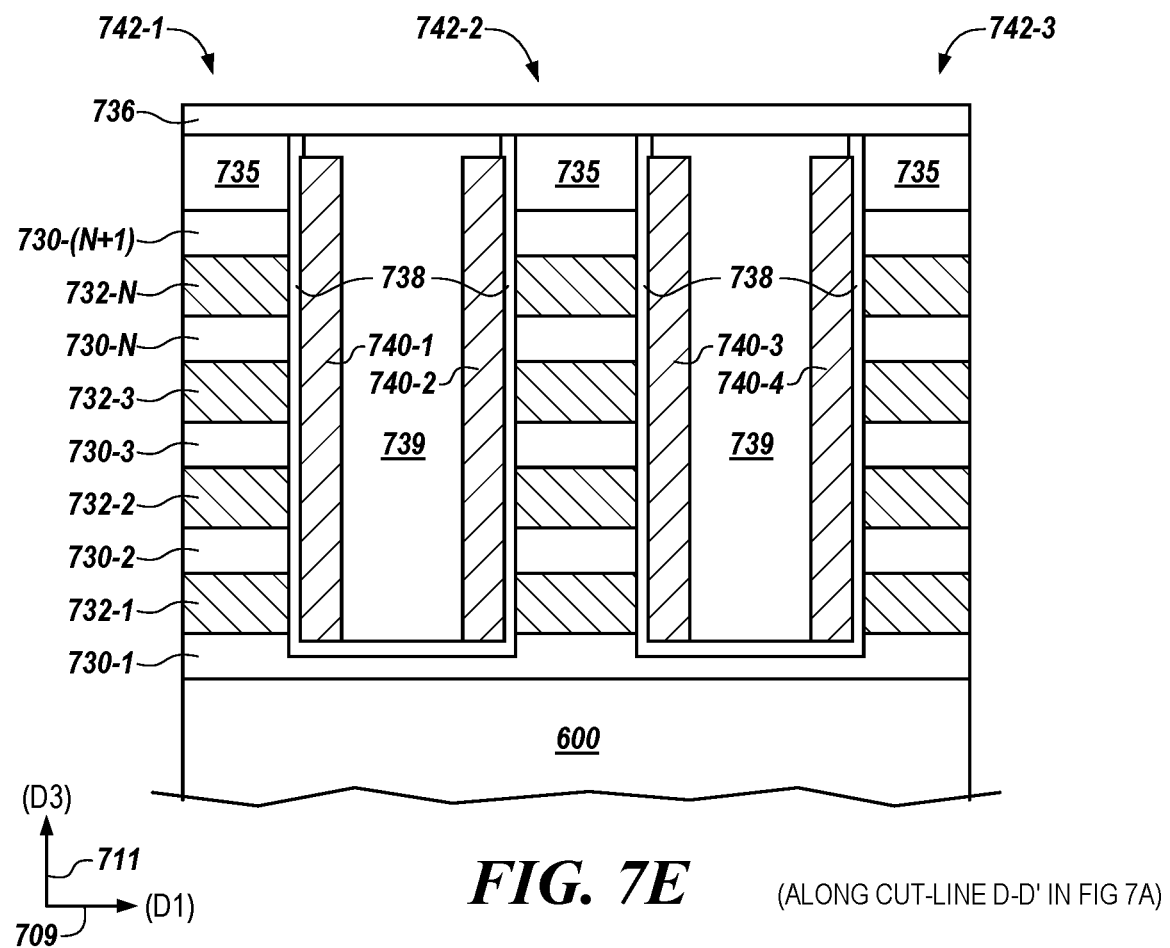
FIG. 7E (ALONG CUT-LINE D-D' IN FIG 7A)

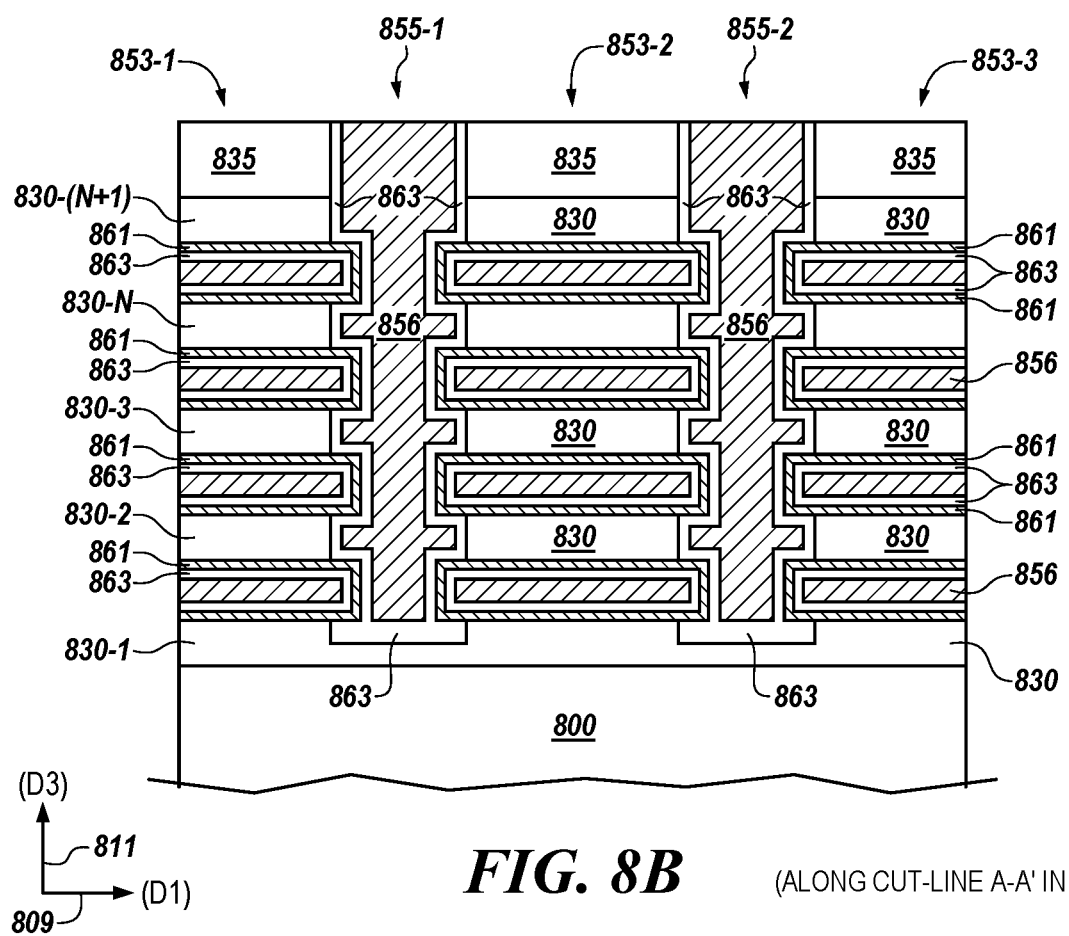
FIG. 8B (ALONG CUT-LINE A-A' IN FIG 8A)

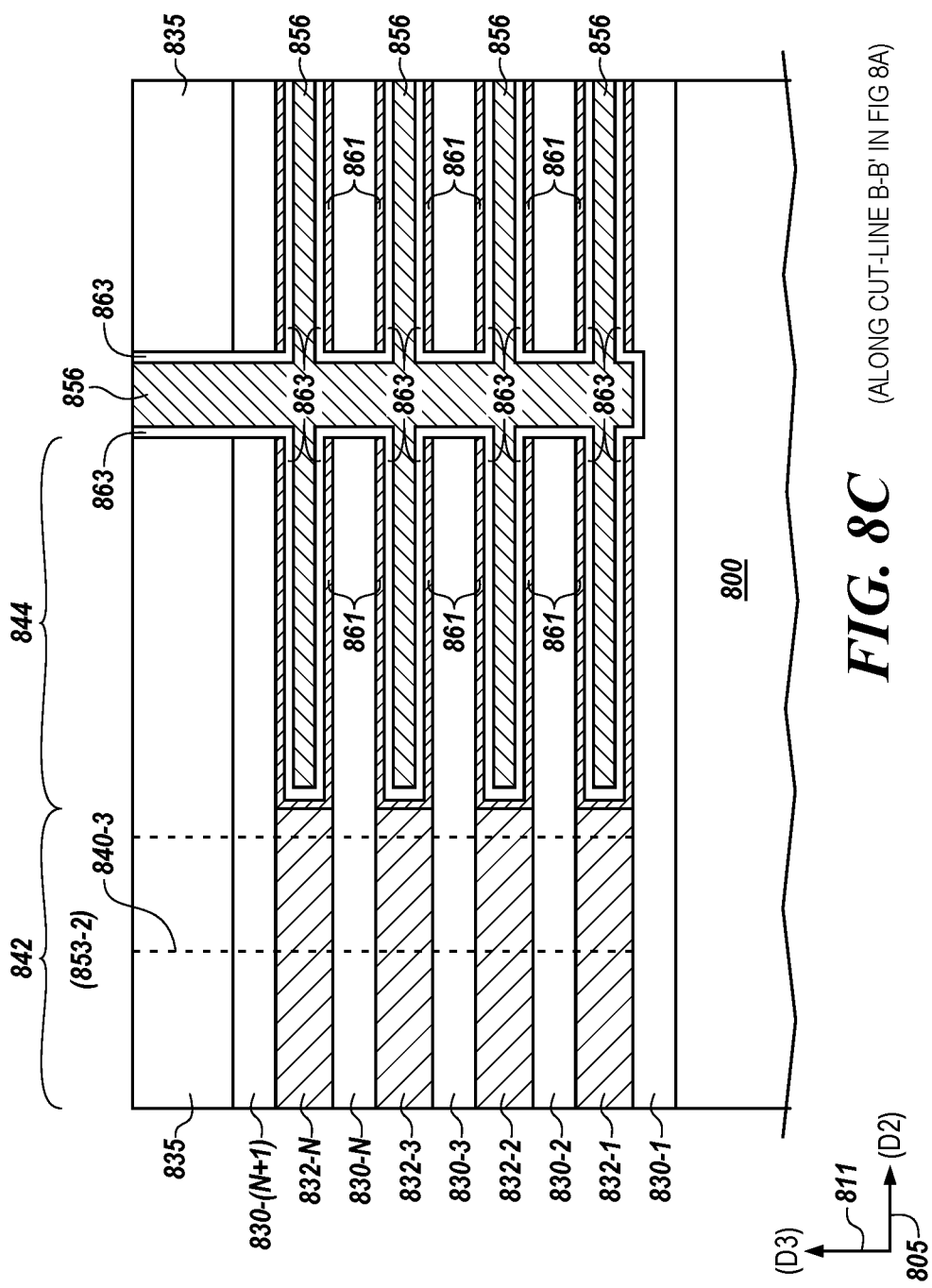
*FIG. 8C* (ALONG CUT-LINE B-B' IN FIG 8A)

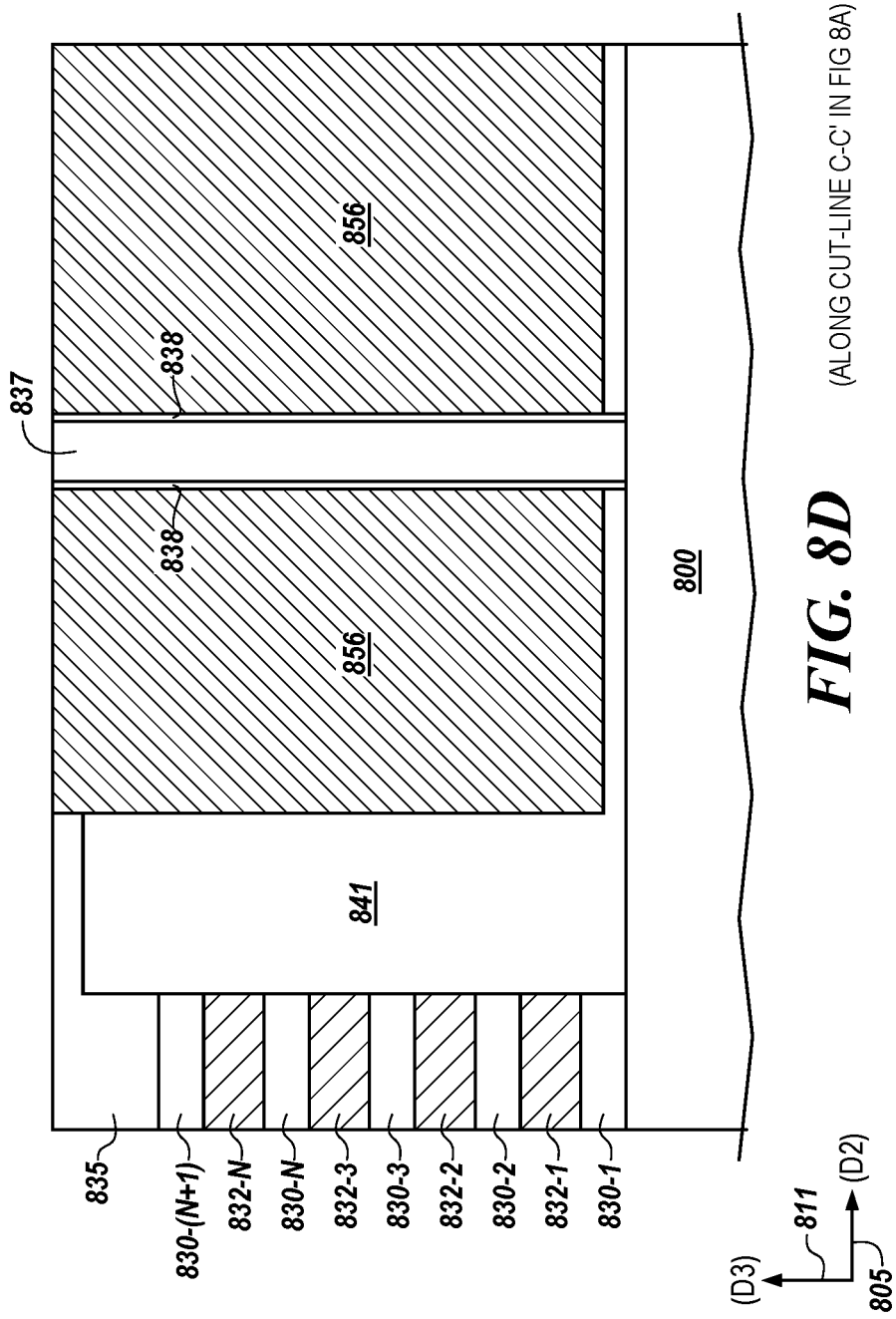
FIG. 8D (ALONG CUT-LINE C-C' IN FIG 8A)

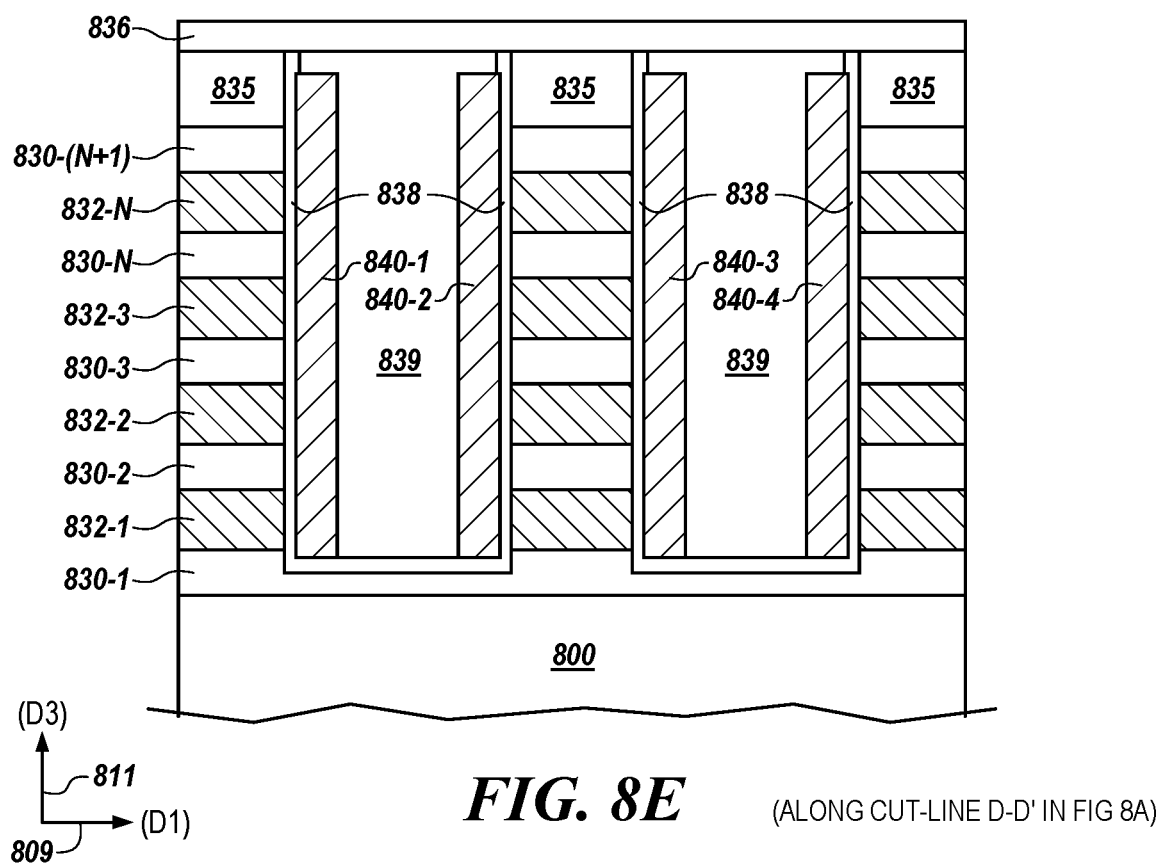
FIG. 8E (ALONG CUT-LINE D-D' IN FIG 8A)

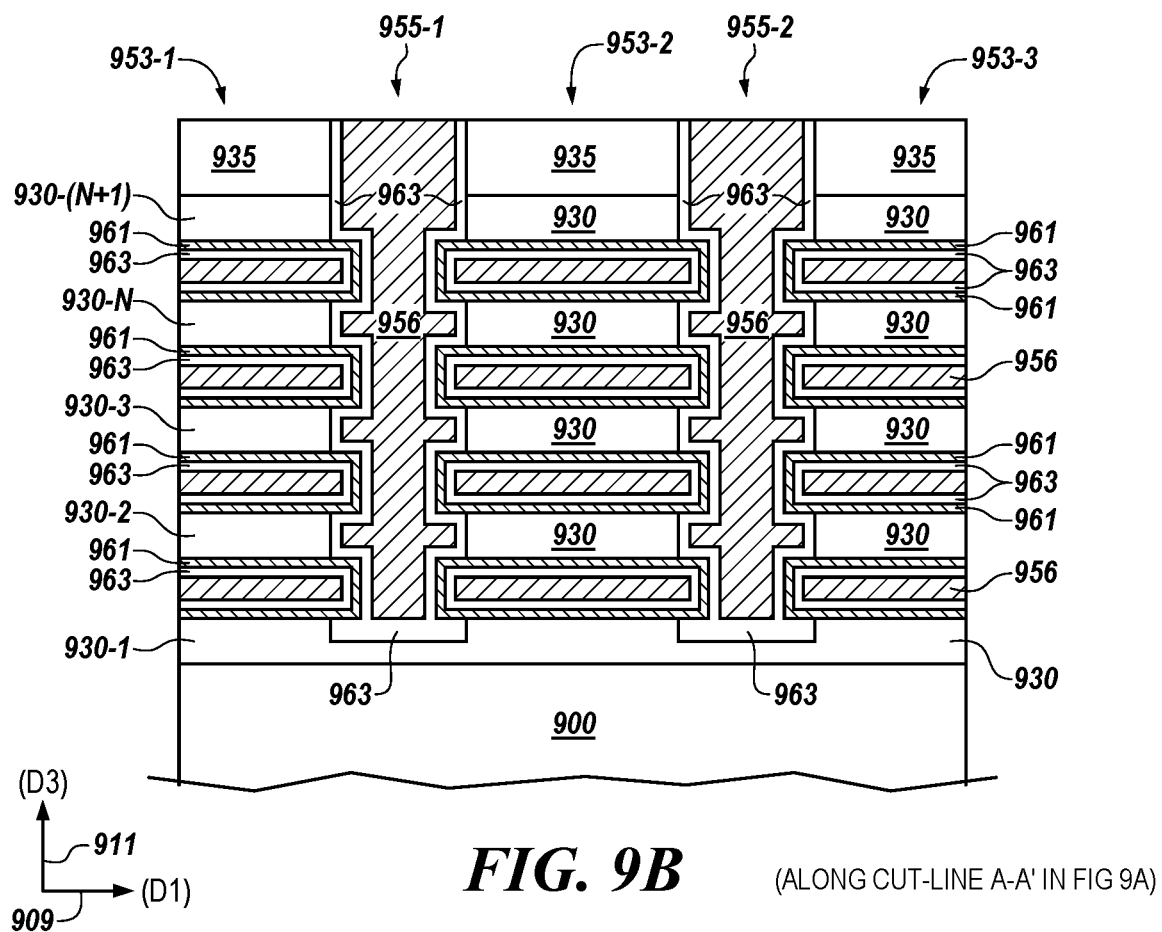
FIG. 9B (ALONG CUT-LINE A-A' IN FIG 9A)

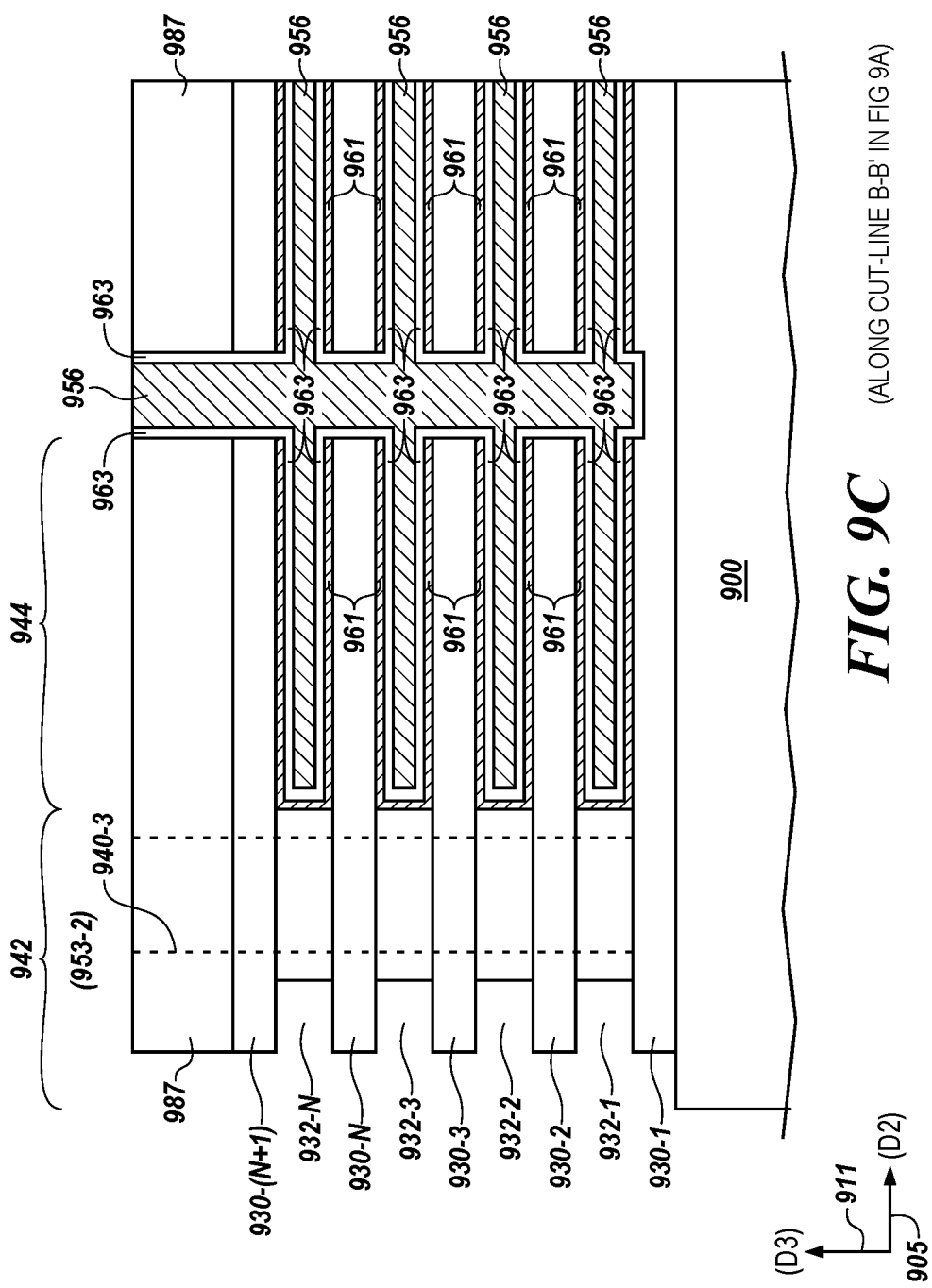
FIG. 9C (ALONG CUT-LINE B-B' IN FIG 9A)

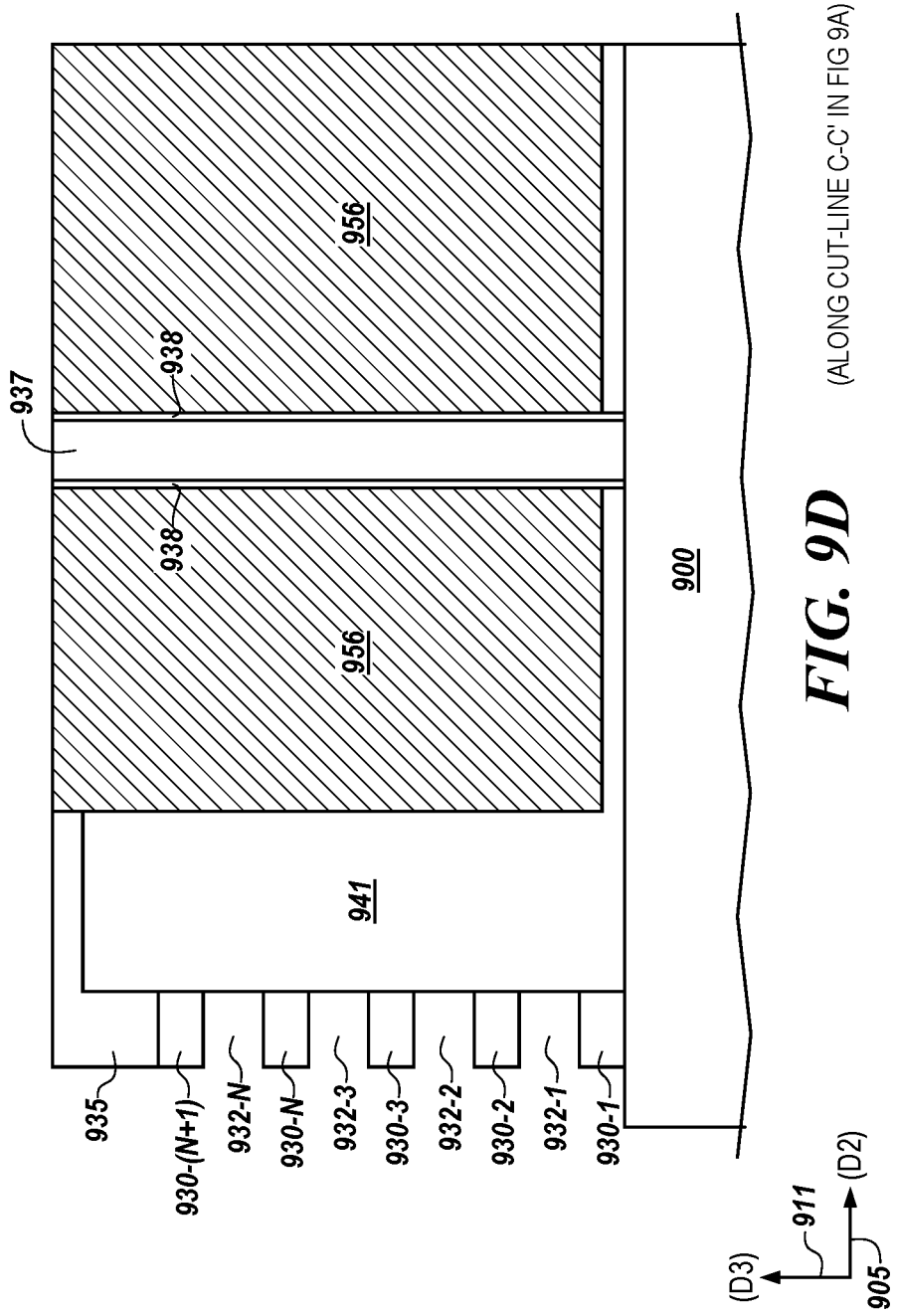

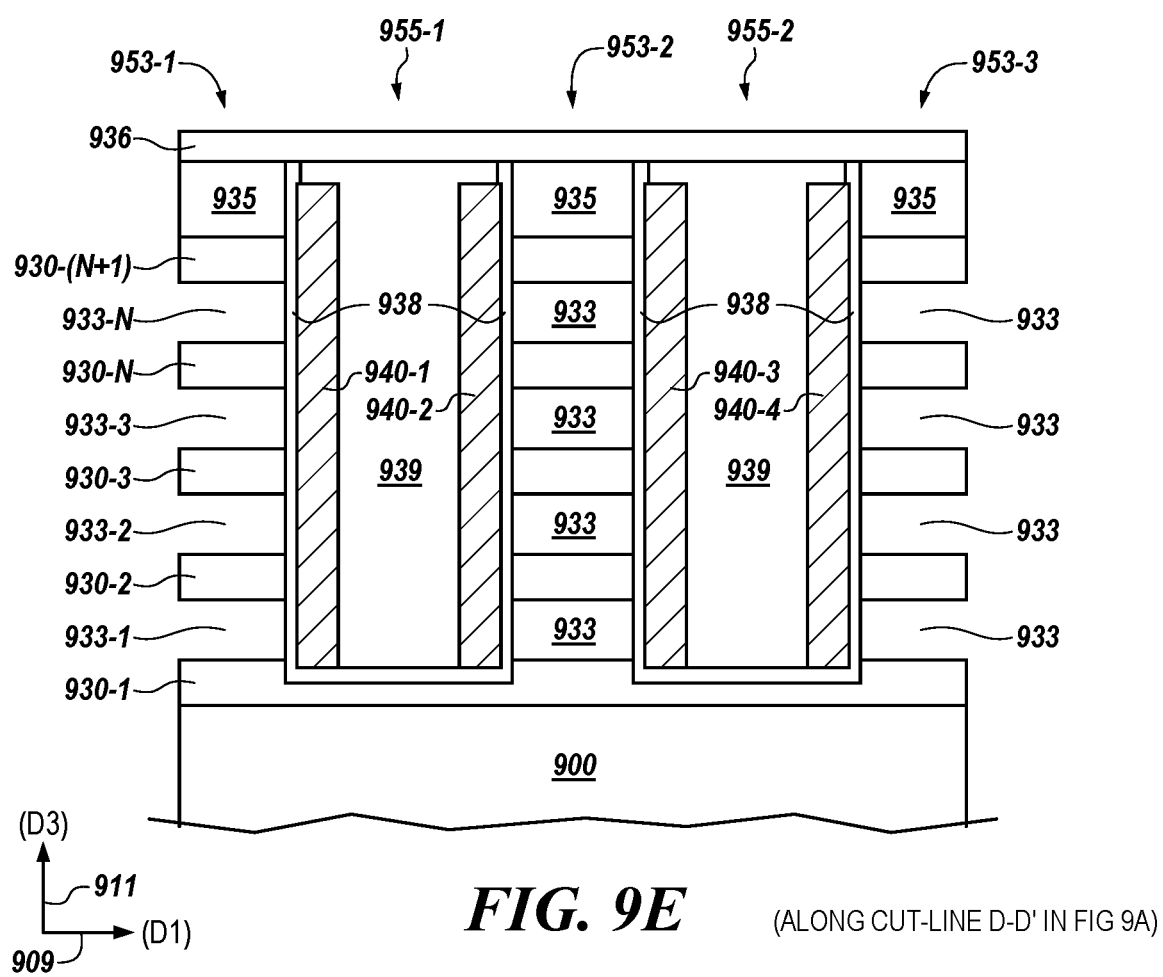
FIG. 9E (ALONG CUT-LINE D-D' IN FIG 9A)

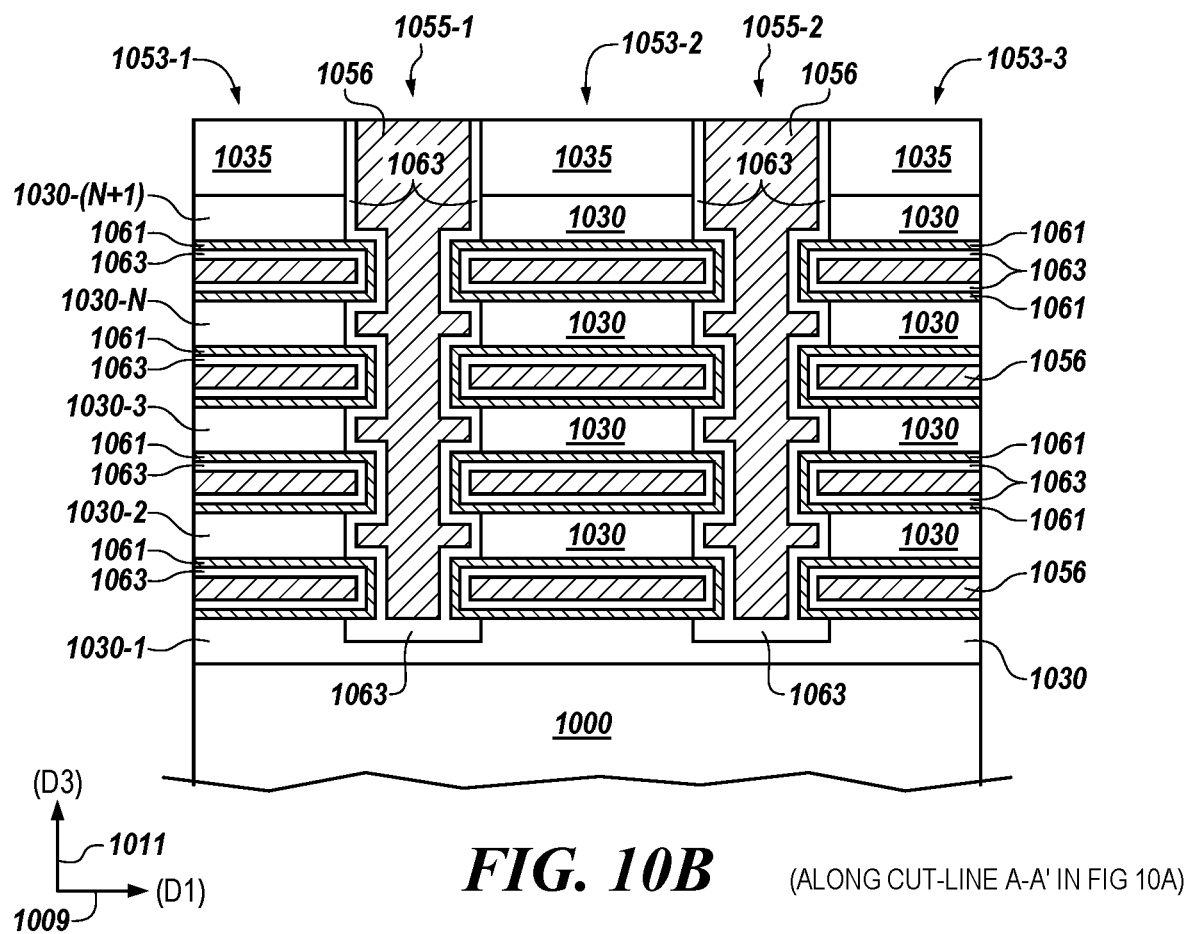
FIG. 10B (ALONG CUT-LINE A-A' IN FIG 10A)

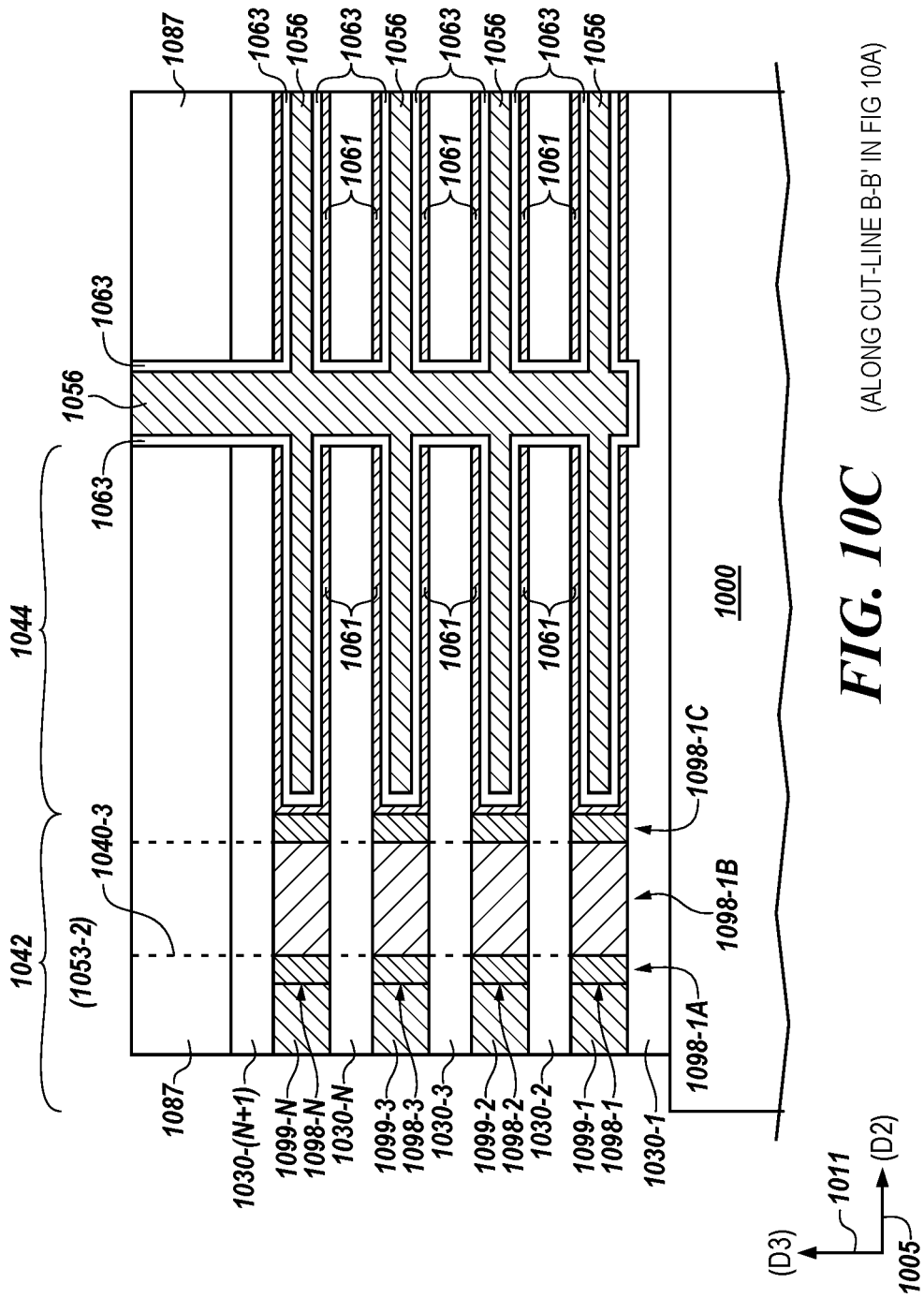
FIG. 10C (ALONG CUT-LINE B-B' IN FIG 10A)

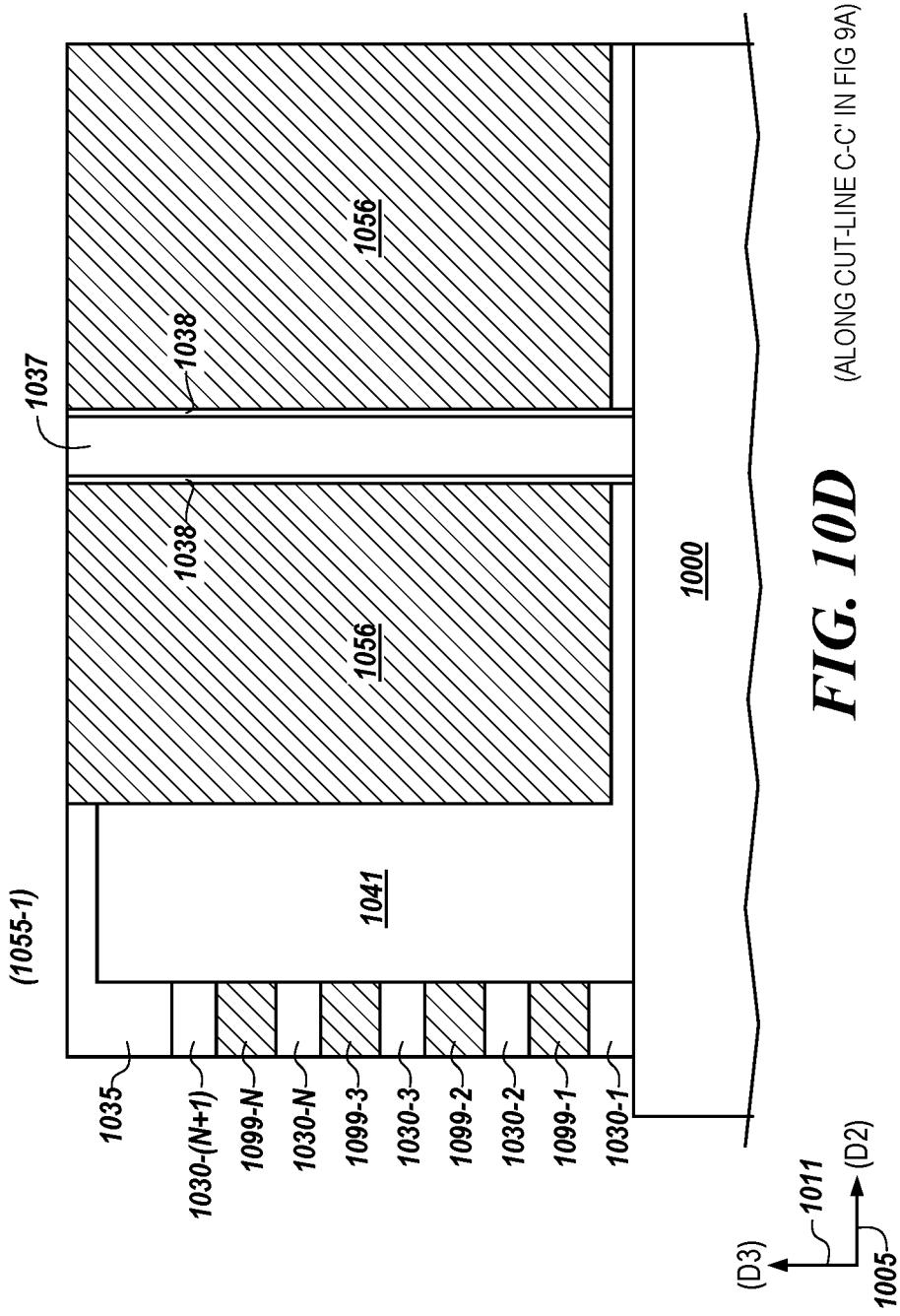
FIG. 10D (ALONG CUT-LINE C-C' IN FIG 9A)

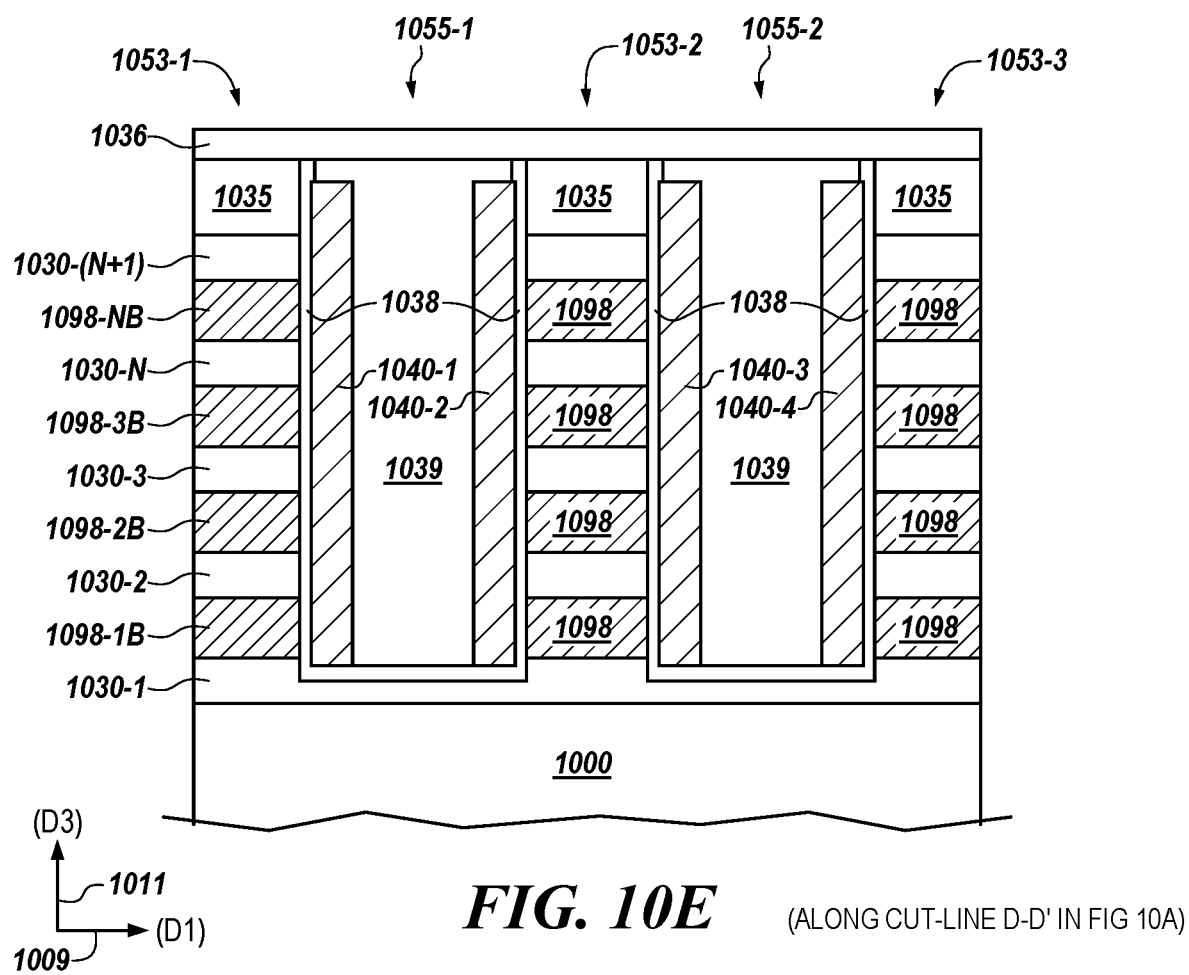
FIG. 10E (ALONG CUT-LINE D-D' IN FIG 10A)

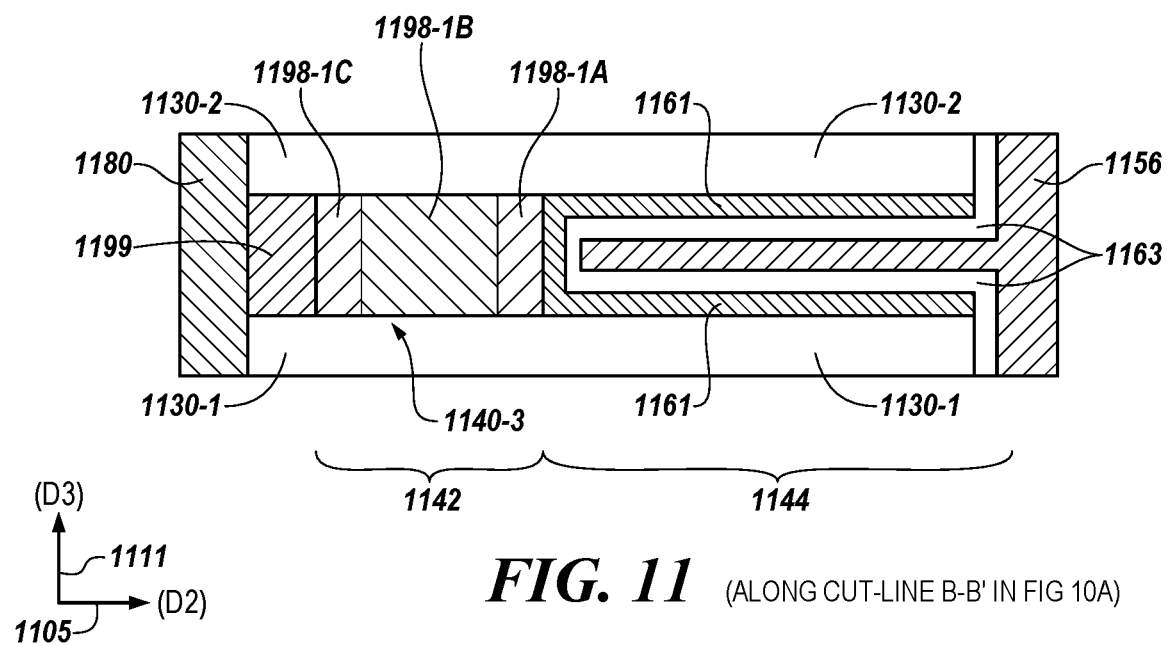
FIG. 11 (ALONG CUT-LINE B-B' IN FIG 10A)

US 11,476,254 B2

SUPPORT PILLARS FOR VERTICAL THREE-DIMENSIONAL (3D) MEMORY

TECHNICAL FIELD

The present disclosure relates generally to memory devices, and more particularly, to support pillars for vertical three-dimensional (3D) memory.

BACKGROUND

Memory is often implemented in electronic systems, such as computers, cell phones, hand-held devices, etc. There are many different types of memory, including volatile and non-volatile memory. Volatile memory may require power to maintain its data and may include random-access memory (RAM), dynamic random-access memory (DRAM), static random-access memory (SRAM), and synchronous dynamic random-access memory (SDRAM). Non-volatile memory may provide persistent data by retaining stored data when not powered and may include NAND flash memory, NOR flash memory, nitride read only memory (NROM), phase-change memory (e.g., phase-change random access memory), resistive memory (e.g., resistive random-access memory), cross-point memory, ferroelectric random-access memory (FeRAM), or the like.

As design rules shrink, less semiconductor space is available to fabricate memory, including DRAM arrays. A respective memory cell for DRAM may include an access device, e.g., transistor, having a first and a second source/drain regions separated by a channel region. A gate may oppose the channel region and be separated therefrom by a gate dielectric. An access line, such as a word line, is electrically connected to the gate of the DRAM cell. A DRAM cell can include a storage node, such as a capacitor cell, coupled by the access device to a digit line. The access device can be activated (e.g., to select the cell) by an access line coupled to the access transistor. The capacitor can store a charge corresponding to a data value of a respective cell (e.g., a logic "1" or "0").

BRIEF DESCRIPTION OF THE DRAWINGS

FIGS. 5A-5B illustrate an example method, at another stage of a semiconductor fabrication process, for forming arrays of vertically stacked memory cells, having three-node horizontally oriented access devices and vertically oriented access lines, in accordance with a number of embodiments of the present disclosure.

FIGS. 6A to 6B illustrate an example method, at another stage of a semiconductor fabrication process, for forming arrays of vertically stacked memory cells, having three-node, horizontally oriented access devices and vertically oriented access lines, in accordance with a number of embodiments of the present disclosure.

FIGS. 7A to 7E illustrate an example method, at another stage of a semiconductor fabrication process, for forming arrays of vertically stacked memory cells, having three-node, horizontally oriented access devices and vertically oriented access lines, in accordance with a number of embodiments of the present disclosure.

FIGS. 8A to 8E illustrate an example method, at another stage of a semiconductor fabrication process, for forming arrays of vertically stacked memory cells, having three-node, horizontally oriented access devices and vertically oriented access lines, in accordance with a number of embodiments of the present disclosure.

FIGS. 9A to 9E illustrate an example method, at another stage of a semiconductor fabrication process, for forming arrays of vertically stacked memory cells, having three-node, horizontally oriented access devices and vertically oriented access lines, in accordance with a number of embodiments of the present disclosure.

FIGS. 10A to 10E illustrate an example method, at another stage of a semiconductor fabrication process, for forming arrays of vertically stacked memory cells, having three-node, horizontally oriented access devices and vertically oriented access lines, in accordance with a number of embodiments of the present disclosure.

FIG. 11 illustrates an example of a three-node horizontally oriented access device coupled to a horizontally oriented storage node and coupled to vertically oriented access lines and horizontally oriented digit lines, in accordance with a number of embodiments of the present disclosure.

DETAILED DESCRIPTION

Figure 1A:
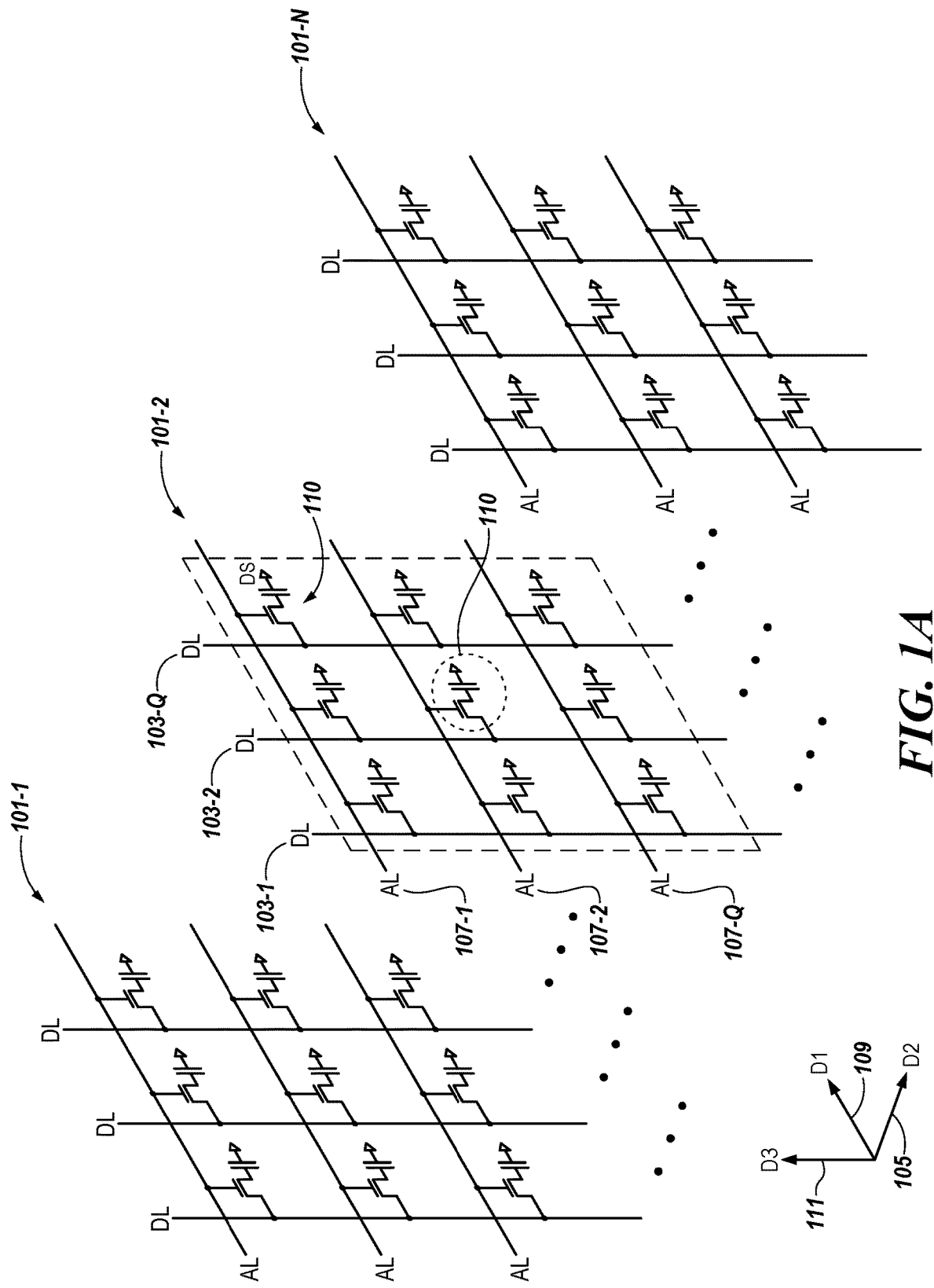
FIG. 1A is a schematic illustration of a vertical three-dimensional (3D) memory in accordance a number of embodiments of the present disclosure.

Embodiments of the present disclosure describe support pillars for vertical three-dimensional (3D) memory. Support pillars may be formed in a first vertical opening to provide support to pillar columns. That is, the support pillars may mitigate and/or prevent wobbling and/or buckling of the pillar columns when increasing the height of the pillar columns. Additionally, the embodiments described herein may achieve vertical stacks with a reduced size and capacitor cells with an increased area, as compared to vertical stacks and capacitor cells formed with a reduced pillar columns height.

For example, embodiments described herein may include method, systems, and apparatus for forming arrays of vertically stacked memory cells, having horizontally oriented access devices and horizontally oriented storage nodes. The method includes depositing alternating layers of a dielectric material and a sacrificial material in repeating iterations to form a vertical stack. A plurality of spaced, first vertical openings are formed through the vertical stack adjacent areas where storage nodes will be formed. Support-pillar material is deposited in the plurality of spaced, first vertical openings to form structural support pillars. Second vertical openings are formed through the vertical stack adjacent the structural support pillars to define elongated vertical columns with first sidewalls of the alternating layers. A third vertical opening is formed through the vertical stack extending to expose second sidewalls adjacent areas where horizontal access devices will be formed. The sacrificial material is selectively etched to form first horizontal openings, removing the sacrificial material a first horizontal distance (D1) back from the third vertical opening. A fourth vertical opening is formed through the vertical stack to expose third sidewalls adjacent areas where storage nodes will be formed. The support-pillar material of the formed structural support pillars may serve as an etch stop in selectively etching to form the second horizontal openings.

In some embodiments, the vertical three-dimensional (3D) memory may include three-node horizontal access devices. Three-node horizontal access devices are formed without body region contacts. As used herein, three-node is intended to refer to an access device comprising (1) a first source/drain region and (2) a second source/drain region separated by a channel region, and (3) one or more gates(s) opposing the channel region. In the three-node access device, there is no direct, electrical contact from a body contact line to a body region and/or channel of the access device to control the body region or channel of the access device. As a result, semiconductor fabrication process overhead is reduced by not having to form such a body contact. The three-node horizontal access devices are integrated with vertical access lines and integrated with horizontal digit lines. According to embodiments, the three-node horizontal access devices may be formed such that the channel region has fewer, e.g., may operate free of, minority carriers thus removing the need to control a body potential to a body region of the access device.

Advantages to the three-node horizontal access devices structure and process described herein can include a lower off-current (Ioff) for the access devices, as compared to silicon based (Si-based) access devices, and/or reduced gate/drain induced leakage (GIDL) for the access devices.

The figures herein follow a numbering convention in which the first digit or digits correspond to the figure number of the drawing and the remaining digits identify an element or component in the drawing. Similar elements or components between different figures may be identified by the use of similar digits. For example, reference numeral 104 may reference element "04" in FIG. 1, and a similar element may be referenced as 204 in FIG. 2. Multiple analogous elements within one figure may be referenced with a reference numeral followed by a hyphen and another numeral or a letter. For example, 302-1 may reference element 302-1 in FIGS. 3 and 302-2 may reference element 302-2, which may be analogous to element 302-1. Such analogous elements may be generally referenced without the hyphen and extra numeral or letter. For example, elements 302-1 and 302-2 or other analogous elements may be generally referenced as 302.

Figure 1B:
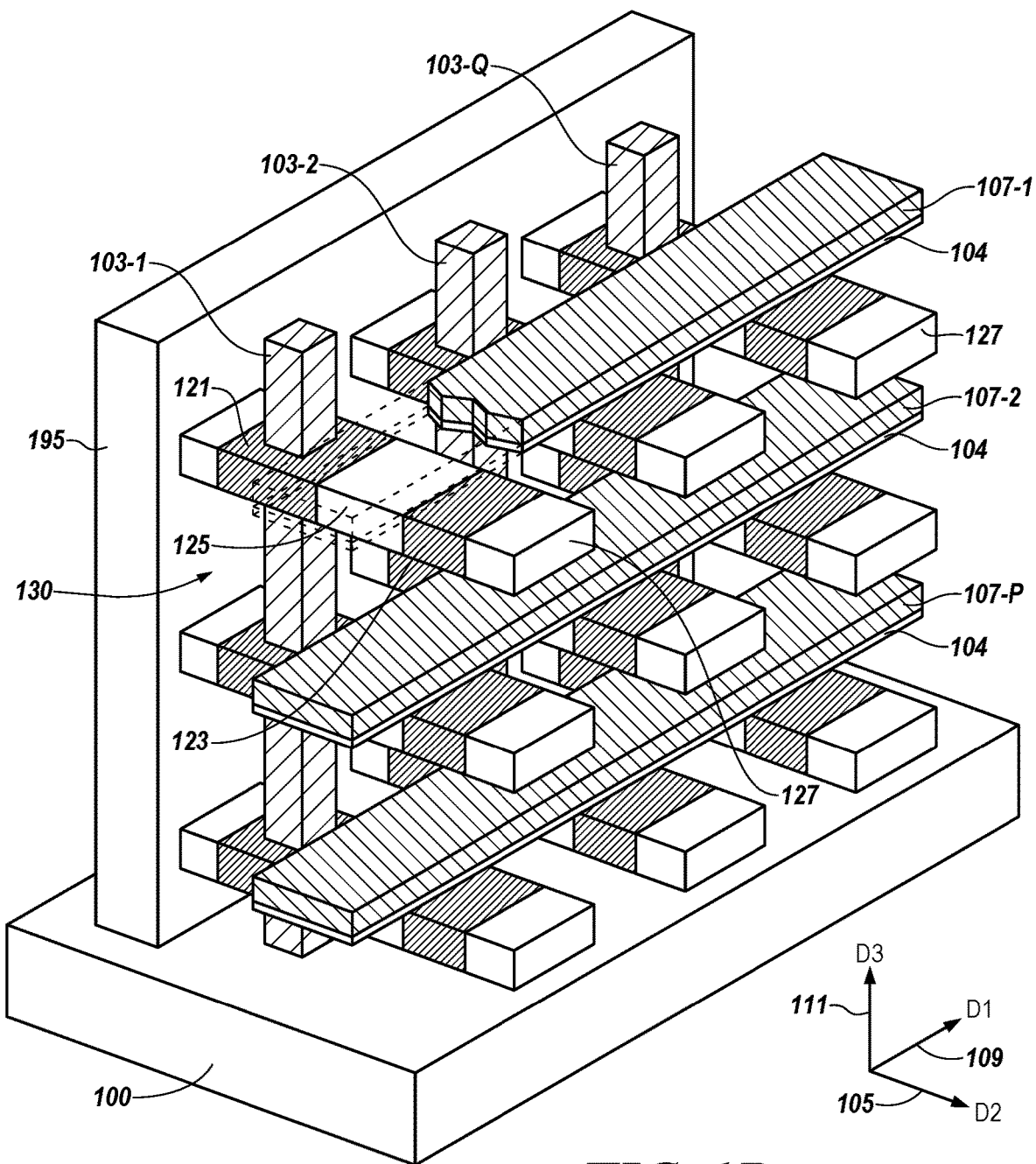
FIG. 1B is a perspective view illustrating a portion of a vertical three dimensional (3D) memory in accordance with a number of embodiments of the present disclosure.

FIG. 1 is a block diagram of an apparatus in accordance a number of embodiments of the present disclosure. FIG. 1 illustrates a circuit diagram showing a cell array of a three-dimensional (3D) semiconductor memory device according to embodiments of the present disclosure. FIG. 1 illustrates a cell array may have a plurality of sub cell arrays 101-1, 101-2, . . . , 101-N. The sub cell arrays 101-1, 101-2, . . . , 101-N may be arranged along a second direction (D2) 105. Each of the sub cell arrays, e.g., sub cell array 101-2, may include a plurality of access lines 103-1, 103-2, . . . , 103-Q (which also may be referred to a wordlines). Also, each of the sub cell arrays, e.g., sub cell array 101-2, may include a plurality of digit lines 107-1, 107-2, . . . , 107-P (which also may be referred to as bitlines, data lines, or sense lines). In FIG. 1, the digit lines 107-1, 107-2, . . . , 107-P are illustrated extending in a first direction (D1) 109 and the access lines 103-1, 103-2, . . . , 103-Q are illustrated extending in a third direction (D3) 111. According to embodiments, the first direction (D1) 109 and the second direction (D2) 105 may be considered in a horizontal ("X-Y") plane. The third direction (D3) 111 may be considered in a vertical ("Z") plane. Hence, according to embodiments described herein, the access lines 103-1, 103-2, . . . , 103-Q are extending in a vertical direction, e.g., third direction (D3) 111.

A memory cell, e.g., 110, may include an access device, e.g., access transistor, and a storage node located at an intersection of each access line 103-1, 103-2, . . . , 103-Q and each digit line 107-1, 107-2, . . . , 107-P. Memory cells may be written to, or read from, using the access lines 103-1, 103-2, . . . , 103-Q and digit lines 107-1, 107-2, . . . , 107-P. The digit lines 107-1, 107-2, . . . , 107-P may conductively interconnect memory cells along horizontal columns of each sub cell array 101-, 101-2, . . . , 101-N, and the access lines 103-1, 103-2, . . . , 103-Q may conductively interconnect memory cells along vertical rows of each sub cell array 101-, 101-2, . . . , 101-N. One memory cell, e.g., 110, may be located between one access line, e.g., 103-2, and one digit line, e.g., 107-2. Each memory cell may be uniquely addressed through a combination of an access line 103-1, 103-2, . . . , 103-Q and a digit line 107-1, 107-2, . . . , 107-P.

The digit lines 107-1, 107-2, . . . , 107-P may be or include conducting patterns (e.g., metal lines) disposed on and spaced apart from a substrate. The digit lines 107-1, 107-2, . . . , 107-P may extend in a first direction (D1) 109. The digit lines 107-1, 107-2, . . . , 107-P in one sub cell array, e.g., 101-2, may be spaced apart from each other in a vertical direction, e.g., in a third direction (D3) 111.

The access lines 103-1, 103-2, . . . , 103-Q may be or include conductive patterns (e.g., metal lines) extending in a vertical direction with respect to the substrate, e.g., in a third direction (D3) 111. The access lines in one sub cell array, e.g., 101-2, may be spaced apart from each other in the first direction (D1) 109.

A gate of a memory cell, e.g., memory cell 110, may be connected to an access line, e.g., 103-2, and a first conductive node, e.g., first source/drain region, of an access device, e.g., transistor, of the memory cell 110 may be connected to a digit line, e.g., 107-2. Each of the memory cells, e.g., memory cell 110, may be connected to a storage node, e.g., capacitor. A second conductive node, e.g., second source/drain region, of the access device, e.g., transistor, of the memory cell 110 may be connected to the storage node, e.g., capacitor. While first and second source/drain region reference are used herein to denote two separate and distinct source/drain regions, it is not intended that the source/drain region referred to as the "first" and/or "second" source/drain regions have some unique meaning. It is intended only that one of the source/drain regions is connected to a digit line, e.g., 107-2, and the other may be connected to a storage node.

Figure 2A:
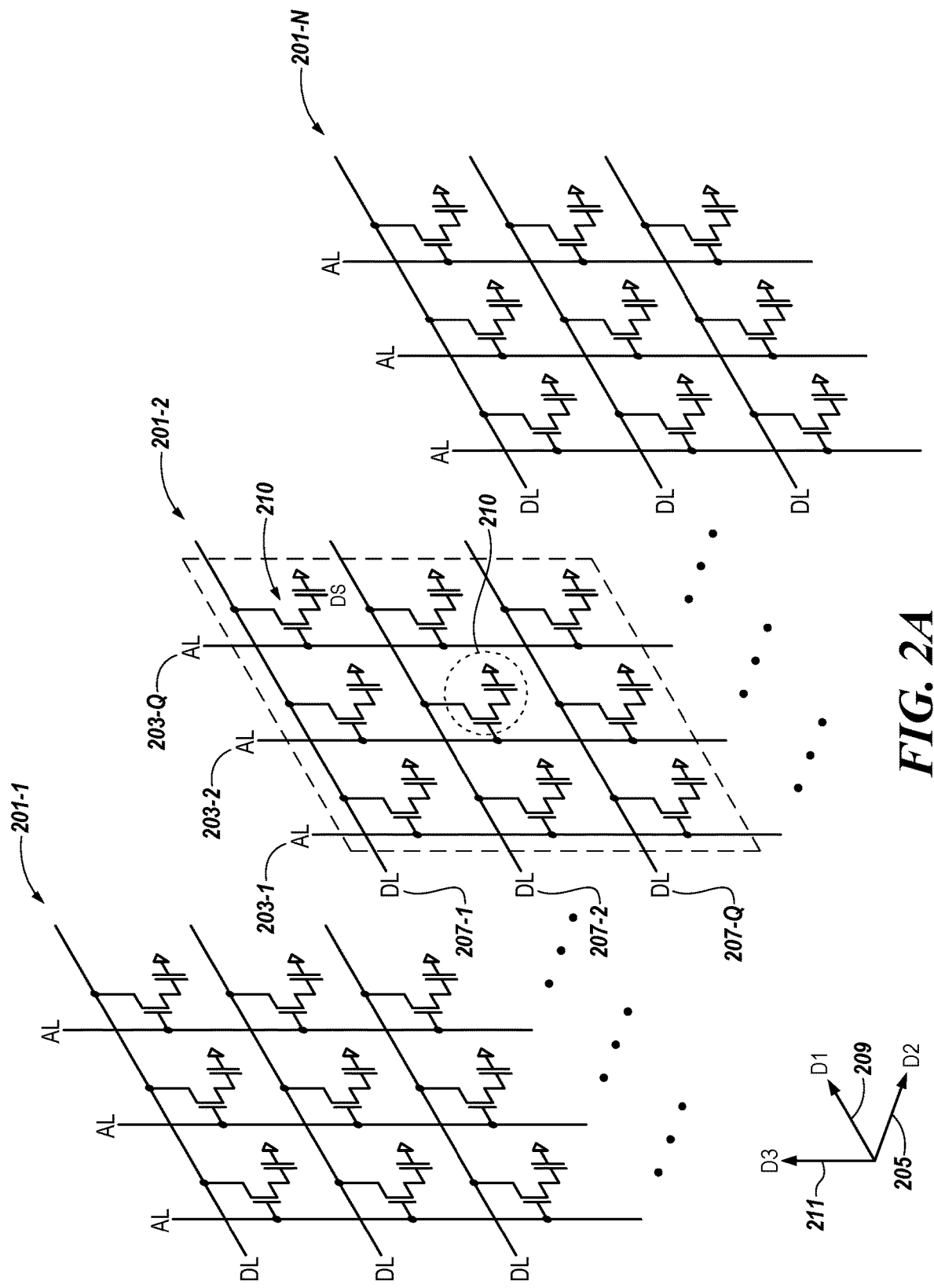
FIG. 2A is a schematic illustration of a horizontal access device in a vertical three dimensional (3D) memory in accordance a number of embodiments of the present disclosure.

FIG. 2A is a block diagram of an apparatus in accordance with a number of embodiments of the present disclosure. FIG. 2A illustrates a circuit diagram showing a cell array of a three-dimensional (3D) semiconductor memory device according to embodiments of the present disclosure. FIG. 2A illustrates that a cell array may have a plurality of sub cell arrays 201-1, 201-2, . . . , 201-N. The sub cell arrays 201-1, 201-2, . . . , 201-N may be arranged along a second direction (D2) 205. Each of the sub cell arrays (e.g., sub cell array 201-2) may include a plurality of access lines 203-1, 203-2, . . . , 203-Q (which also may be referred to as word lines). Also, each of the sub cell arrays (e.g., sub cell array 201-2) may include a plurality of digit lines 207-1, 207-2, . . . , 207-Q (which also may be referred to as bit lines, data lines, or sense lines). In FIG. 2A, the digit lines 207-1, 207-2, . . . , 207-Q are illustrated extending in a first direction (D1) 209 and the access lines 203-1, 203-2, . . . , 203-Q are illustrated extending in a third direction (D3) 211.

The first direction (D1) 209 and the second direction (D2) 205 may be considered in a horizontal ("X-Y") plane. The third direction (D3) 211 may be considered in a vertical ("Z") direction (e.g., transverse to the X-Y plane). Hence, according to embodiments described herein, the access lines 203-1, 203-2, . . . , 203-Q are extending in a vertical direction (e.g., third direction (D3) 211).

A memory cell (e.g., 210) may include an access device (e.g., access transistor) and a storage node located at an intersection of each access line 203-1, 203-2, . . . , 203-Q and each digit line 207-1, 207-2, . . . , 207-Q. Memory cells may be written to, or read from, using the access lines 203-1, 203-2, . . . , 203-Q and digit lines 207-1, 207-2, . . . , 207-Q. The digit lines 207-1, 207-2, . . . , 207-Q may conductively interconnect memory cells along horizontal columns of each sub cell array 201-, 201-2, . . . , 201-N, and the access lines 203-1, 203-2, . . . , 203-Q may conductively interconnect memory cells along vertical rows of each sub cell array 201-1, 201-2, . . . , 201-N. One memory cell, e.g., 210, may be located between one access line (e.g., 203-2) and one digit line (e.g., 207-2). Each memory cell may be uniquely addressed through a combination of an access line 203-1, 203-2, . . . , 203-Q and a digit line 207-1, 207-2, . . . , 207-Q.

The digit lines 207-1, 207-2, . . . , 207-Q may be or include conducting patterns (e.g., metal lines) disposed on and spaced apart from a substrate. The digit lines 207-1, 207-2, . . . , 207-Q may extend in a first direction (D1) 209. The digit lines 207-1, 207-2, . . . , 207-Q in one sub cell array (e.g., 201-2) may be spaced apart from each other in a vertical direction (e.g., in a third direction (D3) 211).

The access lines 203-1, 203-2, . . . , 203-Q may be or include conductive patterns (e.g., metal lines) extending in a vertical direction with respect to the substrate (e.g., in a third direction (D3) 211). The access lines in one sub cell array (e.g., 201-2) may be spaced apart from each other in the first direction (D1) 209.

A gate of a memory cell (e.g., memory cell 210) may be connected to an access line (e.g., 203-2) and a first conductive node (e.g., first source/drain region) of an access device (e.g., transistor) of the memory cell 210 may be connected to a digit line (e.g., 207-2). Each of the memory cells (e.g., memory cell 210) may be connected to a storage node (e.g., capacitor). A second conductive node (e.g., second source/drain region) of the access device (e.g., transistor) of the memory cell 210 may be connected to the storage node (e.g., capacitor). Storage nodes, such as capacitors, can be formed from ferroelectric and/or dielectric materials such as zirconium oxide (ZrO2), hafnium oxide (HfO2) oxide, lanthanum oxide (La2O3), lead zirconate titanate (PZT, Pb[Zr(x)Ti(1−x)]O3), barium titanate (BaTiO3), aluminum oxide (e.g., $Al_2O_3$), a combination of these with or without dopants, or other suitable materials.

While first and second source/drain region reference are used herein to denote two separate and distinct source/drain regions, it is not intended that the source/drain region referred to as the "first" and/or "second" source/drain regions have some unique meaning. It is intended only that one of the source/drain regions is connected to a digit line (e.g., 207-2) and the other may be connected to a storage node.

Figure 2B:
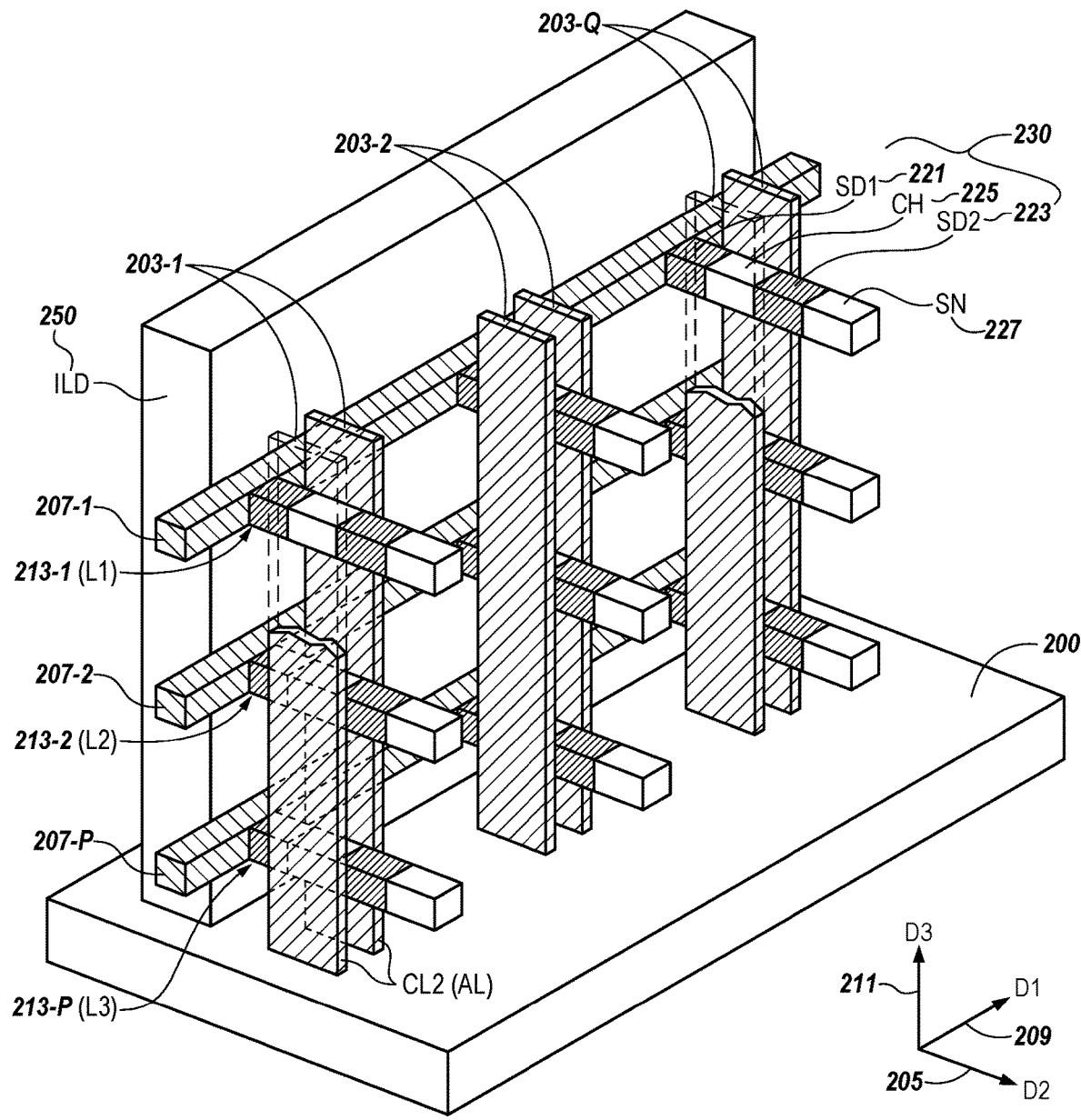
FIG. 2B is a perspective view illustrating a portion of a horizontal access devices in vertical three dimensional (3D) memory in accordance with a number of embodiments of the present disclosure.

FIG. 2B illustrates a perspective view showing a three-dimensional (3D) semiconductor memory device (e.g., a portion of a sub cell array 201-2 shown in FIG. 2A as a vertically oriented stack of memory cells in an array) according to some embodiments of the present disclosure. As shown in FIG. 2B, a substrate 200 may have formed thereon one of the plurality of sub cell arrays (e.g., 201-2) described in connection with FIG. 2A. For example, the substrate 200 may be or include a silicon substrate, a germanium substrate, or a silicon-germanium substrate, etc. Embodiments, however, are not limited to these examples.

As shown in the example embodiment of FIG. 2B, the substrate 200 may have fabricated thereon a vertically oriented stack of memory cells (e.g., memory cell 210 in FIG. 2A) extending in a vertical direction (e.g., third direction (D3) 211). According to some embodiments the vertically oriented stack of memory cells may be fabricated such that each memory cell (e.g., memory cell 210 in FIG. 2A) is formed on plurality of vertical levels (e.g., a first level (L1), a second level (L2), and a third level (L3)). The repeating, vertical levels, L1, L2, and L3, may be arranged (e.g., "stacked") a vertical direction (e.g., third direction (D3) 211 shown in FIG. 2A) and may be separated from the substrate 200 by an insulator material 220. Each of the repeating, vertical levels, L1, L2, and L3 may include a plurality of discrete components (e.g., regions) to the laterally oriented access devices 230 (e.g., transistors) and storage nodes (e.g., capacitors) including access line 203-1, 203-2, . . . , 203-Q connections and digit line 207-1, 207-2, . . . , 207-Q connections. The plurality of discrete components to the laterally oriented access devices 230 (e.g., transistors) may be formed in a plurality of iterations of vertically, repeating layers within each level, as described in more detail below in connection with FIGS. 4A-4B, and may extend horizontally in the second direction (D2) 205, analogous to second direction (D2) 205 shown in FIG. 2A.

The plurality of discrete components to the laterally oriented access devices 230 (e.g., transistors) may include a first source/drain region 221 and a second source/drain region 223 separated by a channel region 225, extending laterally in the second direction (D2) 205, and formed in a body of the access devices. In some embodiments, the channel region 225 may include materials such as silicon, germanium, silicon-germanium, and/or indium gallium zinc oxide (IGZO). In some embodiments, a multilayer channel material may be deposited as the channel regions. In some examples, the channel material may be deposited to have a width greater than the thickness of the channel material. In some embodiments, the first and the second source/drain regions, 221 and 223, can include an n-type dopant region formed in a p-type doped body to the access device to form an n-type conductivity transistor. In some embodiments, the first and the second source/drain regions, 221 and 223, may include a p-type dopant formed within an n-type doped body to the access device to form a p-type conductivity transistor. By way of example, and not by way of limitation, the n-type dopant may include phosphorous (P) atoms and the p-type dopant may include atoms of boron (B) formed in an oppositely doped body region of polysilicon semiconductor material. Embodiments, however, are not limited to these examples.

The storage node 227 (e.g., capacitor) may be connected to one respective end of the access device. As shown in FIG. 2B, the storage node 227 (e.g., capacitor) may be connected to the second source/drain region 223 of the access device. The storage node may be or include memory elements capable of storing data. Each of the storage nodes may be a memory element using one of a capacitor, a magnetic tunnel junction pattern, and/or a variable resistance body which includes a phase change material, etc. Embodiments, however, are not limited to these examples. In some embodiments, the storage node associated with each access device of a unit cell (e.g., memory cell 210 in FIG. 2A) may similarly extend in the second direction (D2) 205, analogous to second direction (D2) 205 shown in FIG. 2A.

As shown in FIG. 2B a plurality of horizontally oriented digit lines 207-1, 207-2, . . . , 207-Q extend in the first direction (D1) 209, analogous to the first direction (D1) 209 in FIG. 2A. The plurality of horizontally oriented digit lines 207-1, 207-2, . . . , 207-Q may be analogous to the digit lines 207-1, 207-2, . . . , 207-Q shown in FIG. 2A. The plurality of horizontally oriented digit lines 207-1, 207-2, . . . , 207-Q may be arranged (e.g., "stacked") along the third direction (D3) 211. The plurality of horizontally oriented digit lines 207-1, 207-2, . . . , 207-Q may include a first conductive material. For example, the first conductive material may include one or more of a doped semiconductor (e.g., doped silicon, doped germanium, etc.) a conductive metal nitride (e.g., titanium nitride, tantalum nitride, etc.) a metal (e.g., tungsten (W), titanium (Ti), tantalum (Ta), ruthenium (Ru), cobalt (Co), molybdenum (Mo), etc.) and/or a metal-semiconductor compound (e.g., tungsten silicide, cobalt silicide, titanium silicide, etc.) Embodiments, however, are not limited to these examples.

Among each of the vertical levels, (L1) 213-1, (L2) 213-2, and (L3) 213-P, the horizontally oriented memory cells (e.g., memory cell 210 in FIG. 2A) may be spaced apart from one another horizontally in the first direction (D1) 209. However, as described in more detail below in connection with FIG. 4A, et seq, the plurality of discrete components to the laterally oriented access devices 230 (e.g., first source/drain region 221 and second source/drain region 223 separated by a channel region 225), extending laterally in the second direction (D2) 205, and the plurality of horizontally oriented digit lines 207-1, 207-2, . . . , 207-Q, extending laterally in the first direction (D1) 209, may be formed within different vertical layers within each level. For example, the plurality of horizontally oriented digit lines 207-1, 207-2, . . . , 207-Q, extending in the first direction (D1) 209, may be disposed on, and in electrical contact with, top surfaces of first source/drain regions 221 and orthogonal to laterally oriented access devices 230 (e.g., transistors) extending laterally in the second direction (D2) 205. In some embodiments, the plurality of horizontally oriented digit lines 207-1, 207-2, . . . , 207-Q, extending in the first direction (D1) 209 are formed in a higher vertical layer, farther from the substrate 200, within a level (e.g., within level (L1)) than a layer in which the discrete components (e.g., first source/drain region 221 and second source/drain region 223 separated by a channel region 225) of the laterally oriented access device are formed. In some embodiments, the plurality of horizontally oriented digit lines 207-1, 207-2, . . . , 207-Q, extending in the first direction (D1) 209, may be connected to the top surfaces of the first source/drain regions 221 directly and/or through additional contacts including metal silicides.

As shown in the example embodiment of FIG. 2B, the access lines, 203-1, 203-2, . . . , 203-Q, extend in a vertical direction with respect to the substrate 200 (e.g., in a third direction (D3) 211). Further, as shown in FIG. 2B, the access lines, 203-1, 203-2, . . . , 203-Q, in one sub cell array (e.g., sub cell array 201-2 in FIG. 2A) may be spaced apart from each other in the first direction (D1) 209. The access lines, 203-1, 203-2, . . . , 203-Q, may be provided, extending vertically relative to the substrate 200 in the third direction (D3) 211 between a pair of the laterally oriented access devices 230 (e.g., transistors) extending laterally in the second direction (D2) 205, but adjacent to each other on a level (e.g., first level (L1)) in the first direction (D1) 209. Each of the access lines, 203-1, 203-2, . . . , 203-Q, may vertically extend, in the third direction (D3), on sidewalls of respective ones of the plurality of laterally oriented access devices 230 (e.g., transistors) that are vertically stacked.

Figure 3:
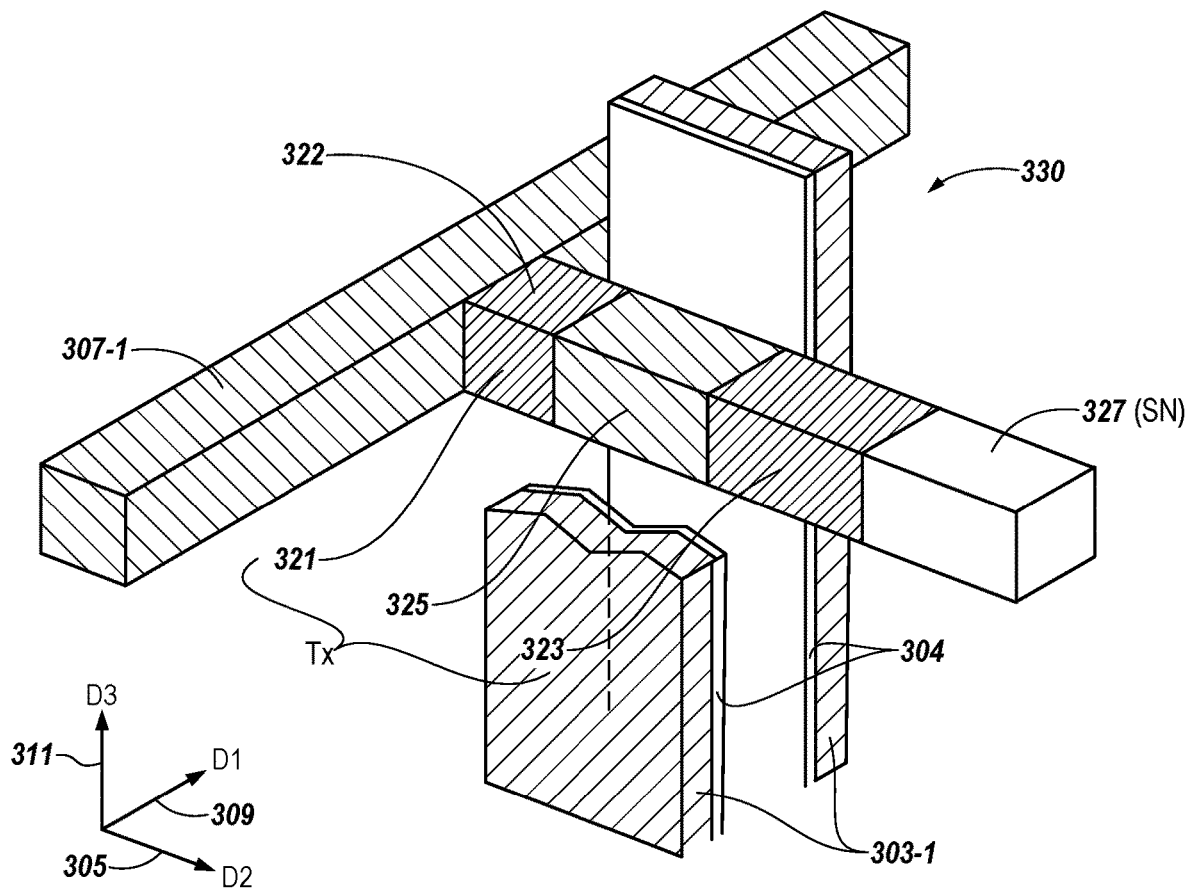
FIG. 3 is a perspective view illustrating a portion of a three-node access device in a vertical three-dimensional (3D) memory cell in accordance with a number of embodiments of the present disclosure.

For example, and as shown in more detail in FIG. 3, a first one of the vertically extending access lines (e.g., 203-1) may be adjacent a sidewall of a channel region 225 to a first one of the laterally oriented access devices 230 (e.g., transistors) in the first level (L1) 213-1, a sidewall of a channel region 225 of a first one of the laterally oriented access devices 230 (e.g., transistors) in the second level (L2) 213-2, and a sidewall of a channel region 225 a first one of the laterally oriented access devices 230 (e.g., transistors) in the third level (L3) 213-P, etc. Similarly, a second one of the vertically extending access lines (e.g., 203-2) may be adjacent a sidewall to a channel region 225 of a second one of the laterally oriented access devices 230 (e.g., transistors) in the first level (L1) 213-1, spaced apart from the first one of laterally oriented access devices 230 (e.g., transistors) in the first level (L1) 213-1 in the first direction (D1) 209. And the second one of the vertically extending access lines (e.g., 203-2) may be adjacent a sidewall of a channel region 225 of a second one of the laterally oriented access devices 230 (e.g., transistors) in the second level (L2) 213-2, and a sidewall of a channel region 225 of a second one of the laterally oriented access devices 230 (e.g., transistors) in the third level (L3) 213-P, etc. Embodiments are not limited to a particular number of levels. In some embodiments, the vertically extending access lines (e.g., 203-2) may be deposited to have a width greater than the horizontal length of the channels, overlapping both the first and the second source/drain regions horizontally. In another embodiment, the vertically extending access lines (e.g., 203-2) may be deposited to have a width less than the horizontal length of the channels, underlapping both the first and the second source/drain regions horizontally.

The vertically extending access lines, 203-1, 203-2, . . . , 203-Q, may include a first conductive material, such as, for example, one of a doped semiconductor material, a conductive metal nitride, metal, and/or a metal-semiconductor compound. The access lines, 203-1, 203-2, . . . , 203-Q, may correspond to word lines (WL) described in connection with FIG. 2A.

As shown in the example embodiment of FIG. 2B, a conductive body contact 295 may be formed extending in the first direction (D1) 209 along an end surface of the laterally oriented access devices 230 (e.g., transistors) in each level (L1) 213-1, (L2) 213-2, and (L3) 213-P above the substrate 200. The body contact 295 may be connected to a body, as shown by 336 in FIG. 3, (e.g., body region) of the laterally oriented access devices 230 (e.g., transistors) in each memory cell (e.g., memory cell 210 in FIG. 2A). The body contact 295 may include a first conductive material such as, for example, one of a doped semiconductor material, a conductive metal nitride, metal, and/or a metal-semiconductor compound.

Although not shown in FIG. 2B, an insulating material may fill other spaces in the vertically stacked array of memory cells. For example, the insulating material may include one or more of a silicon oxide material, a silicon nitride material, and/or a silicon oxynitride material, etc. Embodiments, however, are not limited to these examples.

FIG. 3 illustrates in more detail a unit cell, e.g., memory cell 110 in FIG. 1, of the vertically stacked array of memory cells, e.g., within a sub cell array 101-2 in FIG. 1, according to some embodiments of the present disclosure. As shown in FIG. 3, the first and the second source/drain regions, 321 and 323, may be impurity doped regions to the horizontally oriented, three-node access devices 330, e.g., transistors. The first and the second source/drain regions, 321 and 323, may also comprise a metal, and/or metal composite materials containing ruthenium (Ru), molybdenum (Mo), nickel (Ni), titanium (Ti), copper (Cu), a highly doped degenerate semiconductor material, and/or at least one of indium oxide ($In_2O_3$), or indium tin oxide ($In_{2-x}Sn_xO_3$), formed using an atomic layer deposition process, etc. Embodiments, however, are not limited to these examples. As used herein, a degenerate semiconductor material is intended to mean a semiconductor material, such as polysilicon, containing a high level of doping with significant interaction between dopants, e.g., phosphorous (P), boron (B), etc. Non-degenerate semiconductors, by contrast, contain moderate levels of doping, where the dopant atoms are well separated from each other in the semiconductor host lattice with negligible interaction. The first and the second source/drain regions, 321 and 323, may be analogous to the first and the second source/drain regions 221 and 223 shown in FIG. 2.

The first and the second source/drain regions may be separated by a channel 325, e.g., channel region, of the horizontally oriented, three-node access devices 330, e.g., transistors. The channel 325 may be a low-doped (p-) polysilicon material. In some embodiments, the channel 325 may be a low-doped (p-) poly-germanium (Ge) material. In some embodiments, the channel 325 may be a low doped (p-) poly-silicon-germanium (poly-SiGe) material However, in some embodiments the channel 325 may be comprised of a semiconductor oxide (also referred to herein as an "oxide semiconductor" or "oxide semiconductor material"). The semiconductor oxide may comprise any suitable composition; and in some embodiments may include one or more of indium, zinc, tin and gallium. Examples of oxide semiconductor materials and/or compositions, as used herein, including one or more of indium, zinc, tin and gallium may include such materials as $ZnO_x$, $InO_x$, $SnO_2$, $Zn_xO_yN$, $Mg_xZn_yO_z$, $In_xZn_yO_z$, $In_xZn_yO_z$, $In_xGa_yZn_zO_a$, $In_xGa_ySi_zO_a$, $Zr_xIn_yZn_zO_a$, $Hf_xIn_yZn_zO_a$, $Sn_xIn_yZn_zO_a$, $Al_xSn_yIn_zZn_aO_b$, $Si_xIn_yZn_zO_a$, $Zn_xSn_yO_z$, $Al_xZn_ySn_zO_a$, $Ga_xZn_ySn_zO_a$, and $Zr_xZn_ySn_zO_a$.

In additional embodiments, the channel 325 may be comprised of a two-dimensional (2D) material. The 2D material may comprise any suitable composition; and in some embodiments may include one or more of a transition metal dichalcogenide, including molybdenum disulfide ($MoS_2$), molybdenum diselenide ($MoSe_2$), molybdenum ditelluride ($MoTe_2$), tungsten sulfide ($WS_2$), and tungsten selenide ($WSe_2$). Embodiments, however, are not limited to these examples.

In some embodiments, the channel 325 may comprise a composite material such as an indium gallium zinc oxide ($In_2Ga_2ZnO_7$) material (also referred to herein as "IGZO").

In some embodiments, the composite IGZO material is a multi-layer $I_2G_2ZnO_7$ channel that is indium (In) rich in a first layer, closest to a surface of the channel opposing a gate dielectric, relative to the multiple layers. In some embodiments, the composite IGZO material is a multi-layer $I_2G_2ZnO_7$ channel that is gallium (Ga) rich in an outer layer, farthest from a surface of the channel opposing a gate dielectric, relative to the multiple layers. And, in some embodiments, the composite IGZO material is a multi-layer $I_2G_2ZnO_7$ channel that is zinc (Zn) rich in an outer layer, farthest from a surface of the channel opposing a gate dielectric, relative to the multiple layers, etc. Embodiments, however, are not limited to these examples. In some embodiments, the channel 325 may be a gradient channel region having a decreasing indium (In) concentration in the gradient channel region in a direction away from a gate dielectric.

A digit line, e.g., 307-1, analogous to the digit lines 207-1, 207-2, . . . , 207-P in FIGS. 2 and 107-1, 107-2, . . . , 107-P shown in FIG. 1, may be formed in electrical contact with the first source/drain region 321. As shown in the example embodiment of FIG. 3, an access line, e.g., 303-1, analogous to the access lines 203-1, 203-2, . . . , 203-Q in FIGS. 2 and 103-1, 103-2, . . . , 103-Q in FIG. 1, may be vertically extending in the third direction (D3) 311 adjacent sidewall of the channel region 325 of the horizontally oriented, three-node access devices 330, e.g., transistors horizontally conducting between the first and the second source/drain regions 321 and 323 along the second direction (D2) 305. A gate dielectric material 304 may be interposed between the access line 303-1 (a portion thereof forming a gate to the horizontally oriented, three-node access devices 330, e.g., transistors) and the channel region 325. The gate dielectric material 304 may include, for example, a high-k dielectric material, a silicon oxide material, a silicon nitride material, a silicon oxynitride material, etc., or a combination thereof. Embodiments are not so limited. For example, in high-k dielectric material examples the gate dielectric material 304 may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobite, etc.

Figure 4:
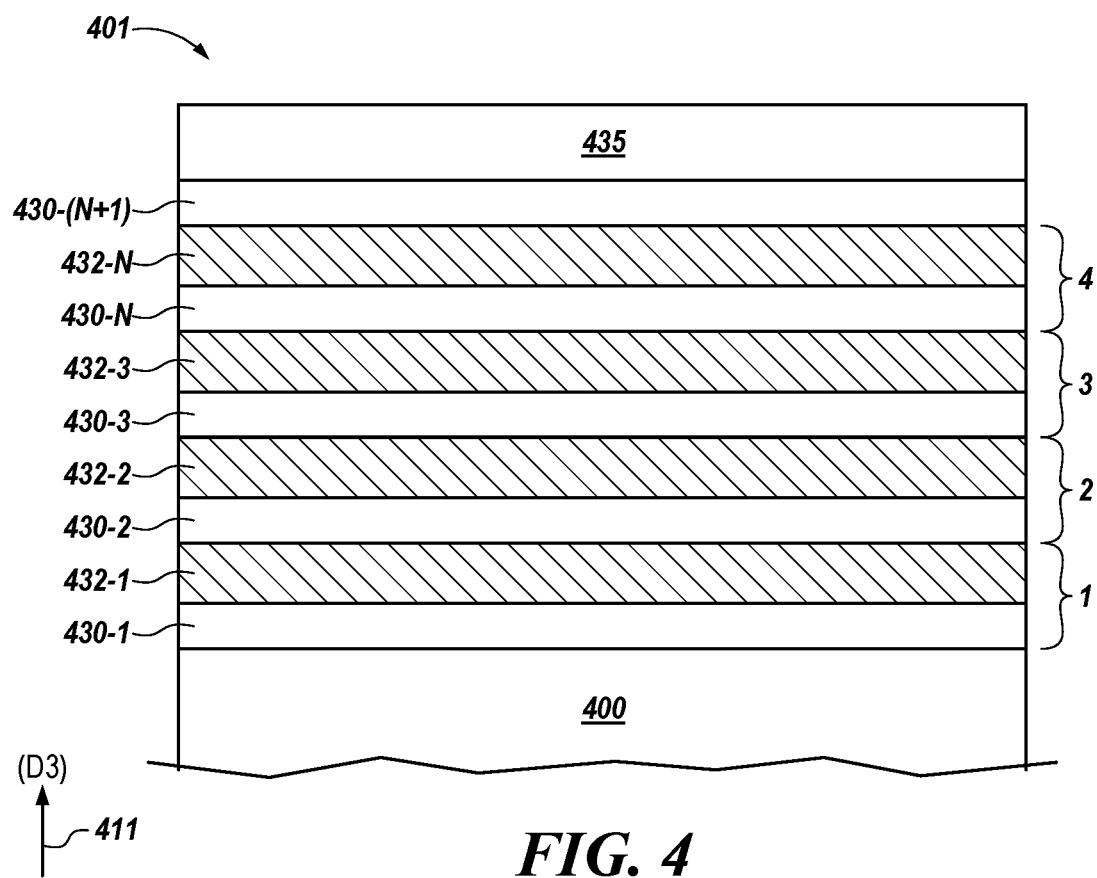
FIG. 4 illustrates an example method for forming arrays of vertically stacked memory cells, at one stage of a semiconductor fabrication process, to form three-node access devices in accordance with a number of embodiments of the present disclosure.

FIG. 4 illustrates an example method, at one stage of a semiconductor fabrication process, for forming arrays of vertically stacked memory cells, having horizontally oriented access devices and vertically oriented access lines, such as illustrated in FIGS. 1-3, and in accordance with a number of embodiments of the present disclosure. In the example embodiment shown in the example of FIG. 4, the method comprises depositing alternating layers of a dielectric material, 430-1, 430-2, . . . , 430-N (also referred to herein independently and/or collectively as "430"), and a sacrificial material, 432-1, 432-2, . . . , 432-N (also referred to herein independently and/or collectively as "432"), in repeating iterations to form a vertical stack 401 on a working surface of a semiconductor substrate 400. In one embodiment, the dielectric material 430 can be deposited to have a thickness, e.g., vertical height in the third direction (D3), in a range of twenty (20) nanometers (nm) to sixty (60) nm. In one embodiment, the sacrificial material 432 can be deposited to have a thickness, e.g., vertical height, in a range of twenty (20) nm to one hundred (100) nm. Embodiments, however, are not limited to these examples.

In one example, the sacrificial material, 432-1, 432-2, . . . , 432-N, can comprise a sacrificial semiconductor material such as polycrystalline silicon (Si), silicon nitride (SiN), or even an oxide-based semiconductor composition. While the discussion herein will refer to a sacrificial semiconductor material example, embodiments are not limited to this example. It is intended that the sacrificial material may be selectively etched relative to the alternating layer of dielectric material, 430-1, 430-2, . . . , 430-N.

As shown in FIG. 4, a vertical direction 411 is illustrated as a third direction (D3), e.g., z-direction in an x-y-z coordinate system, analogous to the third direction (D3), among first, second and third directions, shown in FIGS. 1-3. In the example of FIG. 4, four tiers, numbered 1, 2, 3, and 4, of the repeating iterations of the vertical stack 401 are shown. Embodiments, however, are not limited to this example and more or fewer repeating iterations may be included. A photolithographic hard mask (HM) layer 435 may be deposited as a top layer on the repeating iterations of the vertical stack 401.

In some embodiments, the dielectric material, 430-1, 430-2, . . . , 430-N, may be an interlayer dielectric (ILD). By way of example, and not by way of limitation, the dielectric material, 430-1, 430-2, . . . , 430-N, may comprise a silicon dioxide ($SiO_2$) material. In another example the dielectric material, 430-1, 430-2, . . . , 430-N, may comprise a silicon nitride ($Si_3N_4$) material (also referred to herein a "SiN"). In another example the dielectric material, 430-1, 430-2, . . . , 430-N, may comprise a silicon oxy-carbide ($SiO_xC_y$) material (also referred to herein as "SiOC"). In another example the dielectric material, 430-1, 430-2, . . . , 430-N, may include silicon oxy-nitride ($SiO_xN_y$) material (also referred to herein as "SiON"), and/or combinations thereof. Embodiments are not limited to these examples. In some embodiments the sacrificial semiconductor material, 432-1, 432-2, . . . , 432-N, may comprise a silicon (Si) material in a polycrystalline and/or amorphous state. In another example the sacrificial semiconductor material, 432-1, 432-2, . . . , 432-N, may comprise a silicon nitride (SiN) material. Embodiments, however, are not limited to these examples.

The repeating iterations of alternating dielectric material, 430-1, 430-2, . . . , 430-N, layers and sacrificial semiconductor material, 432-1, 432-2, . . . , 432-N, layers may be deposited according to a semiconductor fabrication process such as chemical vapor deposition (CVD) in a semiconductor fabrication apparatus. Embodiments, however, are not limited to this example and other suitable semiconductor fabrication techniques may be used to deposit the alternating layers of a dielectric material, 430-1, 430-2, . . . , 430-N, and a sacrificial semiconductor material, 432-1, 432-2, . . . , 432-N, in repeating iterations to form a vertical stack 401, as shown in FIG. 4.

Figure 5A:
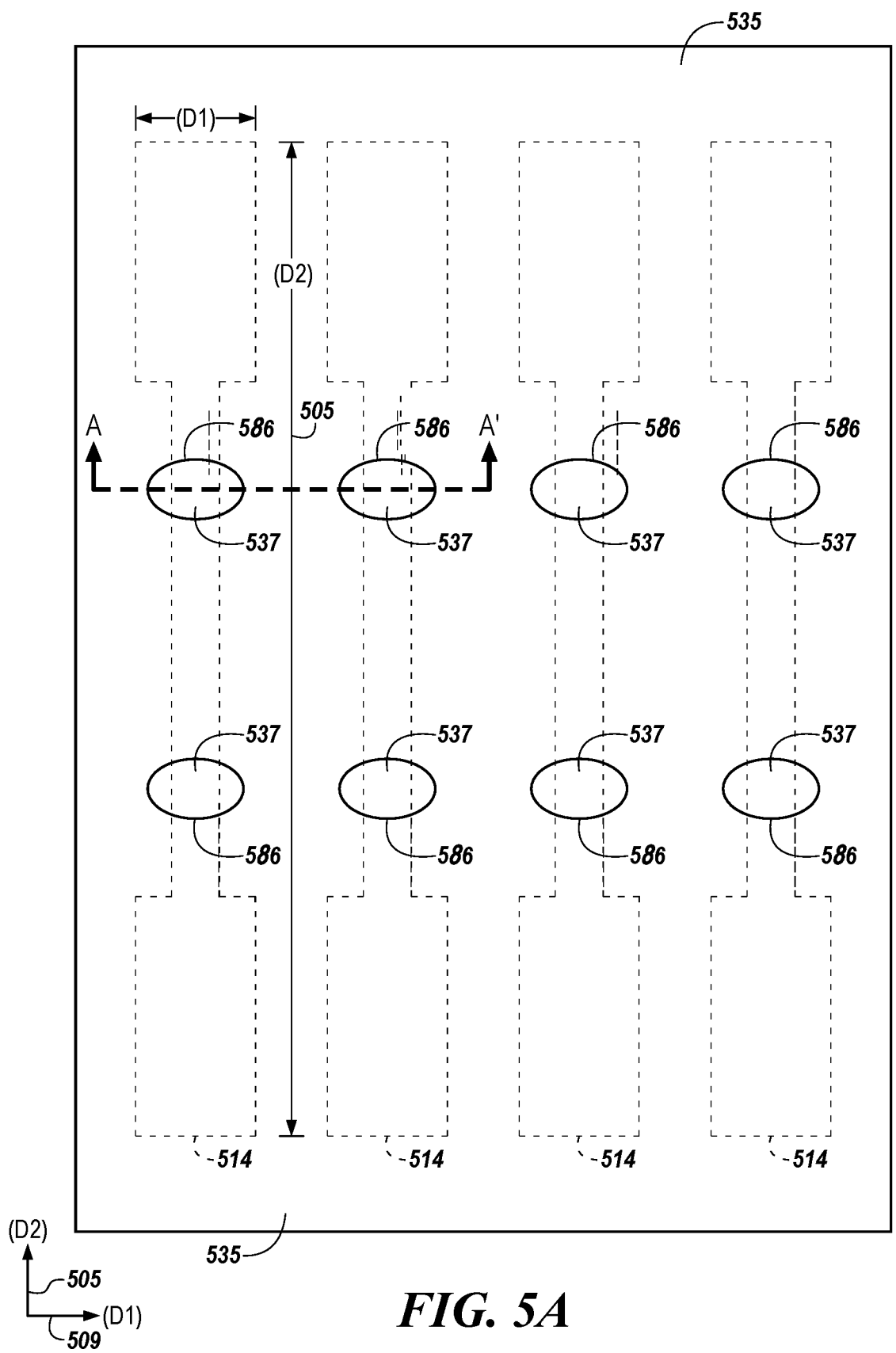

FIG. 5A illustrates an example method, at another stage of a semiconductor fabrication process, for forming arrays of vertically stacked memory cells, having horizontally oriented access devices and vertically oriented access lines, such as illustrated in FIGS. 1-3, and in accordance with a number of embodiments of the present disclosure. FIG. 5A illustrates a top down view of a semiconductor structure, at a particular point in time, in a semiconductor fabrication process, according to one or more embodiments.

In the example embodiment, the method comprises using a photolithographic process to pattern and to expose particular regions of the vertical stack through the hard mask layer (hard mask layer 435 of FIG. 4) for forming a plurality of spaced, first vertical openings 586 through the vertical stack adjacent areas where storage nodes will be formed. According to embodiments, the method comprises forming the plurality of spaced, first vertical openings 586 through the vertical stack in which to deposit support-pillar material.

In some embodiments, a directional anisotropic etch can be used to form the first vertical openings 586. In some examples, the anisotropic each can be used to etch oxide material from the stack to form the first vertical openings 586 in the stack.

In some embodiments, as shown in the example of FIG. 5A, the method comprises depositing support-pillar material in a plurality of first vertical openings 586 to form support pillars 537. In some embodiments, the support-pillars 537 can be formed by depositing dielectric material in the first vertical openings 586. For example, hafnium dioxide ($HfO_2$) and/or zirconium dioxide $ZrO_2$) can be deposited as the support-pillar material in the first vertical openings 586 to form the support pillars 537.

FIG. 5B is a cross sectional view, taken along cut-line A-A' in FIG. 5A, showing another view of the semiconductor structure at a particular time in the semiconductor fabrication process. FIG. 5B illustrates the repeating iterations of alternating layers of a dielectric material, 530-1, 530-2, . . . , 530-N, and a sacrificial semiconductor material, 532-1, 532-2, . . . , 532-N, on a semiconductor substrate 500 to form the vertical stack, e.g., 401 as shown in FIG. 4, creating elongated vertical, pillar columns 542-1, 542-2, and 542-3. The dielectric may be planarized to a top surface of the hard mask 535 of the vertical semiconductor stack, e.g., 401 as shown in FIG. 4, using chemical mechanical planarization (CMP) or other suitable semiconductor fabrication technique. Similar semiconductor process techniques may be used at other points of the semiconductor fabrication process described herein.

Further, as shown in FIG. 5B, support pillars 537, may be formed in the plurality of first vertical openings 586. By way of example and not by way of limitation, the support pillar material may be conformally deposited in the plurality of first vertical openings 586 using a chemical vapor deposition (CVD) process, plasma enhanced CVD (PECVD), atomic layer deposition (ALD), or other suitable deposition process, to fill the plurality of first vertical openings 586. The support pillars 537 may be formed to reduce and/or eliminate wobbling and/or buckling of the vertical stack being formed. That is, as vertical stacks increase in size the possibility of wobbling increases. The support pillars 537 can be formed to mitigate wobbling and/or buckling of the vertical stacks with increased height (e.g., vertical stack with a height above 300 nanometers (nm) and/or an aspect ratio of line and height above 5.

Figure 6A:
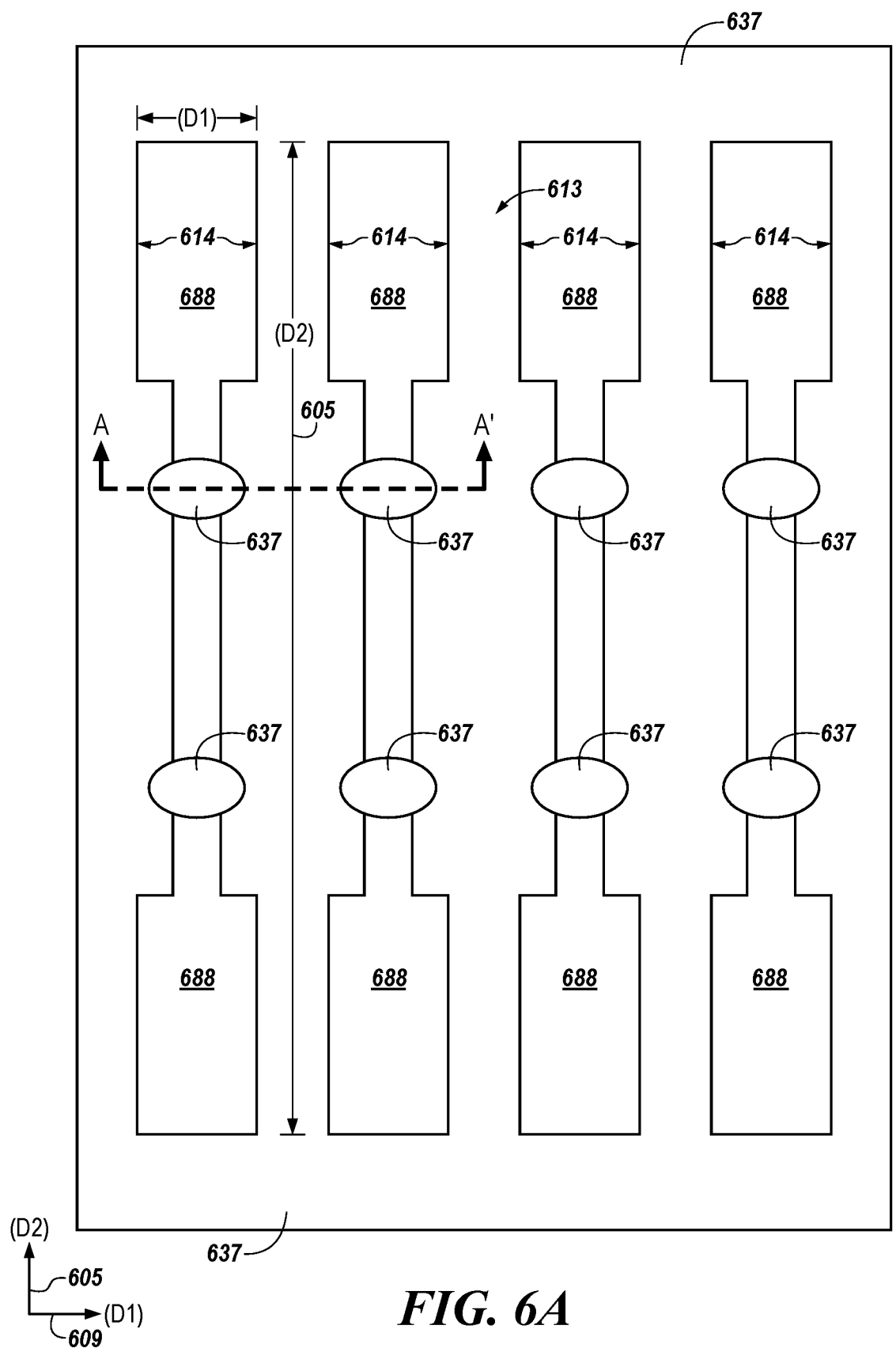

FIG. 6A illustrates an example method, at another stage of a semiconductor fabrication process, for forming arrays of vertically stacked memory cells, having horizontally oriented access devices and vertically oriented access lines, such as illustrated in FIGS. 1-3, and in accordance with a number of embodiments of the present disclosure. FIG. 6A illustrates a top down view of a semiconductor structure, at a particular point in time, in a semiconductor fabrication process, according to one or more embodiments. In the example embodiment shown in the example of FIG. 6A, the method comprises using an etchant process to form a plurality of second vertical openings 688, having a first horizontal direction (D1) 609 and a second horizontal direction (D2) 605, through the vertical stack to the substrate. In one example, as shown in FIG. 6A, the plurality of second vertical openings 688 are extending predominantly in the second horizontal direction (D2) 605 and may form elongated vertical, pillar columns 613 with sidewalls 614 in the vertical stack. The plurality of second vertical openings 688 may be formed using photolithographic techniques to pattern a photolithographic mask 635, e.g., to form a hard mask (HM), on the vertical stack prior to etching the plurality of second vertical openings 688. In some embodiments, the plurality of second vertical openings 688 can be formed around the support pillars formed in the first vertical openings. The support pillars may provide support to column pillars formed in the vertical stack.

FIG. 6B is a cross sectional view, taken along cut-line A-A' in FIG. 6A, showing another view of the semiconductor structure at a particular time in the semiconductor fabrication process. Further, as shown in FIG. 6B, repeating iterations of alternating layers of a dielectric material, 630-1, 630-2, . . . , 630-N, and a sacrificial semiconductor material, 632-1, 632-2, . . . , 632-N, on a semiconductor substrate 600 to form the vertical stack, e.g., 401 as shown in FIG. 4, creating elongated vertical, pillar columns 642-1, 642-2, and 642-3. The pillar columns 642-1, 642-2, and 642-3 can include a top surface of the hard mask 635 of the vertical semiconductor stack. A subsequent photolithographic material 636, e.g., hard mask, may be deposited using CVD and planarized using CMP to cover and close the second vertical openings 688. Similar semiconductor process techniques may be used at other points of the semiconductor fabrication process described herein. As discussed in FIG. 5B, support pillars 637, may be formed in the plurality of first vertical openings.

Figure 7A:
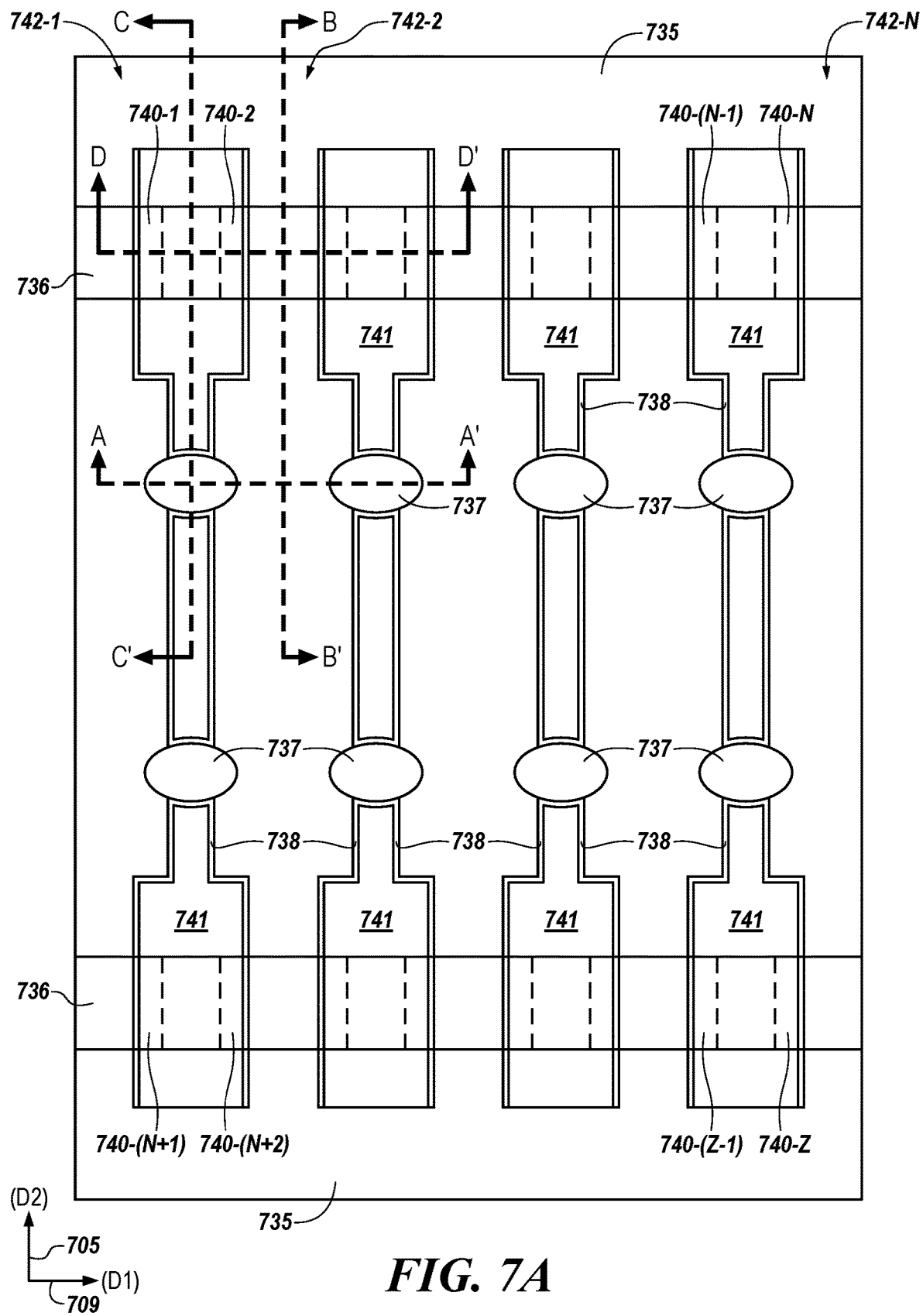

FIG. 7A illustrates an example method, at another stage of a semiconductor fabrication process, for forming arrays of vertically stacked memory cells, having horizontally oriented access devices and vertically oriented access lines, such as illustrated in FIGS. 1-3, and in accordance with a number of embodiments of the present disclosure. FIG. 7A illustrates a top down view of a semiconductor structure, at a particular point in time, in a semiconductor fabrication process, according to one or more embodiments. In the example embodiment of FIG. 7A, the method comprises using a photolithographic process to pattern the photolithographic mask 736, 636 in FIG. 6B. The method in FIG. 7A, further includes depositing the first conductive material, 740-1, 740-2, . . . , 740-N, 740-(N+1), . . . , 740-(Z−1), and 740-Z, on a gate dielectric material in a portion of the vertical openings to form a plurality of separate, vertical access lines along first sidewalls of the elongated vertical, pillar columns. The plurality of vertical access lines, e.g., 103 of FIG. 1A, can be electrically coupled to the first conductive material, 740-1, 740-2, . . . , 740-N, 740-(N+1), . . . , 740-(Z−1), and 740-Z. That is, an isotropic etchant process can remove portions of the exposed first conductive material, 740-1, 740-2, . . . , 740-N, 740-(N+1), . . . , 740-(Z−1), and 740-Z, to separate and individually form the plurality of separate, vertical access lines, access lines 103-1, 103-2, . . . , 103-Q in FIG. 1, et. seq. Hence the plurality of separate, vertical access lines are shown along the sidewalls of the elongated vertical, pillar columns, e.g., along sidewalls of the elongated vertical, pillar columns 642-1, 642-2, and 642-3 in the cross-sectional view of FIG. 6B.

As shown in the example of FIG. 7A, the exposed first conductive material, 740-1, 740-2, . . . , 740-N, 740-(N+1), . . . , 740-(Z−1), and 740-Z, may be removed back to the gate dielectric material 738 in the second vertical openings, e.g., 688 in FIG. 6A, using a suitable selective, isotropic etch process. As shown in FIG. 7A, a subsequent dielectric material 741, such as an oxide or other suitable spin on dielectric (SOD), may then be deposited to fill the remaining openings from where the exposed first conductive material, 740-1, 740-2, . . . , 740-N, 740-(N+1), . . . , 740-(Z−1), and 740-Z, was removed using a process such as CVD, or other suitable technique. The dielectric material 741 may be planarized to a top surface of the previous hard mask 735 of the vertical semiconductor stack, e.g., 401 as shown in FIG. 4, using a process such as CMP, or other suitable technique. In some embodiments, the dielectric material 741 can be deposited around the support pillars 737. The support pillars 737 can provide stabilizing support to pillars formed in the vertical stack. For example, the support pillars can provide support and prevent wobbling and/or bucking of pillar columns 742-1, 742-2, and 742-N.

In some embodiments, a subsequent photolithographic material 736, e.g., hard mask, may be deposited using CVD and planarized using CMP to cover and close the plurality of separate, vertical access lines, 740-1, 740-2, . . . , 740-N, 740-(N+1), . . . , 740-(Z−1), and 740-Z, over a working surface of the vertical semiconductor stack, 401 in FIG. 4, leaving the plurality of separate, vertical access lines, 740-1, 740-2, . . . , 740-N, 740-(N+1), . . . , 740-(Z−1), and 740-Z, protected along the sidewalls of the elongated vertical, pillar columns. Embodiments, however, are not limited to these process examples.

FIG. 7B illustrates a cross sectional view, taken along cut-line A-A' in FIG. 7A, showing another view of the semiconductor structure at this particular point in one example semiconductor fabrication process of an embodiment of the present disclosure. The cross sectional view shown in FIG. 7B is away from the plurality of separate, vertical access lines, 740-1, 740-2, . . . , 740-N, 740-(N+1), 740-(Z−1), and shows the repeating iterations of alternating layers of a dielectric material, 730-1, 730-2, . . . , 730-N, and a sacrificial semiconductor material, 732-1, 732-2, . . . , 732-N, on a semiconductor substrate 400 to form the vertical stack, e.g. 401 as shown in FIG. 4. As shown in FIG. 7B, a vertical direction 711 is illustrated as a third direction (D3), e.g., z-direction in an x-y-z coordinate system, analogous to the third direction (D3) 711, among first, second and third directions, shown in FIGS. 1-3. The plane of the drawing sheet, extending right and left, is in a first direction (D1) 709. In the example embodiment of FIG. 7A, the dielectric material 741 is shown filling the vertical openings on the residual gate dielectric 738 deposition around a support pillar 737. The hard mask 736, described above, caps the illustrated structure.

FIG. 7C illustrates a cross sectional view, taken along cut-line B-B' in FIG. 7A, showing another view of the semiconductor structure at this particular point in one example semiconductor fabrication process of an embodiment of the present disclosure. The cross sectional view shown in FIG. 7C is illustrated extending in the second direction (D2) 705 along an axis of the repeating iterations of alternating layers of a dielectric material, 730-1, 730-2, . . . , 730-N, and a sacrificial semiconductor material, 732-1, 732-2, . . . , 732-N, along and in which the horizontally oriented access devices and horizontally oriented storage nodes, e.g., capacitor cells, can be formed within the layers of sacrificial semiconductor material, 732-1, 732-2, . . . , 732-N. In FIG. 7C, a neighboring, opposing vertical access line 740-3 is illustrated by a dashed line indicating a location set in from the plane and orientation of the drawing sheet.

FIG. 7D illustrates a cross sectional view, taken along cut-line C-C' in FIG. 7A, showing another view of the semiconductor structure at this particular point in one example semiconductor fabrication process of an embodiment of the present disclosure. The cross sectional view shown in FIG. 7D is illustrated extending in the second direction (D2) 705 along an axis of the repeating iterations of alternating layers of a dielectric material, 730-1, 730-2, . . . , 730-N, and a sacrificial semiconductor material, 732-1, 732-2, . . . , 732-N, outside of a region in which the horizontally oriented access devices and horizontally oriented storage nodes, e.g., capacitor cells, will be formed within the layers of sacrificial semiconductor material, 732-1, 732-2, . . . , 732-N. In FIG. 7C, the dielectric material 741 is shown filling the space between the horizontally oriented access devices and horizontally oriented storage nodes, which can be spaced along a first direction (D1), extending into and out from the plane of the drawings sheet, for a three dimensional array of vertically oriented memory cells. At the left end of the drawing sheet is shown the repeating iterations of alternating layers of a dielectric material, 730-1, 730-2, . . . , 730-(N+1), and a sacrificial semiconductor material, 732-1, 732-2, . . . , 732-N, at which location a horizontally oriented digit line, e.g., digit lines 107-1, 107-2, . . . , 107-P shown in FIG. 1, et. seq., can be integrated to form electrical contact with the second source/drain, described in more detail below.

As shown in FIG. 7D, the dielectric material 741 may be deposited around the gate dielectric 738 and the support pillar 737. In some embodiments, the support pillar 737 may allow for pillar columns 742-1, 742-2, and 742-N with an increased height to be formed, as compared to pillar columns formed without a support pillar 737. That is, the support pillars 737 can mitigate wobbling and/or buckling of the pillar columns 742-1, 742-2, and 742-N. Increasing the height of the pillar columns 742-1, 742-2, and 742-N can result in a capacitor cells with an increased area, as compared to capacitor cells formed with pillar columns 742-1, 742-2, and 742-N with reduced heights. In some embodiments, increasing the height of the pillar columns 742-1, 742-2, and 742-N can reduce the size of the vertical stack, as compared to vertical stacks with reduced pillar columns heights.

FIG. 7E illustrates a cross sectional view, taken along cut-line D-D' in FIG. 7A, showing another view of the semiconductor structure at this particular point in one example semiconductor fabrication process of an embodiment of the present disclosure. The cross sectional view shown in FIG. 7E is illustrated, right to left in the plane of the drawing sheet, extending in the first direction (D1) 709 along an axis of the repeating iterations of alternating layers of a dielectric material, 730-1, 730-2, . . . , 730-N, and a sacrificial semiconductor material, 732-1, 732-2, . . . , 732-N, intersecting across the plurality of separate, vertical access lines, 740-1, 740-2, . . . , 740-N, 740-(N+1), . . . , 740-(Z−1), and intersecting regions of the sacrificial semiconductor material, 732-1, 732-2, . . . , 732-N, in which a channel region may be formed, separated from the plurality of separate, vertical access lines, 740-1, 740-2, . . . , 740-N, 740-(N+1), . . . , 740-(Z−1), by the gate dielectric 738. In FIG. 7E, the first dielectric fill material 739 is shown separating the space between neighboring horizontally oriented access devices and horizontally oriented storage nodes, which may be formed extending into and out from the plane of the drawing sheet as described in more detail below, and can be spaced along a first direction (D1) 709 and stacked vertically in arrays extending in the third direction (D3) 711 in the three dimensional (3D) memory.

Figure 8A:
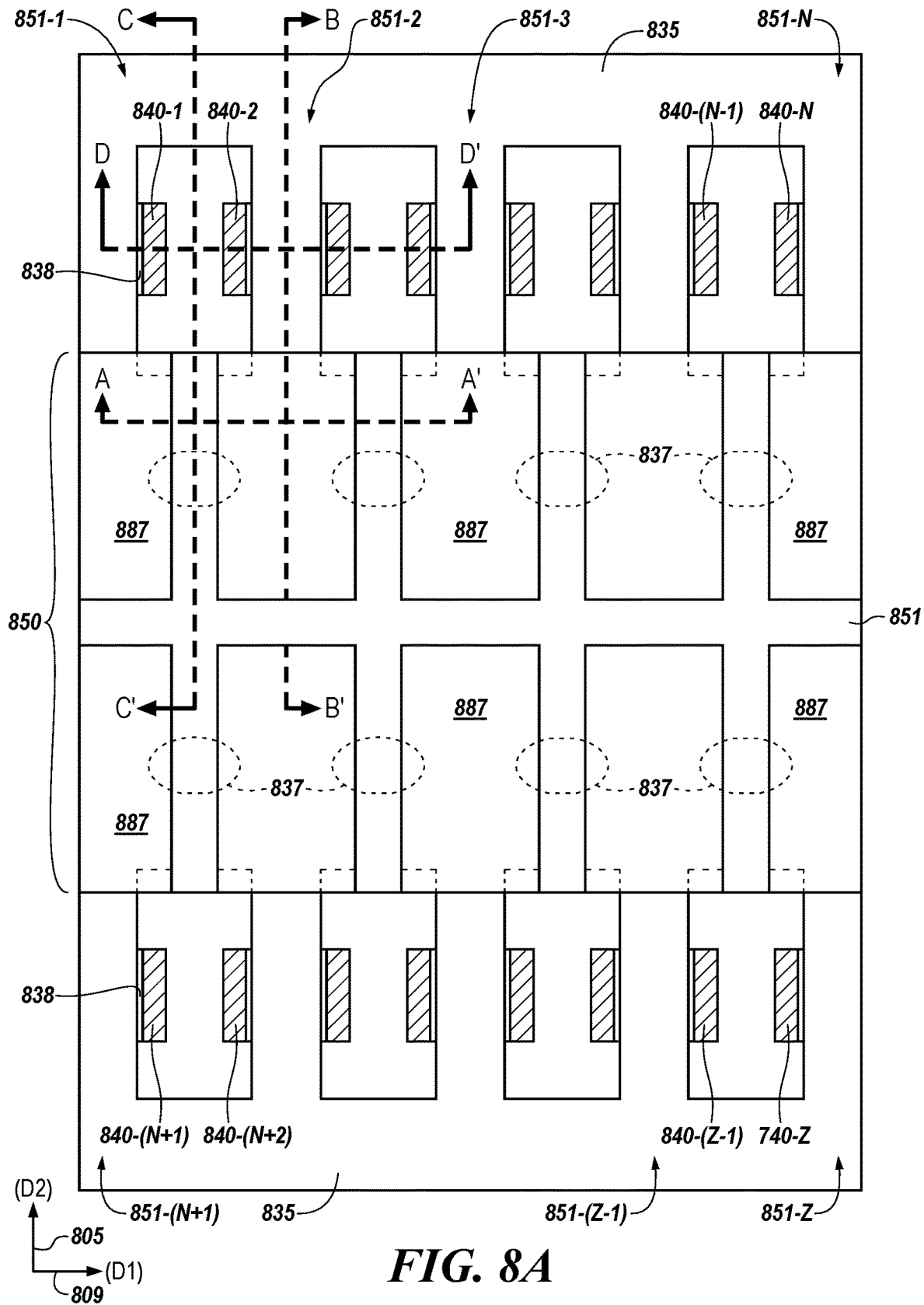

FIG. 8A illustrates an example method, at another stage of a semiconductor fabrication process, for forming arrays of vertically stacked memory cells, having horizontally oriented access devices and vertically oriented access lines, such as illustrated in FIGS. 1-3, and in accordance with a number of embodiments of the present disclosure. FIG. 8A illustrates a top down view of a semiconductor structure, at a particular point in time, in a semiconductor fabrication process, according to one or more embodiments. In the example embodiment of FIG. 8A, the method comprises using a photolithographic process to pattern the photolithographic masks 835, 836 and/or 787, e.g., 735, 736, and/or 787 in FIGS. 7A-7E. The method in FIG. 8A, further illustrates using one or more etchant processes to form a fourth vertical opening 851 in a storage node region 850 through the vertical stack and extending predominantly in the first horizontal direction (D1) 809. The one or more etchant processes forms a fourth vertical opening 851 to expose third sidewalls in the repeating iterations of alternating layers of a dielectric material, 830-1, 830-2, . . . , 830-N, and a sacrificial semiconductor material, 832-1, 832-2, . . . , 832-N, in the vertical stack, shown in FIGS. 8B-8E, adjacent a second region of the sacrificial semiconductor material. For example, in some embodiments, a second portion of the sacrificial semiconductor material, 832-1, 832-2, . . . , 832-N can be selectively etched a second distance (D2) back from the fourth vertical openings 851 to form storage nodes. In some embodiments, the storage node can be formed before forming the first source/drain region, the channel region, and the second source/drain region. A fourth vertical opening 851 can be formed through the vertical stack extending predominantly in the first direction to expose third sidewalls in the sacrificial semiconductor material, 832-1, 832-2, . . . , 832-N adjacent areas where storage nodes will be formed. Other numerated components may be analogous to those shown and discussed in connection with FIG. 7.

According to embodiments, a second region of the sacrificial semiconductor material, 832-1, 832-2, . . . , 832-N, may be removed from the repeating iterations of alternating layers of a dielectric material, 830-1, 830-2, . . . , 830-N, and a sacrificial semiconductor material, 832-1, 832-2, . . . , 832-N, in the vertical stack to form a storage node. In some embodiments, this process is performed before selectively removing an access device region, e.g., transistor region, of the sacrificial semiconductor material in which to form a first source/drain region, channel region, and second source/drain region of the horizontally oriented access devices. In other embodiments, this process is performed after selectively removing an access device region of the sacrificial semiconductor material in which to form a first source/drain region, channel region, and second source/drain region of the horizontally oriented access devices. In some embodiments, support pillars 837 formed in the vertical opening can provide support to pillars columns formed in the vertical stack. In addition to the support pillars 837 providing support to the pillar columns, the support pillars 837 can also provide support to the horizontally oriented access devices.

According to an example embodiment, shown in FIGS. 8B-8E, the method comprises selectively etching the second region of the sacrificial semiconductor material, 832-1, 832-2, . . . , 832-N, to form a second horizontal opening a second horizontal distance back from a fourth vertical opening 851 in the vertical stack. In some embodiments, the support pillars 837 can be used as an etch stop when selectively etching to form the second horizontal openings. In some embodiments, as shown in FIGS. 8B-8E, the method comprises forming capacitor cell as the storage node in the second horizontal opening. Hence, the support pillars 837 can act as an etch stop during the formation of the capacitor cell. By way of example, and not by way of limitation, forming the capacitor comprises using an atomic layer deposition (ALD) process to sequentially deposit, in the second horizontal opening, a first electrode 861 and a second electrode 856 separated by a cell dielectric 863. Other suitable semiconductor fabrication techniques and/or storage nodes structures may be used.

FIG. 8B illustrates a cross sectional view, taken along cut-line A-A' in FIG. 8A, showing another view of the semiconductor structure at this particular point in one example semiconductor fabrication process of an embodiment of the present disclosure. The cross sectional view shown in FIG. 8B is away from the plurality of separate, vertical access lines, 840-1, 840-2, . . . , 840-N, 840-(N+1), . . . , 840-(Z−1), and shows repeating iterations of alternating layers of a dielectric material, 830-1, 830-2, . . . , 830-(N+1), separated by horizontally oriented capacitor cells having first electrodes 861, e.g., bottom cell contact electrodes, cell dielectrics 863, and second electrodes 856, e.g., top, common node electrodes, on a semiconductor substrate 800 to form the vertical stack. As shown in FIG. 8B, a vertical direction 811 is illustrated as a third direction (D3), e.g., z-direction in an x-y-z coordinate system, analogous to the third direction (D3) 811, among first, second and third directions, shown in FIGS. 1-3. The plane of the drawing sheet, extending right and left, is in a first direction (D1) 809. In the example embodiment of FIG. 8B, the first electrodes 861, e.g., bottom electrodes to be coupled to source/drain regions of horizontal access devices, and second electrodes 856 are illustrated separated by a cell dielectric material 863 extending into and out of the plane of the drawing sheet in second direction (D2) and along an axis of orientation of the horizontal access devices and horizontal storage nodes of the arrays of vertically stacked memory cells of the three-dimensional (3D) memory.

FIG. 8C illustrates a cross sectional view, taken along cut-line B-B' in FIG. 8A, showing another view of the semiconductor structure at this particular point in one example semiconductor fabrication process of an embodiment of the present disclosure. The cross sectional view shown in FIG. 8C is illustrated extending in the second direction (D2) 805, left and right along the plane of the drawing sheet, along an axis of the repeating iterations of alternating layers of a dielectric material, 830-1, 830-2, . . . , 830-(N+1), and a sacrificial semiconductor material, 832-1, 832-2, . . . , 832-N, along and in which the horizontally oriented access devices and horizontally oriented storage nodes, e.g., capacitor cells, can be formed within the layers of sacrificial semiconductor material, 832-1, 832-2, . . . , 832-N. In the example embodiment of FIG. 8C, the horizontally oriented storage nodes, e.g., capacitor cells, are illustrated as having been formed been formed in this semiconductor fabrication process and first electrodes 861, e.g., bottom electrodes to be coupled to source/drain regions of horizontal access devices, and second electrodes 856, e.g., top electrodes to be coupled to a common electrode plane such as a ground plane, separated by cell dielectrics 863, are shown. However, embodiments are not limited to this example. In other embodiments the first electrodes 861, e.g., bottom electrodes to be coupled to source/drain regions of horizontal access devices, and second electrodes 856, e.g., top electrodes to be coupled to a common electrode plane such as a ground plane, separated by cell dielectrics 863, may be formed subsequent to forming a first source/drain region, a channel region, and a second source/drain region in a region of the sacrificial semiconductor material, 832-1, 832-2, . . . , 832-N, intended for location, e.g., placement formation, of the horizontally oriented access devices, described next.

In the example embodiment of FIG. 8C, the horizontally oriented storage nodes having the first electrodes 861, e.g., bottom electrodes to be coupled to source/drain regions of horizontal access devices, and second electrodes 856, e.g., top electrodes to be coupled to a common electrode plane such as a ground plane, are shown formed in a second horizontal opening extending in second direction (D2), left and right in the plane of the drawing sheet, a second distance for the vertical opening formed in the vertical stack and along an axis of orientation of the horizontal access devices and horizontal storage nodes of the arrays of vertically stacked memory cells of the three-dimensional (3D) memory. In FIG. 8C, a neighboring, opposing vertical access line 840-3 is illustrated by a dashed line indicating a location set inward from the plane and orientation of the drawing sheet.

FIG. 8D illustrates a cross sectional view, taken along cut-line C-C' in FIG. 8A, showing another view of the semiconductor structure at this particular point in one example semiconductor fabrication process of an embodiment of the present disclosure. The cross sectional view shown in FIG. 8D is illustrated extending in the second direction (D2) 805, left and right in the plane of the drawing sheet, along an axis of the repeating iterations of alternating layers of a dielectric material, 830-1, 830-2, . . . , 830-N, 830-(N+1) and a sacrificial semiconductor material, 832-1, 832-2, . . . , 832-N, outside of a region in which the horizontally oriented access devices and horizontally oriented storage nodes, e.g., capacitor cells, will be formed within the layers of sacrificial semiconductor material, 832-1, 832-2, . . . , 832-N. In FIG. 8C, the dielectric material 841 is shown filling the space between the horizontally oriented access devices, which can be spaced along a first direction (D1), extending into and out from the plane of the drawings sheet, for a three-dimensional array of vertically oriented memory cells.

However, in the cross sectional view of FIG. 8D, the second electrode 856, e.g., top, common electrode to the a capacitor cell structure, is additionally shown present in the space between horizontally neighboring devices. At the left end of the drawing sheet is shown the repeating iterations of alternating layers of a dielectric material, 830-1, 830-2, . . . , 830-(N+1), and a sacrificial semiconductor material, 832-1, 832-2, . . . , 832-N, at which location a horizontally oriented digit line, e.g., digit lines 107-1, 107-2, . . . , 107-P shown in FIG. 1, et. seq., can be integrated to form electrical contact with the second source/drain regions, described in more detail below.

FIG. 8E illustrates a cross sectional view, taken along cut-line D-D' in FIG. 8A, showing another view of the semiconductor structure at this particular point in one example semiconductor fabrication process of an embodiment of the present disclosure. The cross sectional view shown in FIG. 8E is illustrated, right to left in the plane of the drawing sheet, extending in the first direction (D1) 809 along an axis of the repeating iterations of alternating layers of a dielectric material, 830-1, 830-2, . . . , 830-(N+1), and a sacrificial semiconductor material, 832-1, 832-2, . . . , 832-N, intersecting across the plurality of separate, vertical access lines, 840-1, 840-2, . . . , 840-4, and intersecting regions of the sacrificial semiconductor material, 832-1, 832-2, . . . , 832-N, in which a channel region may be formed, separated from the plurality of separate, vertical access lines, 840-1, 840-2, . . . , 840-4, by the gate dielectric 838. In FIG. 8E, the first dielectric fill material 839 is shown separating the space between neighboring horizontally oriented access devices and horizontally oriented storage nodes, which may be formed extending into and out from the plane of the drawing sheet as described in more detail below, and can be spaced along a first direction (D1) 809 and stacked vertically in arrays extending in the third direction (D3) 811 in the three-dimensional (3D) memory.

Figure 9A:
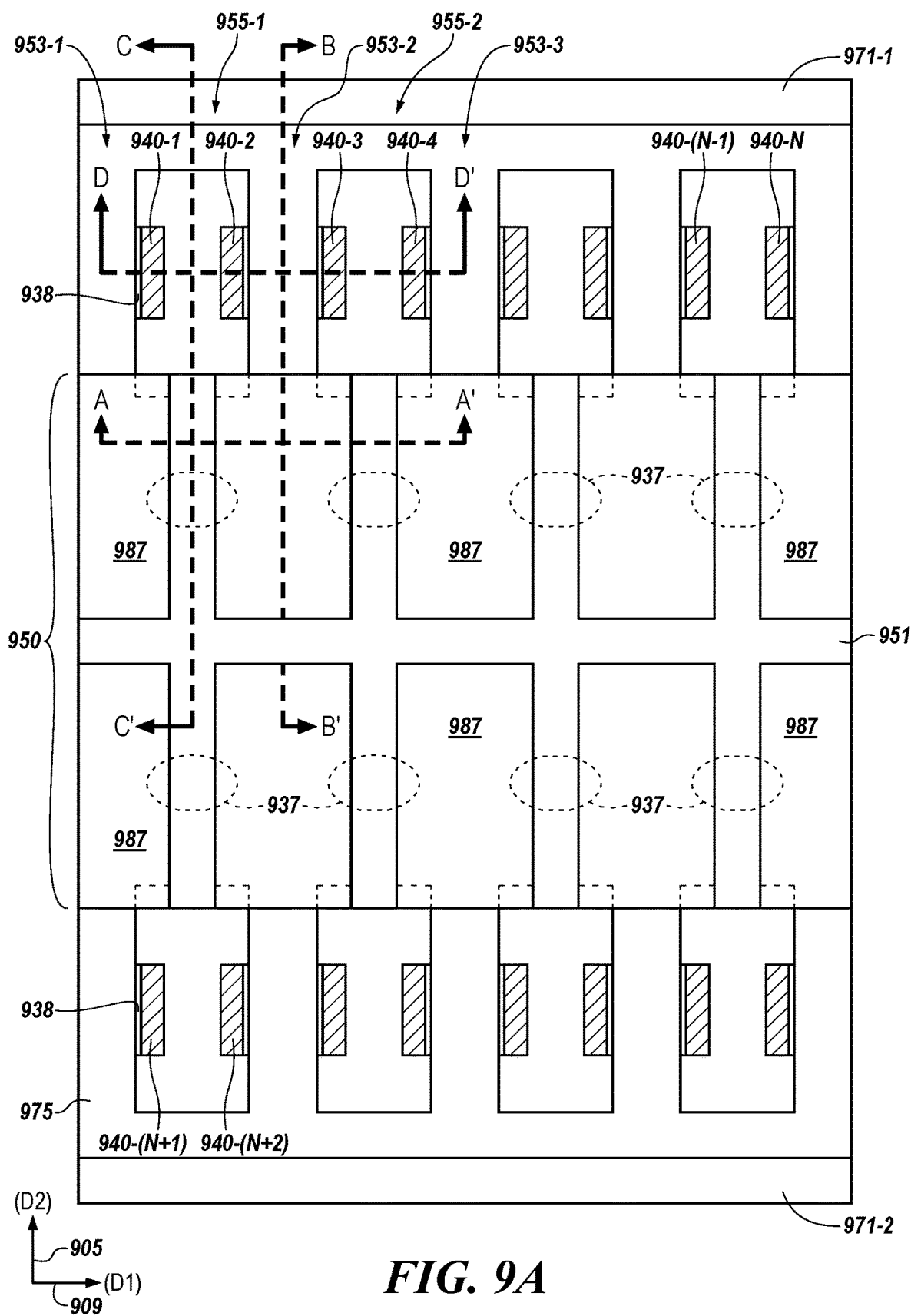

FIG. 9A illustrates an example method, at another stage of a semiconductor fabrication process, for forming arrays of vertically stacked memory cells, having horizontally oriented access devices and vertically oriented access lines, such as illustrated in FIGS. 1-3, and in accordance with a number of embodiments of the present disclosure. FIG. 9A illustrates a top down view of a semiconductor structure, at a particular point in time, in a semiconductor fabrication process, according to one or more embodiments. In the example embodiment of FIG. 9A, the method comprises using a photolithographic process to pattern the photolithographic masks 935, 936 and/or 987, etc. as described in FIGS. 7 and 8.

The method in FIG. 9A, further illustrates using one or more etchant processes to form a vertical opening, 971-1 and 971-2, in access device regions for replacement channel and source/drain transistor regions, through the vertical stack. The vertical openings 971-1 and 971-2 are illustrated extending predominantly in the first horizontal direction (D1) 909. The one or more etchant processes forms a vertical openings, 971-1 and 971-2, to expose third sidewalls in the repeating iterations of alternating layers of a dielectric material, 930-1, 930-2, . . . , 930-(N+1), and a sacrificial semiconductor material, 932-1, 932-2, . . . , 932-N, in the vertical stack, shown in FIGS. 9B-9E, adjacent a first region of the sacrificial semiconductor material. Other numerated components may be analogous to those shown and discussed in connection with FIGS. 7 and 8.

According to embodiments, an access device region, e.g., transistor region, of the sacrificial semiconductor material, 932-1, 932-2, . . . , 932-N, may be removed from the repeating iterations of alternating layers of a dielectric material, 930-1, 930-2, . . . , 930-(N+1), and a sacrificial semiconductor material, 932-1, 932-2, . . . , 932-N, in the vertical stack to form an access device, e.g., transistor. In some embodiments, this process is performed before selectively removing a storage node region of the sacrificial semiconductor material in which to form a capacitor cell. In other embodiments, this process is performed after selectively removing a storage node region of the sacrificial semiconductor material in which to form a capacitor cell. According to an example embodiment, shown in FIGS. 9B-9E, the method comprises selectively etching the access device region of the sacrificial semiconductor material, 932-1, 932-2, . . . , 932-N, to form a first horizontal opening a first horizontal distance back from a vertical openings, 971-1 and 971-2 in the vertical stack. In some embodiments, as shown in FIGS. 9B-9E, the method comprises forming a transistor having a first source/drain region, channel region, and second source/drain region as the access device in the first horizontal opening. By way of example, and not by way of limitation, forming the first source/drain region, the channel region, and the second source/drain region comprises using an atomic layer deposition (ALD) process to sequentially deposit, in the first horizontal opening, the first source/drain region, the channel region, and the second source/drain region. In some embodiments, ALD may be used to deposit an oxide semiconductor as the channel region in the first horizontal opening. Other suitable semiconductor fabrication techniques and/or storage nodes structures may be used. In some embodiments, support pillars 937 formed in the vertical opening may remain in the vertical opening to provide support to pillars columns formed in the vertical stack.

FIG. 9B illustrates a cross sectional view, taken along cut-line A-A' in FIG. 9A, showing another view of the semiconductor structure at this particular point in one example semiconductor fabrication process of an embodiment of the present disclosure. The cross sectional view shown in FIG. 9B is away from the plurality of separate, vertical access lines, 940-1, 940-2, . . . , 940-N, 940-(N+1), . . . , 940-(Z−1), and shows repeating iterations of alternating layers of a dielectric material, 930-1, 930-2, . . . , 930-(N+1), separated by capacitor cells having first electrodes 961, e.g., bottom cell contact electrodes, cell dielectrics 963, and second electrodes 956, e.g., top, common node electrode, on a semiconductor substrate 900 to form the vertical stack. As shown in FIG. 9B, a vertical direction 911 is illustrated as a third direction (D3), e.g., z-direction in an x-y-z coordinate system, analogous to the third direction (D3) 111, among first, second and third directions, shown in FIGS. 1-3. The plane of the drawing sheet, extending right and left, is in a first direction (D1) 909. In the example embodiment of FIG. 9B, the first electrodes 961, e.g., bottom electrodes to be coupled to source/drain regions of horizontal access devices, and second electrodes 956 are illustrated separated by a cell dielectric material 963 extending into and out of the plane of the drawing sheet in second direction (D2) and along an axis of orientation of the horizontal access devices and horizontal storage nodes of the arrays of vertically stacked memory cells of the three-dimensional (3D) memory.

FIG. 9C illustrates a cross sectional view, taken along cut-line B-B' in FIG. 9A, showing another view of the semiconductor structure at this particular point in one example semiconductor fabrication process of an embodiment of the present disclosure. The cross sectional view shown in FIG. 9C is illustrated extending in the second direction (D2) 905, left and right along the plane of the drawing sheet, along an axis of the repeating iterations of alternating layers of a dielectric material, 930-1, 930-2, . . . , 930-(N+1). However, now is shown that the sacrificial semiconductor material has been removed in an access device region 942 of the alternating layers of the vertical stack to form horizontal openings, 933-1, 933-2, . . . , 933-N, in which the horizontally oriented access devices having a first source/drain region, channel region, and second source/drain region can be formed between the vertical alternating layers of a dielectric material, 930-1, 930-2, . . . , 930-(N+1). In the example embodiment of FIG. 9C, the horizontally oriented storage nodes, e.g., capacitor cells, are illustrated as having been formed been formed in this semiconductor fabrication process in the storage node region 944 and first electrodes 961, e.g., bottom electrodes to be coupled to source/drain regions of horizontal access devices, and second electrodes 956, e.g., top electrodes to be coupled to a common electrode plane such as a ground plane, separated by a cell dielectric 963, are shown. However, embodiments are not limited to this example. In other embodiments the first electrodes 961, e.g., bottom electrodes to be coupled to source/drain regions of horizontal access devices, and second electrodes 956, e.g., top electrodes to be coupled to a common electrode plane such as a ground plane, separated by cell dielectrics 963, may be formed subsequent to forming a first source/drain region, a channel region, and a second source/drain region in a region of the sacrificial semiconductor material, 932-1, 932-2, . . . , 932-N.

In the example embodiment of FIG. 9C, the horizontally openings 930-1, 930-2, . . . , 930-N, in which to form the access devices having a first source/drain region, channel region, and second source/drain region, are shown extending in second direction 905 (D2), left and right in the plane of the drawing sheet, a distance from the vertical openings 971-1 and 971-2 formed in the vertical stack and along an axis of orientation of the horizontal access devices and horizontal storage nodes of the arrays of vertically stacked memory cells of the three-dimensional (3D) memory. In FIG. 9C, a neighboring, opposing vertical access line 940-3 is illustrated by a dashed line indicating a location set inward from the plane and orientation of the drawing sheet.

FIG. 9D illustrates a cross sectional view, taken along cut-line C-C' in FIG. 9A, showing another view of the semiconductor structure at this particular point in one example semiconductor fabrication process of an embodiment of the present disclosure. The cross sectional view shown in FIG. 9D is illustrated extending in the second direction (D2) 905, left and right in the plane of the drawing sheet, along an axis of the repeating iterations of alternating layers of a dielectric material, 930-1, 930-2, . . . , 930-N, 930-(N+1) and horizontal openings 933-1, 933-2, . . . , 933-N, outside of a region in which the horizontally oriented access devices and horizontally oriented storage nodes, e.g., capacitor cells, will be formed. In FIG. 9D, the dielectric material 941 is shown filling the space between the horizontally oriented access devices, which can be spaced along a first direction (D1), extending into and out from the plane of the drawings sheet, for a three-dimensional array of vertically oriented memory cells. However, in the cross sectional view of FIG. 9D, the second electrode 956, e.g., top, common electrode to the a capacitor cell structure, is additionally shown present in the space between horizontally neighboring devices. At the left end of the drawing sheet is shown the repeating iterations of alternating layers of a dielectric material, 930-1, 930-2, . . . , 930-(N+1), and horizontal openings, 933-1, 933-2, . . . , 933-N, at which location a horizontally oriented digit line, e.g., digit lines 107-1, 107-2, . . . , 107-P shown in FIG. 1, et. seq., can be integrated to form electrical contact with the second source/drain regions, of the formed horizontal access devices.

FIG. 9E illustrates a cross sectional view, taken along cut-line D-D' in FIG. 9A, showing another view of the semiconductor structure at this particular point in one example semiconductor fabrication process of an embodiment of the present disclosure. The cross sectional view shown in FIG. 9E is illustrated, right to left in the plane of the drawing sheet, extending in the first direction (D1) 909 along an axis of the repeating iterations of alternating layers of a dielectric material, 930-1, 930-2, . . . , 930-(N+1), and horizontal openings, 933-1, 933-2, . . . , 933-N, in which channel regions will be formed separated from the plurality of separate, vertical access lines, 940-1, 940-2, . . . , 940-4, by the gate dielectric 938. In FIG. 9E, the first dielectric fill material 939 is shown separating the space between neighboring horizontally oriented access devices and horizontally oriented storage nodes, which may be formed extending into and out from the plane of the drawing sheet as described in more detail below, and can be spaced along a first direction (D1) 909 and stacked vertically in arrays extending in the third direction (D3) 911 in the three-dimensional (3D) memory.

Figure 10A:
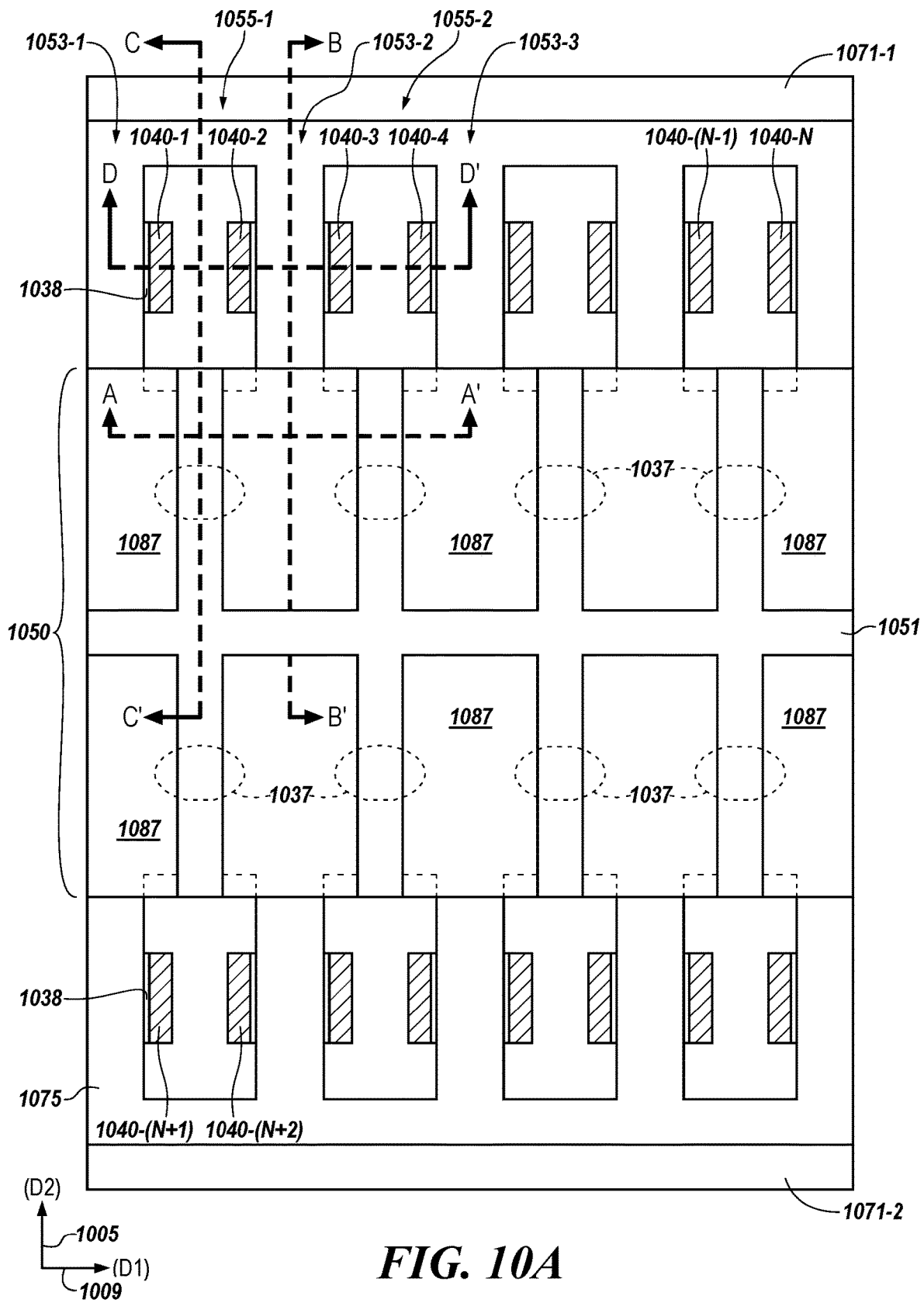

FIG. 10A illustrates an example method, at another stage of a semiconductor fabrication process, for forming arrays of vertically stacked memory cells, having horizontally oriented access devices and vertically oriented access lines, such as illustrated in FIGS. 1-3, and in accordance with a number of embodiments of the present disclosure. FIG. 10A illustrates a top down view of a semiconductor structure, at a particular point in time, in a semiconductor fabrication process, according to one or more embodiments. In the example embodiment of FIG. 10A, the vertical openings 1071-1 and 1071-2 remain present from FIG. 9A-9E. However, in FIGS. 10A-10E, horizontal access devices, 1098-1, 1098-2, . . . , 1098-N, having first source/drain regions, channel regions, and second source/drain regions, shown respectively as 1098-1A, 1098-1B, and 1098-1C, in FIG. 10C, have been formed in the horizontal openings, 933-1, 933-2, . . . , 933-N shown in FIGS. 9C and 9D. The horizontal access devices, 1098-1, 1098-2, 1098-N, are formed extending in the second direction 1005 (D2) in the horizontal access device regions 1042 of the vertical stack. In some embodiments, support pillars 1037 formed in the first vertical opening may remain in the first vertical opening to provide support to pillars columns formed in the vertical stack and the horizontally access devices 1098-1, 1098-2, 1098-N. Additionally, horizontal digit lines, 1099-1, 1099-2, 1099-N, have been formed and integrated in contact with the second source/drain regions, e.g., 1098-1C, as shown in FIGS. 10C and 10D. In some embodiments, a plurality of separate horizontal digit lines, 1099-1, 1099-2, 1099-N, can be electrically coupled to the second source/drain regions, e.g., 1098-1C. Other numerated components may be analogous to those shown and discussed in connection with FIGS. 7, 8, and 9.

According to embodiments, in the access device region 1042, e.g., transistor region, the sacrificial semiconductor material, 932-1, 932-2, . . . , 932-N, in FIGS. 9A-9E, has been removed to leave the repeating iterations of alternating layers of a dielectric material, 930-1, 930-2, . . . , 930-(N+1), and horizontal openings, 933-1, 933-2, . . . , 933-N, in the vertical stack of FIG. 9 to form an access device, e.g., transistor. In some embodiments, this process is performed before selectively removing a storage node region 1044 of the sacrificial semiconductor material in which to form a capacitor cell. In other embodiments, this process is performed after selectively removing a storage node region 1044 of the sacrificial semiconductor material in which to form a capacitor cell. According to an example embodiment, shown in FIGS. 10B-10E, the method comprises selectively depositing, using an atomic layer deposition (ALD) process, or other suitable deposition technique, a first source/drain region 1038-1A, channel region 1038-1B, and second source/drain region 1038-1C in each of the horizontal openings, 933-1, 933-2, . . . , 933-N, in FIGS. 9A-9E. By way of example, and not by way of limitation, forming the first source/drain region, the channel region, and the second source/drain region comprises using an atomic layer deposition (ALD) process to sequentially deposit, in the first horizontal opening, the first source/drain region, the channel region, and the second source/drain region according to a process and techniques described in U.S. patent application Ser. Nos. 16/986,466, 16/986,510, and 16/986,610, which are incorporated by reference. Other suitable semiconductor fabrication techniques and/or storage nodes structures may be used.

FIG. 10B illustrates a cross sectional view, taken along cut-line A-A' in FIG. 10A, showing another view of the semiconductor structure at this particular point in one example semiconductor fabrication process of an embodiment of the present disclosure. The cross sectional view shown in FIG. 10B is away from the plurality of separate, vertical access lines, 1040-1, 1040-2, . . . , 1040-N, 1040-

(N+1), . . . , 1040-(Z–1), and shows repeating iterations of alternating layers of a dielectric material, 1030-1, 1030-2, . . . , 1030-(N+1), separated by capacitor cells having first electrodes 1061, e.g., bottom cell contact electrodes, cell dielectrics 1063, and second electrodes 1056, e.g., top, common node electrode, on a semiconductor substrate 1000 to form the vertical stack. As shown in FIG. 10B, a vertical direction 1011 is illustrated as a third direction (D3), e.g., z-direction in an x-y-z coordinate system, analogous to the third direction (D3) 111, among first, second and third directions, shown in FIGS. 1-3. The plane of the drawing sheet, extending right and left, is in a first direction (D1) 1009. In the example embodiment of FIG. 10B, the first electrodes 1061, e.g., bottom electrodes to be coupled to source/drain regions of horizontal access devices, and second electrodes 1056 are illustrated separated by a cell dielectric material 1063 extending into and out of the plane of the drawing sheet in second direction (D2) and along an axis of orientation of the horizontal access devices and horizontal storage nodes of the arrays of vertically stacked memory cells of the three-dimensional (3D) memory.

FIG. 10C illustrates a cross sectional view, taken along cut-line B-B' in FIG. 10A, showing another view of the semiconductor structure at this particular point in one example semiconductor fabrication process of an embodiment of the present disclosure. The cross sectional view shown in FIG. 10C is illustrated extending in the second direction (D2) 1005, left and right along the plane of the drawing sheet, along an axis of the repeating iterations of alternating layers of a dielectric material, 1030-1, 1030-2, . . . , 1030-(N+1). However, now is shown that the first source/drain region material, channel region material, and second source/drain region material, 1098-1, 1098-2, . . . , 1098-N have been deposited in the horizontal openings, 933-1, 933-2, . . . , 933-N, in FIGS. 9A-9E, extending in the second direction 1005 (D2). As one example, a first source/drain region 1098-1, a channel region 1098-1B, and 1098-1C are illustrated distinctly. Further, horizontal digit line, 1099-1, 1099-2, . . . , 1099-N, integration is achieved in contact with the second source/drain regions, e.g., 1098-1C, extending in a first direction (D1), e.g., extending into and out from the plane of the drawing sheet in alternating layers vertically with the dielectric material, 1030-1, 1030-2, . . . , 1030-(N+1) in direction (D3) 1011.

Hence, three-node horizontal access devices, 1038-1, 1038-2, . . . , 1038-N, have been formed and integrated to vertical access lines, 1040-1, 1040-2, . . . , 1040-(Z+1) and integrated to digit lines, 1099-1, 1099-2, . . . , 1099-N, without body contacts. For example, the vertically oriented access lines 1040-1, 1040-2, . . . , 1040-(Z+1) oppose the channel regions (e.g., 1038-1B) and are by the gate dielectrics to form three-node access devices, without a body contact. Advantages to the structure and process described herein can include a lower off-current (Ioff) for the access devices, as compared to silicon based (Si-based) access devices. The channel region, e.g., 1038-1B, may be free from minority carriers for the access devices and thus removing the need to control a body potential to a body region of the access device, and/or reduced gate/drain induced leakage (GIDL) for the access devices. In some embodiments channel and/or source/drain region replacement fabrication steps may be performed after a capacitor cell formation process, thus reducing a thermal budget. The digit line integration may be more easily achieved in the fabrication process since a body contact to a body region of the access device is not used. Additionally, the embodiments described herein may achieve a better lateral scaling path than achieved with doped polysilicon based channel regions due to less channel length and lower source/drain semiconductor fabrication process formation overhead.

Again, the first source/drain region, the channel region, and the second source/drain region of the horizontal access devices, 1098-1, 1098-2, . . . , 1098-N, and the horizontal digit line, 1099-1, 1099-2, . . . , 1099-N, integration may be performed according to processes and techniques described in U.S. patent application Ser. No. 16/986,466 having a title "Channel Integration in a Three-Node Access Device for Vertical Three Dimensional (3D) Memory" and Application Ser. No. 16/986,510 having a title "Source/Drain Integration in a Three-Node Access Device for Vertical Three Dimensional (3D) Memory," which are both incorporated by reference. According to various embodiments, a further benefit is the avoidance, e.g., no use of, gas phase doping (GPD) in the formation of the source/drain regions. Other suitable semiconductor fabrication techniques and/or storage nodes structures may be used.

In the example embodiment of FIG. 10C, the horizontal access devices having a first source/drain region, channel region, and second source/drain region, 1098-1, 1098-2, . . . , 1089-N, are shown extending in second direction 1005 (D2), left and right in the plane of the drawing sheet, a distance from the vertical openings 1071-1 and 1071-2 formed in the vertical stack and along an axis of orientation of the horizontal access devices and horizontal storage nodes of the arrays of vertically stacked memory cells of the three-dimensional (3D) memory. As shown in FIG. 10, as dielectric material may be deposited to fill the vertical openings 1071-1 and 1071-3. In FIG. 10C, a neighboring, opposing vertical access line 1040-3 is illustrated by a dashed line indicating a location set inward from the plane and orientation of the drawing sheet.

FIG. 10D illustrates a cross sectional view, taken along cut-line C-C' in FIG. 10A, showing another view of the semiconductor structure at this particular point in one example semiconductor fabrication process of an embodiment of the present disclosure. The cross sectional view shown in FIG. 10D is illustrated extending in the second direction (D2) 1005, left and right in the plane of the drawing sheet, along an axis of the repeating iterations of alternating layers of a dielectric material, 1030-1, 1030-2, . . . , 1030-N, 1030-(N+1) and horizontal digit lines, 1099-1, 1099-2, . . . , 1099-N, extending into and out from the plane of the drawing sheet in a first direction (D1), outside of a region in which the horizontally oriented access devices, 1038-1, 1038-2, . . . , 1038-N, and horizontally oriented storage nodes, e.g., capacitor cells, in access device region 1042 and storage node region 1044 are formed. In FIG. 10D, the dielectric material 1041 is shown filling the space between the horizontally oriented access devices, which can be spaced along a first direction (D1), extending into and out from the plane of the drawings sheet, for a three-dimensional array of vertically oriented memory cells. However, in the cross sectional view of FIG. 10D, the second electrode 1056, e.g., top, common electrode to the a capacitor cell structure, is additionally shown present in the space between horizontally neighboring devices. At the left end of the drawing sheet is shown the repeating iterations of alternating layers of a dielectric material, 1030-1, 1030-2, . . . , 1030-(N+1), and horizontal digit lines, 1099-1, 1099-2, . . . , 1099-N, e.g., digit lines 107-1, 107-2, . . . , 107-P shown in FIG. 1, et. seq., integrated to form electrical contact with the second source/drain regions, e.g., 1038-1C, of the formed horizontal access devices.

FIG. 10E illustrates a cross sectional view, taken along cut-line D-D' in FIG. 10A, showing another view of the semiconductor structure at this particular point in one example semiconductor fabrication process of an embodiment of the present disclosure. The cross sectional view shown in FIG. 10E is illustrated, right to left in the plane of the drawing sheet, extending in the first direction (D1) 1009 along an axis of the repeating iterations of alternating layers of a dielectric material, 1030-1, 1030-2, . . . , 1030-(N+1), and channel regions of the horizontal access devices, 1098-1, 1098-2, . . . , 1098-N, separated from the plurality of separate, vertical access lines, 1040-1, 1040-2, . . . , 1040-4, by the gate dielectric 1038. In FIG. 10E, the first dielectric fill material 1039 is shown separating the space between neighboring horizontally oriented access devices and horizontally oriented storage nodes, which may be formed extending into and out from the plane of the drawing sheet as described in more detail below, and can be spaced along a first direction (D1) 1009 and stacked vertically in arrays extending in the third direction (D3) 1011 in the three-dimensional (3D) memory.

FIG. 11 illustrates a three-node horizontally oriented access device 1142 coupled to a horizontally oriented storage node 1144 for vertical three-dimensional (3D) memory, according to embodiments of the present disclosures. In FIG. 11, the three-node horizontally oriented access device 1142 is illustrated extending in a second direction (D2) 1105, left and right in the plane of the drawing sheet. The horizontally oriented access device 1142 is illustrated having a first source/drain region 1198-1A in electrical contact with a first electrode 1161, e.g., bottom electrode, of the horizontally oriented storage node 1144, e.g., capacitor cell. The storage node 1144 is further illustrated with a dielectric material 1163 separating the first electrode 1161 from a second electrode 1156, e.g., top, common node electrode of the capacitor cell.

A channel region 1198-1B is illustrated in electrical contact with the first source/drain region 1198-1A. A vertically oriented access line 1140-3 opposes the channel region 1198-1B and is separated therefrom by a gate dielectric. The vertically oriented access line 1140-2 is illustrated by dashed lines indicating that the vertically oriented access line is set into and/or out from the plane of the drawing sheet. The vertically oriented access line 1140 may extend longer and/or shorter than the channel region in the second direction (D2) 1105, e.g., having source/drain overlap and/or underlap, according to particular design rules.

A second source/drain region 1198-1C is illustrated in electrical contact with the channel region 1198-1B and in electrical contact with and integrated to a horizontally oriented digit line 1199 extending into and out from a plane of the drawing sheet. As shown in FIG. 11, the horizontally oriented access device 1142 and horizontally oriented storage node 1144 may be spaced horizontally from neighboring memory cells by an interlayer dielectric material 1180 along the second direction (D2) 1105 and may be spaced vertically from stacked, neighboring cells in a three-dimensional (3D) memory by dielectric layers 1130-1 and 1130-2.

Figure 12:
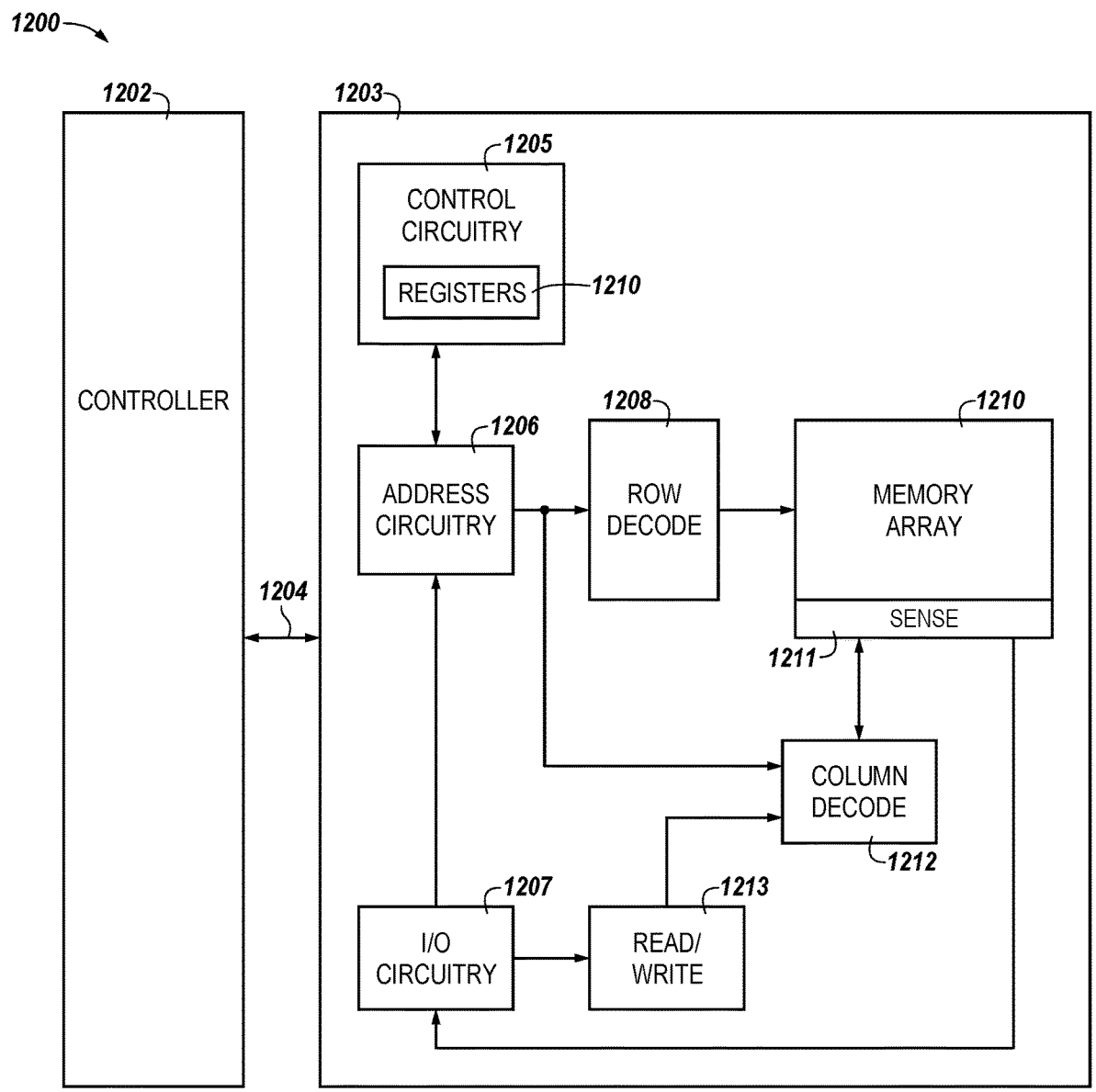
FIG. 12 is a block diagram of an apparatus in the form of a computing system including a memory device in accordance with a number of embodiments of the present disclosure.

FIG. 12 is a block diagram of an apparatus in the form of a computing system 1200 including a memory device 1203 in accordance with a number of embodiments of the present disclosure. As used herein, a memory device 1203, a memory array 1210, and/or a host 1202, for example, might also be separately considered an "apparatus." According to embodiments, the memory device 1202 may comprise at least one memory array 1210 having a three-node access device for vertical three-dimensional (3D) memory, as has been described herein.

In this example, system 1200 includes a host 1202 coupled to memory device 103 via an interface 1204. The computing system 1200 can be a personal laptop computer, a desktop computer, a digital camera, a mobile telephone, a memory card reader, or an Internet-of-Things (IoT) enabled device, among various other types of systems. Host 1202 can include a number of processing resources (e.g., one or more processors, microprocessors, or some other type of controlling circuitry) capable of accessing memory 1203. The system 1200 can include separate integrated circuits, or both the host 1202 and the memory device 1203 can be on the same integrated circuit. For example, the host 1202 may be a system controller of a memory system comprising multiple memory devices 1203, with the system controller 1205 providing access to the respective memory devices 1203 by another processing resource such as a central processing unit (CPU).

In the example shown in FIG. 1, the host 1202 is responsible for executing an operating system (OS) and/or various applications (e.g., processes) that can be loaded thereto (e.g., from memory device 1203 via controller 1205). The OS and/or various applications can be loaded from the memory device 1203 by providing access commands from the host 1202 to the memory device 1203 to access the data comprising the OS and/or the various applications. The host 1202 can also access data utilized by the OS and/or various applications by providing access commands to the memory device 1203 to retrieve said data utilized in the execution of the OS and/or the various applications.

For clarity, the system 1200 has been simplified to focus on features with particular relevance to the present disclosure. The memory array 1210 can be a DRAM array, SRAM array, STT RAM array, PCRAM array, TRAM array, RRAM array, NAND flash array, and/or NOR flash array, comprising at least one three-node access device for three dimension (3D) memory. For example, the memory array 1210 can be an unshielded DL 4F2 array such as a 3D-DRAM memory array. The array 1210 can comprise memory cells arranged in rows coupled by word lines (which may be referred to herein as access lines or select lines) and columns coupled by digit lines (which may be referred to herein as sense lines or data lines). Although a single array 1210 is shown in FIG. 1, embodiments are not so limited. For instance, memory device 1203 may include a number of arrays 1210 (e.g., a number of banks of DRAM cells).

The memory device 1203 includes address circuitry 1206 to latch address signals provided over an interface 1204. The interface can include, for example, a physical interface employing a suitable protocol (e.g., a data bus, an address bus, and a command bus, or a combined data/address/command bus). Such protocol may be custom or proprietary, or the interface 1204 may employ a standardized protocol, such as Peripheral Component Interconnect Express (PCIe), Gen-Z, CCIX, or the like. Address signals are received and decoded by a row decoder 1208 and a column decoder 1212 to access the memory array 1210. Data can be read from memory array 1210 by sensing voltage and/or current changes on the sense lines using sensing circuitry 1211. The sensing circuitry 1211 can comprise, for example, sense amplifiers that can read and latch a page (e.g., row) of data from the memory array 1210. The I/O circuitry 1207 can be used for bi-directional data communication with the host 1202 over the interface 1204. The read/write circuitry 1213 is used to write data to the memory array 1210 or read data from the memory array 1210. As an example, the circuitry 1213 can comprise various drivers, latch circuitry, etc.

Control circuitry 1205 decodes signals provided by the host 1202. The signals can be commands provided by the host 1202. These signals can include chip enable signals, write enable signals, and address latch signals that are used to control operations performed on the memory array 1210, including data read operations, data write operations, and data erase operations. In various embodiments, the control circuitry 1205 is responsible for executing instructions from the host 1202. The control circuitry 1205 can comprise a state machine, a sequencer, and/or some other type of control circuitry, which may be implemented in the form of hardware, firmware, or software, or any combination of the three. In some examples, the host 1202 can be a controller external to the memory device 103. For example, the host 1202 can be a memory controller which is coupled to a processing resource of a computing device.

The term semiconductor can refer to, for example, a material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial silicon supported by a base semiconductor structure, as well as other semiconductor structures. Furthermore, when reference is made to a semiconductor in the preceding description, previous process steps may have been utilized to form regions/junctions in the base semiconductor structure, and the term semiconductor can include the underlying materials containing such regions/junctions.

The figures herein follow a numbering convention in which the first digit or digits correspond to the drawing figure number and the remaining digits identify an element or component in the drawing. Similar (e.g., the same) elements or components between different figures may be identified by the use of similar digits. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure and should not be taken in a limiting sense.

As used herein, "a number of" or a "quantity of" something can refer to one or more of such things. For example, a number of or a quantity of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements (e.g., by direct physical contact), indirectly coupled and/or connected with intervening elements, or wirelessly coupled. The term coupled may further include two or more elements that co-operate or interact with each other (e.g., as in a cause and effect relationship). An element coupled between two elements can be between the two elements and coupled to each of the two elements.

It should be recognized the term vertical accounts for variations from "exactly" vertical due to routine manufacturing, measuring, and/or assembly variations and that one of ordinary skill in the art would know what is meant by the term "perpendicular." For example, the vertical can correspond to the z-direction. As used herein, when a particular element is "adjacent to" another element, the particular element can cover the other element, can be over the other element or lateral to the other element and/or can be in direct physical contact the other element. Lateral to may refer to the horizontal direction (e.g., the y-direction or the x-direction) that may be perpendicular to the z-direction, for example.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. A method for forming arrays of vertically stacked memory cells, having horizontally oriented access devices and horizontally oriented storage nodes, comprising:
   depositing alternating layers of a dielectric material and a sacrificial material in repeating iterations to form a vertical stack;
   forming a plurality of spaced, first vertical openings through the vertical stack adjacent areas where storage nodes will be formed;
   depositing support-pillar material in the plurality of spaced, first vertical openings to form support pillars;
   forming a plurality of second vertical openings through the vertical stack adjacent the support pillars to define elongated vertical columns with first sidewalls of the alternating layers, the columns having a first horizontal direction and a second horizontal direction and extending predominantly in the second direction;
   forming a third vertical opening through the vertical stack extending predominantly in the first horizontal direction to expose second sidewalls adjacent areas where horizontal access devices will be formed;
   selectively etching the sacrificial material to form first horizontal openings, removing the sacrificial material a first horizontal distance (D1) back from the third vertical opening in which to form the horizontal access devices;
   forming a fourth vertical opening through the vertical stack extending predominantly in the first direction to expose third sidewalls in the sacrificial material adjacent areas where storage nodes will be formed;
   selectively etching the sacrificial material to form second horizontal openings in which to form storage nodes; and
   using the support-pillar material of the formed support pillars as an etch stop in selectively etching to form the second horizontal openings.

2. The method of claim 1, further comprising depositing hafnium dioxide (HfO$_2$) as the support-pillar material to form the support pillars.

3. The method of claim 1, further comprising depositing zirconium dioxide ZrO$_2$) as the support-pillar material to form the support pillars.

4. The method of claim 1, further comprising selectively etching a second portion of the sacrificial material a second distance (D2) back from the fourth vertical openings to form storage nodes of the memory cells.

5. The method of claim 4, further comprising selectively etching the second portion of the sacrificial material around a contour of the support pillars to form the second horizontal openings.

6. The method of claim 1, further comprising forming capacitor cells as the storage nodes using an atomic layer deposition (ALD) process to sequentially deposit, in the second horizontal openings, first electrodes around contours of the support pillars and second electrodes separated from the first electrodes by cell dielectrics.

7. The method of claim 1, further comprising:
sequentially forming first source/drain regions;
channel regions; and
second source/drain regions in the first horizontal openings among the arrays of vertically stacked memory cells.

8. The method of claim 7, further comprising:
integrating a horizontally oriented digit lines to form electrical contact with the second source/drain regions; and
integrating a vertically oriented access lines opposing the channel regions separated therefrom by gate dielectrics to form three-node access devices for the memory cells, without a body contact.

9. The method of claim 7, further comprising using an atomic layer deposition (ALD) process to deposit a first source/drain material, a channel material, and a second source/drain material in the first horizontal openings.

10. The method of claim 7, further comprising depositing a multilayer channel material as the channel regions.

11. A method for forming arrays of vertically stacked memory cells, having horizontally oriented access devices and horizontally oriented storage nodes, comprising:
depositing alternating layers of a dielectric material and a semiconductor material in repeating iterations to form a vertical stack;
forming a plurality of spaced, first vertical openings through the vertical stack adjacent areas where storage nodes will be formed;
depositing support-pillar material in the plurality of spaced, first vertical openings to form support pillars;
forming a plurality of second vertical openings through the vertical stack adjacent the support pillars to define elongated vertical columns with first sidewalls of the alternating layers, the columns having a first horizontal direction and a second horizontal direction and extending predominantly in the second direction;
depositing first conductive material on a gate dielectric material in the second vertical openings opposing channel regions in areas where the horizontal access devices will be formed;
forming a third vertical opening through the vertical stack extending predominantly in the first horizontal direction to expose second sidewalls adjacent areas where horizontal access devices will be formed from the semiconductor material;
selectively etching the semiconductor material to form first horizontal openings, removing the semiconductor material a first horizontal distance (D1) back from the third vertical opening;
forming a fourth vertical opening through the vertical stack extending predominantly in the first direction to expose third sidewalls in the semiconductor material adjacent areas where storage nodes will be formed; and
selectively etching the semiconductor material to form second horizontal openings in which to form storage nodes electrically coupled to the first source/drain regions, respectively.

12. The method of claim 11, comprising using the support-pillar material of the formed support pillars as an etch stop in selectively etching to form the second horizontal openings in which to form storage nodes.

13. The method of claim 11, further comprising selectively etching the semiconductor material a second horizontal distance (D2) back from the fourth vertical openings in the vertical stack to form the second horizontal openings.

14. The method of claim 11, further comprising forming capacitor cells as the storage nodes in the second horizontal openings using an atomic layer deposition (ALD) process to sequentially deposit, in the second horizontal opening, a first electrode and a second electrode separated by a cell dielectric.

15. The method of claim 11, further comprising sequentially forming first source/drain regions, channel regions, and second source/drain regions in the first horizontal openings among the arrays of vertically stacked memory cells.

16. The method of claim 11, further comprising depositing the first conductive material on the gate dielectric material in a portion of the second vertical openings to form a plurality of separate, vertical access lines along first sidewalls of the elongated vertical columns.

17. The method of claim 16, further comprising integrating a horizontally oriented digit line to form electrical contact with the second source/drain regions.

18. The method of claim 11, further comprising:
forming a plurality of separate vertically oriented access lines electrically coupled to the first conductive material of the horizontal access devices; and
forming a plurality of separate horizontally oriented digit lines electrically coupled to the second source/drain regions of the horizontal access devices.

19. The method of claim 11, further comprising selectively etching the semiconductor material to form the storage nodes of the memory cell in the second horizontal openings before sequentially forming the first source/drain region, the channel region, and the second source/drain region.

20. The method of claim 11, further comprising using an atomic layer deposition (ALD) process to sequentially form first source/drain regions, channel regions, and the second source/drain regions in the first horizontal openings.

21. The method of claim 20, further comprising using atomic layer deposition (ALD) to deposit an oxide semiconductor as the channel regions in the first horizontal openings.

22. The method of claim 20, further comprising depositing an indium zinc gallium oxide (IGZO) material as the channel regions in the first horizontal openings.

23. The method of claim 22, further comprising depositing a gradient channel region having a decreasing indium (In) concentration in the gradient channel region in a direction away from the gate dielectric.

24. The method of claim 20, further comprising depositing a channel material to have a width (w) greater than a thickness (t) of the channel material.

25. A method for forming arrays of vertically stacked memory cells, having horizontally oriented access devices and horizontally oriented storage nodes, comprising:

depositing alternating layers of a dielectric material and a sacrificial material in repeating iterations to form a vertical stack;

forming a plurality of spaced, first vertical openings through the vertical stack adjacent regions where storage nodes will be formed;

depositing support-pillar material in the plurality of spaced, first vertical openings to form support pillars;

forming a plurality of second vertical openings through the vertical stack adjacent the support pillars to define elongated vertical columns with first sidewalls of the alternating layers, the columns having a first horizontal direction and a second horizontal direction and extending predominantly in the second direction;

depositing first conductive material on a gate dielectric in the second vertical openings opposing channel regions in areas where the horizontal access devices will be formed;

forming a third vertical opening through the vertical stack extending predominantly in the first horizontal direction to expose second sidewalls adjacent regions where horizontal access devices will be formed from the sacrificial material;

selectively etching the sacrificial material to form first horizontal openings, removing the sacrificial material a first horizontal distance (D1) back from the third vertical opening;

sequentially forming first source/drain regions, channel regions, and second source/drain regions in the first horizontal openings to form a three-node access devices among the arrays of vertically stacked memory cells;

forming a fourth vertical opening through the vertical stack extending predominantly in the first direction to expose third sidewalls in the sacrificial material adjacent regions where storage nodes will be formed; and selectively etching the sacrificial material to form second horizontal openings in which to form storage nodes electrically coupled to the first source/drain regions, respectively.

26. The method of claim 25, further comprising selectively removing the second region to form a second horizontal opening in which to form a storage node before forming the first source/drain region, the channel region, and the second source/drain region.

27. A memory device, comprising:
an array of vertically stacked memory cells, the array of vertically stacked memory cells having vertical support pillars formed adjacent storage node regions, comprising:
horizontally oriented access devices having a first source/drain region and a second source drain region separated by a channel region, and gates opposing the channel region and separated therefrom by a gate dielectric;
horizontally oriented storage nodes electrically coupled to the first source/drain regions of the access devices; and
vertically oriented support pillars formed from support pillar material, adjacent the horizontally oriented storage nodes.

28. The memory device of claim 27, wherein the support pillar material comprises hafnium oxide.

29. The memory device of claim 27, wherein the support pillar material comprises zirconium oxide.

30. The memory device of claim 27, wherein the horizontally oriented storage nodes comprise capacitor cells comprising:
first horizontally oriented electrodes formed around contours of the vertically oriented support pillars and electrically coupled to the first source/drain regions; and
second electrodes separated from the first horizontally oriented electrodes by a cell dielectric.

31. The memory device of claim 27, comprising:
vertically oriented access lines coupled to the gates and separated from the channel region by the gate dielectric; and
horizontally oriented digit lines electrically coupled to the second source/drain regions of the three-node access devices.

32. The memory device of claim 27, wherein the access devices are three-node access devices without having a direct, electrical body contact to a body region or a channel region of the access devices, the horizontal access devices, comprising:
a first source/drain region;
a second source/drain region; and
a gate opposing a channel, located between the first and the second source/drain regions and separated therefrom by a gate dielectric.

33. The memory device of claim 32, wherein the channel comprises an oxide semiconductor material having at least one of an indium material, a zinc material, or a gallium material.

34. The memory device of claim 32, wherein the channel comprises a two-dimensional (2D) material comprising one or more of a transition metal dichalcogenide.

35. The memory device of claim 32, wherein the channel comprises an indium gallium zinc oxide (IGZO) gradient channel material having a decreasing indium (In) concentration in the gradient channel in a direction away from a gate dielectric of the three-node access devices for the memory cells.

36. The memory device of claim 32, wherein the channels have a vertical width (w) greater than a horizontal thickness (t) of the channels.

37. The memory device of claim 36, having vertically oriented access lines having a horizontal width (w) which is greater than a horizontal length (L) of the channels, overlapping both the first and the second source/drain regions horizontally.

38. The memory device of claim 36, having vertically oriented access lines having a horizontal width (w) which is less than a horizontal length (L) of the channels, underlapping both the first and the second source/drain regions horizontally.

* * * * *